United States Patent
Moon et al.

(10) Patent No.: US 12,166,157 B2
(45) Date of Patent: Dec. 10, 2024

(54) DISPLAY DEVICE AND METHOD FOR MANUFACTURING SAME

(71) Applicant: SAMSUNG DISPLAY CO., LTD., Yongin-si (KR)

(72) Inventors: Su Mi Moon, Yongin-si (KR); Jae Woong Kang, Yongin-si (KR); Sin Chul Kang, Yongin-si (KR); Won Sik Oh, Yongin-si (KR); Yo Han Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 449 days.

(21) Appl. No.: 17/604,245

(22) PCT Filed: Mar. 3, 2020

(86) PCT No.: PCT/KR2020/003011
§ 371 (c)(1),
(2) Date: Oct. 15, 2021

(87) PCT Pub. No.: WO2020/213832
PCT Pub. Date: Oct. 22, 2020

(65) Prior Publication Data
US 2022/0181522 A1    Jun. 9, 2022

(30) Foreign Application Priority Data
Apr. 16, 2019  (KR) .................. 10-2019-0044464

(51) Int. Cl.
*H01L 33/38*    (2010.01)
*H01L 27/15*    (2006.01)
(Continued)

(52) U.S. Cl.
CPC .......... *H01L 33/387* (2013.01); *H01L 27/156* (2013.01); *H01L 33/005* (2013.01);
(Continued)

(58) Field of Classification Search
CPC ........... H01L 33/387; H01L 2933/0016; H01L 2933/0066; H01L 25/0753; H01L 33/36; H01L 33/005; H01L 33/62
See application file for complete search history.

(56) References Cited

U.S. PATENT DOCUMENTS 8,872,214 B2    10/2014  Negishi et al.
9,181,630 B2    11/2015  Shibata et al.
(Continued)

FOREIGN PATENT DOCUMENTS

CN    104952903    9/2015
CN    112740406    4/2021
(Continued)

OTHER PUBLICATIONS

International Search Report, with English translation, corresponding to International Application No. PCT/KR2020/003011 dated Jun. 11, 2020.
(Continued)

*Primary Examiner* — Moazzam Hossain
(74) *Attorney, Agent, or Firm* — KILE PARK REED & HOUTTEMAN PLLC

(57) ABSTRACT

A display device may include: a substrate including a display area and a non-display area; and at least one pixel disposed in the display area, and comprising at least one pixel including an emission area that emits light. The at least one pixel may include: at least one sub-electrode extending in a direction on the substrate; at least one branch electrode extending in a direction and spaced apart from the sub-electrode; a first insulating layer disposed on the at least one sub-electrode and the at least one branch electrode; first electrodes disposed on the first insulating layer and electrically connected with the at least one sub-electrode; second electrodes disposed on the first insulating layer and electrically connected with the at least one branch electrode; and
(Continued)

at least one light emitting element aligned between at least one of the first electrodes and at least one of the second electrodes.

13 Claims, 43 Drawing Sheets

(51) Int. Cl.
 *H01L 33/00* (2010.01)
 *H01L 33/62* (2010.01)
(52) U.S. Cl.
 CPC ...... *H01L 33/62* (2013.01); *H01L 2933/0016* (2013.01); *H01L 2933/0066* (2013.01)

(56) References Cited

U.S. PATENT DOCUMENTS

| | | | |
|---|---|---|---|
| 9,391,292 | B2 | 7/2016 | Choi et al. |
| 9,773,761 | B2 | 9/2017 | Do |
| 10,059,597 | B2 | 8/2018 | Kim et al. |
| 10,367,123 | B2 | 7/2019 | Im et al. |
| 10,461,123 | B2 | 10/2019 | Kim et al. |
| 10,497,680 | B2 | 12/2019 | Sung et al. |
| 10,818,647 | B2 | 10/2020 | Kim et al. |
| 2011/0089850 | A1 | 4/2011 | Shibata et al. |
| 2017/0250168 | A1 | 8/2017 | Do et al. |
| 2018/0175009 | A1* | 6/2018 | Kim ................... H01L 33/20 |
| 2018/0175106 | A1* | 6/2018 | Kim ................... H01L 33/60 |
| 2019/0044024 | A1 | 2/2019 | Woo et al. |
| 2019/0244985 | A1* | 8/2019 | Kim ................... H01L 27/124 |
| 2021/0351171 | A1 | 11/2021 | Yoo et al. |

FOREIGN PATENT DOCUMENTS

| | | |
|---|---|---|
| JP | 2008-112644 | 5/2008 |
| KR | 10-2013-0033450 | 4/2013 |
| KR | 10-1490758 | 2/2015 |
| KR | 10-1774140 | 9/2017 |
| KR | 10-2018-0007025 | 1/2018 |
| KR | 10-2018-0055021 | 5/2018 |
| KR | 10-2018-0072909 | 7/2018 |
| KR | 10-1874993 | 7/2018 |
| WO | 2020059989 | 3/2020 |

OTHER PUBLICATIONS

Written Opinion, with English translation, corresponding to International Application No. PCT/KR2020/003011, dated Jun. 11, 2020.

* cited by examiner

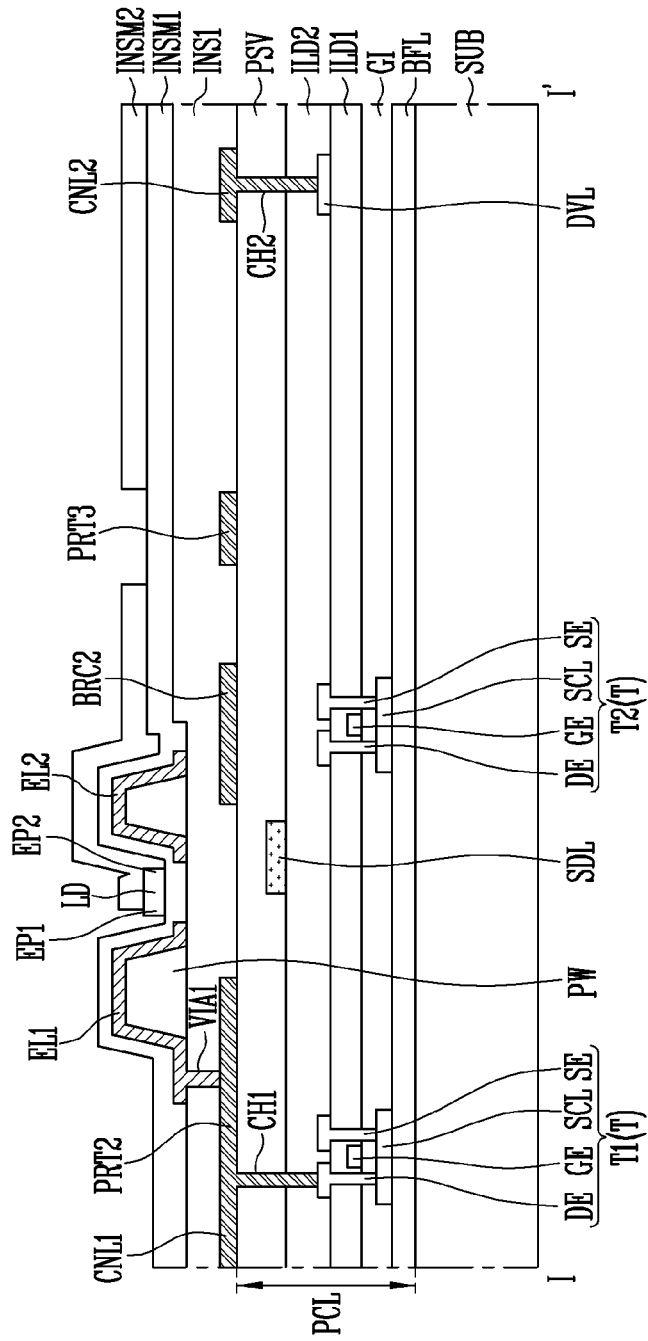

DISPLAY DEVICE AND METHOD FOR MANUFACTURING SAME

CROSS REFERENCE TO RELATED APPLICATION(S)

This application is a national entry of International Application No. PCT/KR2020/003011, filed on Mar. 3, 2020, which claims under 35 U.S.C. §§ 119(a) and 365(b) priority to and benefits of Korean Patent Application No. 10-2019-0044464, filed on Apr. 16, 2019, in the Korean Intellectual Property Office (KIPO), the entire contents of which are incorporated herein by reference.

BACKGROUND

1. Technical Field

The present relates to a display device including a subminiature light emitting element, and a method of fabricating the display device.

2. Background Art

A light emitting diode may have relatively satisfactory durability even under poor environmental conditions, and have excellent performances in terms of lifetime and luminance.

To apply the LED to a lighting device, a display device, or the like, there is a need to couple the LED to an electrode so that the voltage of the power supply may be applied to the LED. With regard to application purposes of the LED, a method of reducing space needed for the electrode, or a method of fabricating the LED, various researches on the arrangement relationship between the LED and the electrode have been conducted.

SUMMARY

An object of the disclosure is to provide a display device in which light emitting elements are aligned in only a target area in an emission area of each of the pixels so that the intensity (or the amount) of light emitted from each pixel can be uniform, whereby a uniform emission distribution can be formed in an overall area of the emission area.

Furthermore, another objective of the disclosure is to provide a method of manufacturing the above-described display device.

A display device in accordance with an embodiment of the disclosure may include: a substrate including a display area and a non-display area; and at least one pixel disposed in the display area, and comprising an emission area that emits light. The at least one pixel may include: at least one sub-electrode extending in a direction on the substrate; at least one branch electrode extending in the direction and spaced apart from the at least one sub-electrode; a first insulating layer disposed on the at least one sub-electrode and the at least one branch electrode; first electrodes disposed on the first insulating layer and electrically connected with the at least one sub-electrode; second electrodes disposed on the first insulating layer and electrically connected with the at least one branch electrode; and at least one light emitting element aligned between at least one of the first electrodes and at least one of the second electrodes.

In an embodiment of the disclosure, the first insulating layer may include first via holes each exposing an area of the at least one sub-electrode, and second via holes each exposing an area of the at least one branch electrode.

In an embodiment of the disclosure, at least one of the first via holes may correspond to each of the first electrodes, and at least one of the second via holes may correspond to each of the second electrodes.

In an embodiment of the disclosure, each of the first electrodes may electrically contact the at least one sub-electrode through the at least one first via hole, and each of the second electrodes may electrically contact the at least one branch electrode through the at least one second via hole.

In an embodiment of the disclosure, the at least one sub-electrode may include a first area overlapping with the first electrodes, and a second area spaced apart from the first area. The at least one branch electrode may include a third area overlapping the second electrodes, and a fourth area spaced apart from the third area. The first insulating layer on the first area and the third area may have a thickness different from a thickness of the first insulating layer on the second area and the fourth area.

In an embodiment of the disclosure, a thickness of the first insulating layer on the second area and the fourth area may be greater than a thickness of the first insulating layer on the first area and the third area.

In an embodiment of the disclosure, each of the first electrodes and each of the second electrodes may be spaced apart from each other on the first insulating layer.

In an embodiment of the disclosure, each of the first electrodes and each of the second electrodes may be alternately disposed in the direction in the emission area in a plan view.

In an embodiment of the disclosure, the at least one pixel may include: a first connection line integral with the at least one sub-electrode and extending in a direction intersecting with the one direction; and a second connection line integral with the at least one branch electrode and disposed in parallel with the direction in which the first connection line extends.

In an embodiment of the disclosure, the at least one pixel may include: a bank pattern disposed under each of the first and second electrodes; a first contact electrode that electrically connects at least one of the first electrodes with a first end of the at least one light emitting element; and a second contact electrode that electrically connects at least one second electrode of the second electrodes with a second end of the at least one light emitting element.

In an embodiment of the disclosure, the at least one pixel may include at least one transistor electrically connected with the at least one light emitting element; at least one shielding electrode line disposed on the at least one transistor; a driving voltage line electrically connected to the second electrodes and supplying a driving power voltage; and a passivation layer overlapping the at least one transistor, the at least one shielding electrode line, and the driving voltage line.

In an embodiment of the disclosure, the at least one sub-electrode and the at least one branch electrode may be disposed between the at least one transistor and the passivation layer.

In an embodiment of the disclosure, the at least one sub-electrode and the at least one branch electrode, and the at least one shielding electrode line may be disposed on a same layer.

In an embodiment of the disclosure, the at least one pixel may include: a second insulating layer disposed between the at least one light emitting element and the first insulating layer; and a third insulating layer disposed on an upper surface of the at least one light emitting element. The first contact electrode and the second contact electrode may be spaced apart from each other on the third insulating layer and are electrically disconnected from each other.

The display device may be fabricated by a method including: forming a substrate including at least one emission area; forming, on the substrate, at least one sub-electrode extending in a direction, and at least one branch electrode spaced apart from the at least one sub-electrode and extending in the direction; forming, on the at least one sub-electrode and the at least one branch electrode, a first insulating layer including first via holes exposing an area of the at least one sub-electrode, and second via holes exposing an area of the at least one branch electrode; forming, on the first insulating layer, first electrodes electrically connected with the at least one sub-electrode through the first via holes, and second electrodes electrically connected with the at least one branch electrode through the second via holes; aligning light emitting elements between at least one of the first electrodes and at least one of the second electrodes by applying an alignment voltage to each of the at least one sub-electrode and the at least one branch electrode; forming a second insulating layer on an upper surface of each of the light emitting elements; and forming a first contact electrode and a second contact electrode on the substrate including the second insulating layer.

The at least one sub-electrode may include a first area overlapping the first electrodes; and a second area spaced apart from the first area. The at least one branch electrode may include a third area overlapping the second electrodes; and a fourth area spaced apart from the third area. The first insulating layer on the first area and the third area may have a thickness different from a thickness of the first insulating layer on the second area and the fourth area.

A thickness of the first insulating layer on the second area and the fourth area may be greater than a thickness of the first insulating layer on the first area and the third area.

The method may further comprise forming bank patterns on the first insulating layer before the forming of the first electrodes and the second electrodes. A part of the bank patterns may be disposed between the first insulating layer and the first electrodes, and another part of the bank patterns may be disposed between the first insulating layer and the second electrodes.

The method may further comprise forming, on the substrate, at least one transistor electrically connected with the light emitting elements, and a driving voltage line electrically connected to the second electrodes and supplying a driving power voltage; forming a shielding electrode line on the at least one transistor; and forming a passivation layer overlapping the at least one transistor, the driving voltage line, and the shielding electrode line.

The at least one sub-electrode, the at least one branch electrode, and the shielding electrode line may be disposed on a same layer.

An embodiment of the disclosure may provide a display device in which light emitting elements are aligned in only a desired area (or a target area) so that a uniform emission distribution can be formed in an overall area, and a method of fabricating the display device.

The effects of the disclosure are not limited by the foregoing, and other various effects are anticipated herein.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1A:
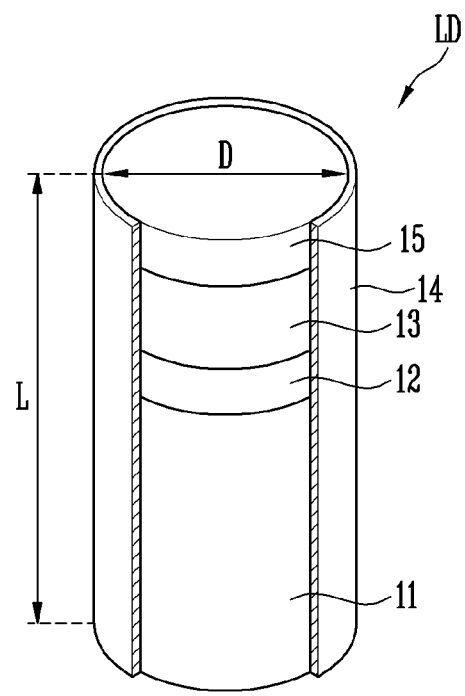
FIG. 1A is a perspective view schematically illustrating a light emitting element in accordance with an embodiment of the disclosure.

As the disclosure allows for various changes and numerous embodiments, particular embodiments will be illustrated in the drawings and described in detail in the written description. However, this is not intended to limit the disclosure to particular modes of practice, and it is to be appreciated that all changes, equivalents, and substitutes that do not depart from the technical scope of the disclosure are encompassed in the disclosure.

Throughout the disclosure, like reference numerals refer to like parts throughout the various figures and embodiments of the disclosure. The sizes of elements in the accompanying drawings may be exaggerated for clarity of illustration. It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element. In the disclosure, the singular forms are intended to include the plural forms as well, unless the context clearly indicates otherwise.

It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, when a first part such as a layer, a film, a region, or a plate is disposed on a second part, the first part may be not only directly on the second part but a third part may intervene between them. In addition, when it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, when a first part such as a layer, a film, a region, or a plate is under a second part, the first part may be not only directly under the second part but a third part may intervene between them.

Embodiments and required details of the present disclosure are described with reference to the accompanying drawings in order to describe the disclosure in detail so that those having ordinary knowledge in the technical field to which the disclosure pertains can easily practice the disclosure.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that the terms "contact," "connected to," and "coupled to" may include a physical and/or electrical contact, connection or coupling.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 1B:
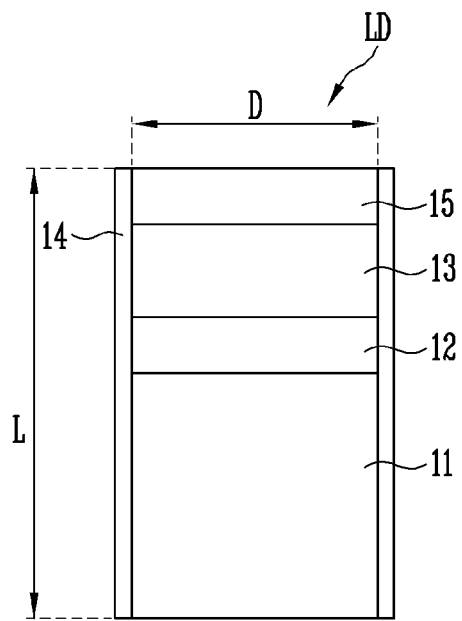
FIG. 1B is a schematic cross-sectional view illustrating the light emitting element of FIG. 1A.
Figure 1C:
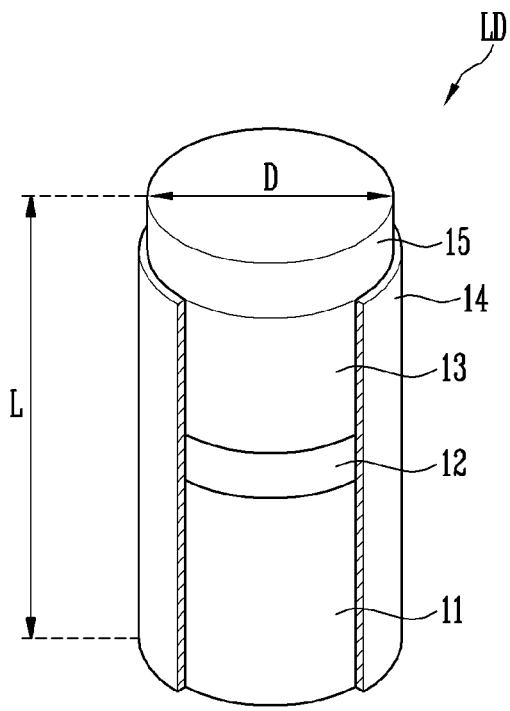
FIG. 1C is a perspective view schematically illustrating a light emitting element in accordance with an embodiment of the disclosure.
Figure 1D:
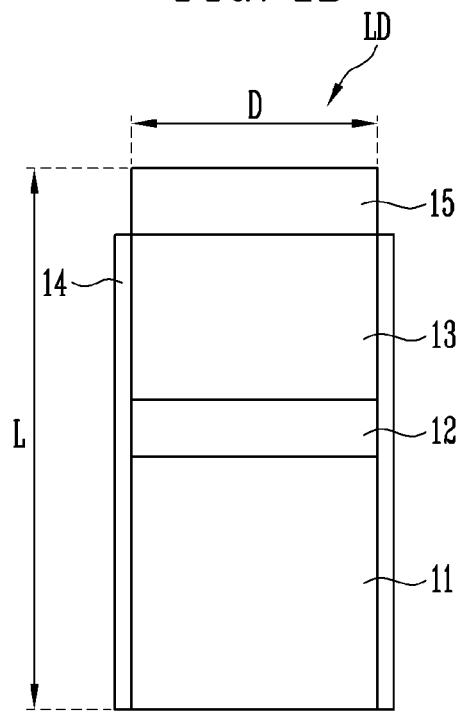
FIG. 1D is a schematic cross-sectional view illustrating the light emitting element of FIG. 1C.
Figure 1E:
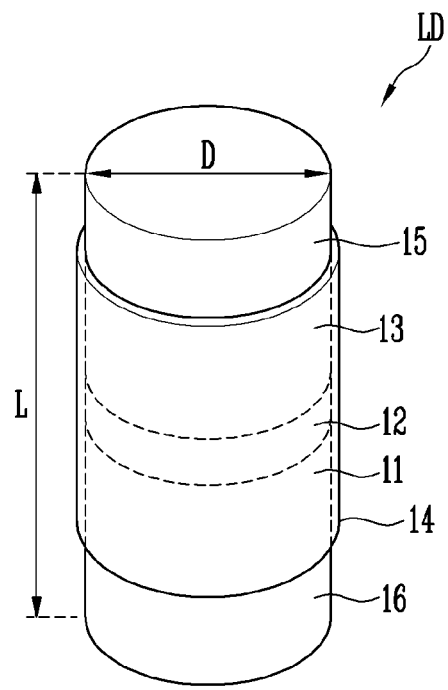
FIG. 1E is a perspective view schematically illustrating a light emitting element in accordance with an embodiment of the disclosure.
Figure 1F:
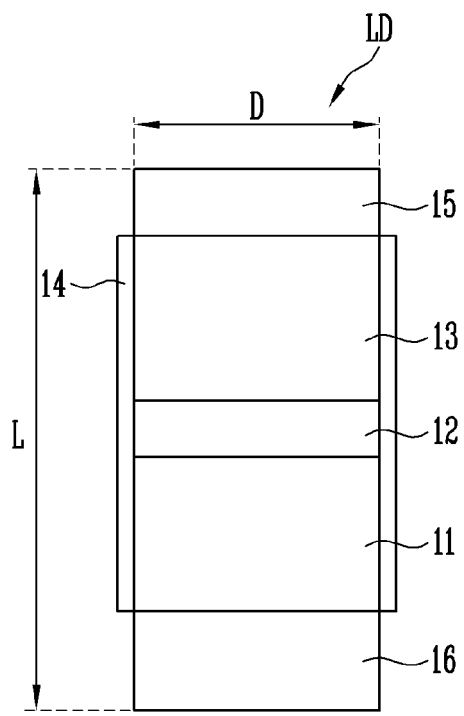
FIG. 1F is a schematic cross-sectional view illustrating the light emitting element of FIG. 1E.
Figure 1G:
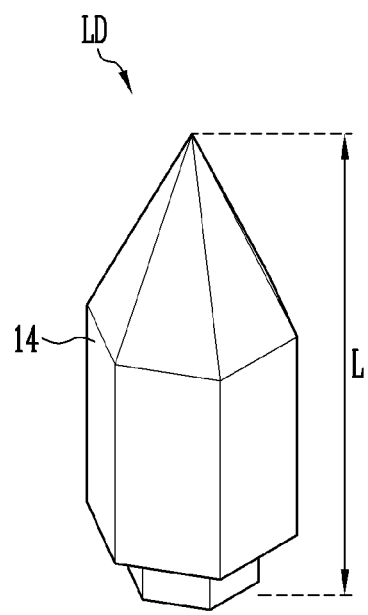
FIG. 1G is a perspective view schematically illustrating a light emitting element in accordance with an embodiment of the disclosure.
Figure 1H:
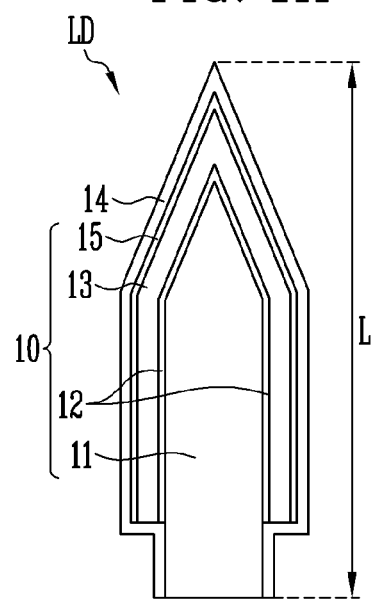
FIG. 1H is a schematic cross-sectional view illustrating the light emitting element of FIG. 1G.

FIG. 1A is a perspective view schematically illustrating a light emitting element in accordance with an embodiment. FIG. 1B is a schematic cross-sectional view illustrating the light emitting element of FIG. 1A. FIG. 1C is a perspective view schematically illustrating a light emitting element in accordance with an embodiment. FIG. 1D is a schematic cross-sectional view illustrating the light emitting element of FIG. 1C. FIG. 1E is a perspective view schematically illustrating a light emitting element in accordance with an embodiment. FIG. 1F is a schematic cross-sectional view illustrating the light emitting element of FIG. 1E. FIG. 1G is a perspective view schematically illustrating a light emitting element in accordance with an embodiment. FIG. 1H is a schematic cross-sectional view illustrating the light emitting element of FIG. 1G.

For the sake of explanation, cylindrical light emitting elements will be described with reference to FIGS. 1A to 1F, and thereafter a light emitting element having a core-shell structure will be described with reference to FIGS. 1G and 1H. In an embodiment, the type and/or shape of the light emitting element is not limited to the embodiments illustrated in FIGS. 1A to 1H.

First, referring to FIGS. 1A to 1F, a light emitting element LD in accordance with an embodiment may include a first semiconductor layer (or a first conductive semiconductor layer) 11, a second semiconductor layer (or a second conductive semiconductor layer) 13, and an active layer 12 interposed between the first and second conductive semiconductor layers 11 and 13. For example, the light emitting element LD may be implemented as an emission stack formed by successively stacking the first conductive semiconductor layer 11, the active layer 12, and the second conductive semiconductor layer 13.

In an embodiment, the light emitting element LD may extend in a direction. If the direction in which the light emitting element LD extends is defined as a longitudinal direction, the light emitting element LD may have a first end and a second end in the extension direction. Any one of the first and second conductive semiconductor layers 11 and 13 may be disposed on one end (or first end) of the light emitting element LD, and the other one of the first and second conductive semiconductor layers 11 and 13 may be disposed on the other end (or second end) of the light emitting element LD.

Although the light emitting element LD may be provided in the form of a cylinder, the shape of the light emitting element LD is not limited thereto. The light emitting element LD may have a rod-like shape or a bar-like shape extending in the longitudinal direction (i.e., having an aspect ratio greater than 1). For example, the length L of the light emitting element LD in a longitudinal direction may be greater than a diameter D thereof (or a width of the cross-section thereof). The light emitting element LD may include a light emitting diode fabricated to have a subminiature size, e.g., a length L and/or a diameter D corresponding to the micrometer scale or the nanometer scale.

In an embodiment, the diameter D of the light emitting element LD may approximately range from about 0.5 μm to about 6 μm, and the length L thereof may approximately range from about 1 μm to about 10 μm. However, the size of the light emitting element LD is not limited thereto, and the size of the light emitting element LD may be changed to meet requirements (or design conditions) of a lighting device or a self-light emissive display device to which the light emitting element LD is applied.

The first conductive semiconductor layer 11 may include, for example, at least one n-type semiconductor layer. For instance, the first conductive semiconductor layer 11 may include an n-type semiconductor layer which includes any one semiconductor material of InAlGaN, GaN, AlGaN, InGaN, AlN, and InN and is doped with a first conductive dopant such as Si, Ge, or Sn. However, the material of the first conductive semiconductor layer 11 is not limited thereto, and the first conductive semiconductor layer 11 may be formed of various other materials.

The active layer 12 may be disposed on the first conductive semiconductor layer 11 and have a single or multiple quantum well structure. The location of the active layer 12 may be changed in various ways depending on the type of the light emitting element LD. The active layer 12 may emit light having a wavelength ranging from about 400 nm to about 900 nm, and use a double heterostructure. In an embodiment, a cladding layer (not shown) doped with a conductive dopant may be formed on and/or under the active layer 12. For example, the cladding layer may be formed of an AlGaN layer or an InAlGaN layer. In an embodiment, a material such as AlGaN or AlInGaN may be used to form the active layer 12, and various other materials may be used to form the active layer 12.

If an electric field of a predetermined voltage or more is applied to the opposite ends of the light emitting element LD, the light emitting element LD emits light by coupling of electron-hole pairs in the active layer 12. Since light emission of the light emitting element LD can be controlled based on the foregoing principle, the light emitting element LD may be used as a light source of various light emitting devices as well as a pixel of the display device.

The second conductive semiconductor layer 13 may be disposed on the active layer 12 and include a semiconductor layer having a type different from that of the first conductive semiconductor layer 11. For example, the second conductive semiconductor layer 13 may include at least one p-type semiconductor layer. For instance, the second conductive semiconductor layer 13 may include a p-type semiconductor layer which includes any semiconductor material of InAlGaN, GaN, AlGaN, InGaN, AlN, and InN, and is doped with a second conductive dopant such as Mg. However, the material for forming the second conductive semiconductor layer 13 is not limited thereto, and the second conductive semiconductor layer 13 may be formed of various other materials.

In an embodiment, a length (or a width) of the second conductive semiconductor layer 13 in a longitudinal direction (L) of the light emitting element LD may differ from a length (or a width) of the first conductive semiconductor layer 11. For example, the length (or the width) of the second conductive semiconductor layer 13 may be less than the length (or the width) of the first conductive semiconductor layer 11 with respect to the longitudinal direction (L) of the light emitting element LD. Hence, as illustrated in FIGS. 1A to 1F, the active layer 12 of the light emitting element LD may be disposed at a position closer to an upper surface of the second conductive semiconductor layer 13 than to a lower surface of the first conductive semiconductor layer 11. In this case, the active layer 12 may be disposed adjacent to an upper end in the light emitting element LD having a cylindrical shape.

In an embodiment, the light emitting element LD may further include an electrode layer 15 disposed on the second conductive semiconductor layer 13, as illustrated in FIGS. 1A, 1B, 1C, and 1D, as well as the first conductive semiconductor layer 11, the active layer 12, and the second conductive semiconductor layer 13. In an embodiment, the light emitting element LD may include not only the electrode layer 15 but also a separate electrode layer provided on a side opposite to that of the electrode layer 15, for example, on one end (or first end) of the first conductive semiconductor layer 11, and the separate electrode layer may be provided for ohmic contact and may be made of a material identical to or different from that of the electrode layer 15. For example, as shown in FIGS. 1E and 1F, the light emitting element LD may further include another electrode layer 16 disposed on one end of the first conductive semiconductor layer 11 as well as including the electrode layer 15.

Although each of the electrode layers 15 and 16 may be formed of an ohmic contact electrode, the disclosure is not limited thereto. The electrode layers 15 and 16 may include metal or a metal oxide. For example, chromium (Cr), titanium (Ti), aluminium (Al), gold (Au), nickel (Ni), ITO, and an oxide or alloy thereof may be used alone or in combination with each other. However, the disclosure is not limited thereto.

Materials included in the respective electrode layers 15 and 16 may be equal to or different from each other. The electrode layers 15 and 16 may be substantially transparent or semitransparent. Therefore, light generated from the light emitting element LD may pass through the electrode layers 15 and 16 and then be emitted outside the light emitting element LD.

In an embodiment, the light emitting element LD may further include an insulating film 14. However, in some embodiments, the insulating film 14 may be omitted, or may be provided to cover only some of the first conductive semiconductor layer 11, the active layer 12, and the second s conductive semiconductor layer 13.

The insulating film 14 may prevent the active layer 12 from short-circuiting due to making contact with a conductive material except the first conductive semiconductor layer 11 and the second conductive semiconductor layer 13. Furthermore, by virtue of the insulating film 14, occurrence of a defect on the surface of the light emitting element LD may be reduced or minimized, whereby the lifespan and efficiency of the light emitting element LD may be improved. In case that light emitting elements LD are disposed in close contact with each other, the insulating film 14 may prevent an undesired short-circuit from occurring between the light emitting elements LD. It is not limited whether the insulating film 14 is provided, so long as the active layer 12 can be prevented from short-circuiting with external conductive material.

As illustrated in FIGS. 1A and 1B, the insulating film 14 may enclose the entirety of an outer circumferential surface of the light emission stack including the first conductive semiconductor layer 11, the active layer 12, the second conductive semiconductor layer 13, and the electrode layer 15. For the sake of explanation, FIG. 1A illustrates a shape in which a portion of the insulating film 14 has been removed, and the entirety of the outer circumferential surface of the light emission stack may be enclosed by the insulating film 14. However, the disclosure is not limited thereto. In an embodiment, as illustrated in FIGS. 1C and 1D, the insulating film 14 may be provided on a portion of the light emitting element LD other than one of the opposite ends of the light emitting element LD. For example, the insulating film 14 may expose the electrode layer 15 disposed on one end of the second conductive semiconductor layer 13 of the light emitting element LD, and enclose the overall side surfaces of the components (e.g., first conductive semiconductor layer 11, the active layer 12, and the second conductive semiconductor layer 13) other than the electrode layer 15. The insulating film 14 may expose at least the opposite ends of the light emitting element LD to the outside, and, e.g., allow not only the electrode layer 15 disposed on one end of the second conductive semiconductor layer 13 but also one end of the first conductive semiconductor layer 11.

In an embodiment, as illustrated in FIGS. 1E and 1F, in case that the electrode layers 15 and 16 are disposed on the respective opposite ends of the light emitting element LD, the insulating film 14 may allow at least one area of each of the electrode layers 15 and 16 to be exposed to the outside. As another example, in an embodiment, the insulating film 14 may not be provided.

In an embodiment, the insulating film 14 may include a transparent insulating material. For example, the insulating film 14 may include at least one insulating material selected from the group consisting of $SiO_2$, $Si_3N_4$, $Al_2O_3$, and $TiO_2$, but the disclosure is not limited thereto. In other words, various materials having insulating properties may be employed.

If the insulating film 14 is provided in the light emitting element LD, the active layer 12 may be prevented from short-circuiting with a first and/or second electrode (not illustrated). Furthermore, by virtue pf the insulating film 14, occurrence of a defect on the surface of the light emitting element LD may be reduced or minimized, whereby the lifespan and efficiency of the light emitting element LD may be improved. In case that light emitting elements LD are disposed in close contact with each other, the insulating film 14 may prevent an undesired short-circuit from occurring between the light emitting elements LD.

The light emitting element LD may be employed as a light source for various display devices. The light emitting element LD may be fabricated by a surface treatment process. For example, each light emitting element LD may be surface-treated so that, in case that light emitting elements LD are mixed with a fluidic solution (or solvent) and then supplied to each emission area (e.g., an emission area of each pixel), the light emitting elements LD can be evenly dispersed rather than unevenly aggregating in the solution.

A light emitting device including the light emitting element LD described above may be used not only in a display device but also in various devices which requires a light source. For instance, in case that light emitting elements LD are disposed in the emission area of each pixel of a display panel, the light emitting elements LD may be used as a light source of the pixel. However, the application field of the light emitting element LD is not limited to the above-mentioned examples. For example, the light emitting element LD may also be used in other types of devices such as a lighting device, which requires a light source.

Next, a light emitting element LD having a core-shell structure will be described with reference to FIGS. 1G and 1H. The following description of the light emitting element LD having a core-shell structure will be focused on differences from the above-mentioned embodiments, and components of the light emitting element LD that are not separately explained in the following description may comply with that of the preceding embodiments. The same reference numerals will be used to designate the same components, and similar reference numerals will be used to designate similar components.

Referring to FIGS. 1G and 1H, the light emitting element LD in accordance with an embodiment may include a first conductive semiconductor layer 11, a second conductive semiconductor layer 13, and an active layer 12 interposed between the first and second conductive semiconductor layers 11 and 13. In some embodiments, the light emitting element LD may include an emission pattern 10 having a core-shell structure. The emission pattern 10 may include a first conductive semiconductor layer 11 disposed in a central portion of the light emitting element LD, an active layer 12 which encloses at least one side of the first conductive semiconductor layer 11, a second conductive semiconductor layer 13 which encloses at least one side of the active layer 12, and an electrode layer 15 which encloses at least one side of the second conductive semiconductor layer 13.

The light emitting element LD may be formed in a polypyramid shape extending in one direction. In an embodiment, the light emitting element LD may be provided in the form of a hexagonal pyramid. If the direction in which the light emitting element LD extends is defined as a longitudinal direction (L), the light emitting element LD may have a first end (or a lower end) and a second end (or an upper end) in the longitudinal direction (L). In an embodiment, one of the first and second conductive semiconductor layers 11 and 13 may be disposed on the first end (or the lower end) of the light emitting element LD. The other one of the first and second conductive semiconductor layers 11 and 13 may be disposed on the second end (or the upper end) of the light emitting element LD.

In an embodiment, the light emitting element LD may have a small size corresponding to a nanoscale or microscale size, e.g., a diameter and/or a length L having a nanoscale range or a microscale range. However, the size of the light emitting element LD is not limited thereto, and the size of the light emitting element LD may be changed to meet requirements (or application conditions) of a lighting device or a self-light emissive display device to which the light emitting element LD is applied.

In an embodiment, the first conductive semiconductor layer 11 may be disposed in a core, i.e., a central (or middle) portion, of the light emitting element LD. The light emitting element LD may have a shape corresponding to the shape of the first conductive semiconductor layer 11. For instance, if the first conductive semiconductor layer 11 has a hexagonal pyramid shape, the light emitting element LD and the emission pattern 10 each may also have a hexagonal pyramid shape.

The active layer 12 may be provided and/or formed to enclose the outer circumferential surface of the first conductive semiconductor layer 11 in the longitudinal direction (L) of the light emitting element LD. In detail, the active layer 12 may be provided and/or formed to enclose an area of the first conductive semiconductor layer 11, other than a lower end of the opposite ends of the first conductive semiconductor layer 11, in the longitudinal direction (L) of the light emitting element LD.

The second conductive semiconductor layer 13 may be provided and/or formed to enclose the active layer 12 in the longitudinal direction (L) of the light emitting element LD, and may include a semiconductor layer having a type different from that of the first conductive semiconductor layer 11. For example, the second conductive semiconductor layer 13 may include at least one p-type semiconductor layer.

In an embodiment, the light emitting element LD may include an electrode layer 15 that encloses at least one side of the second conductive semiconductor layer 13. The electrode layer 15 may be an ohmic contact electrode electrically connected to the second conductive semiconductor layer 13, but the disclosure is not limited thereto.

As described above, the light emitting element LD may have a hexagonal pyramid shape with the opposite ends protruding outward and may be implemented as the emission pattern 10 with a core-shell structure including the first conductive semiconductor layer 11 provided in the central portion thereof, the active layer 12 which encloses the first conductive semiconductor layer 11, the second conductive semiconductor layer 13 which encloses the active layer 12, and the electrode layer 15 which encloses the second conductive semiconductor layer 13. The first conductive semiconductor layer 11 may be disposed on the first end (or the lower end) of the light emitting element LD having a hexagonal pyramid shape, and the electrode layer 15 may be disposed on the second end (or the upper end) of the light emitting element LD.

In an embodiment, the light emitting element LD may further include an insulating film 14 provided on the outer circumferential surface of the emitting pattern 10 having a core-shell structure. The insulating film 14 may include a transparent insulating material.

Figure 2:
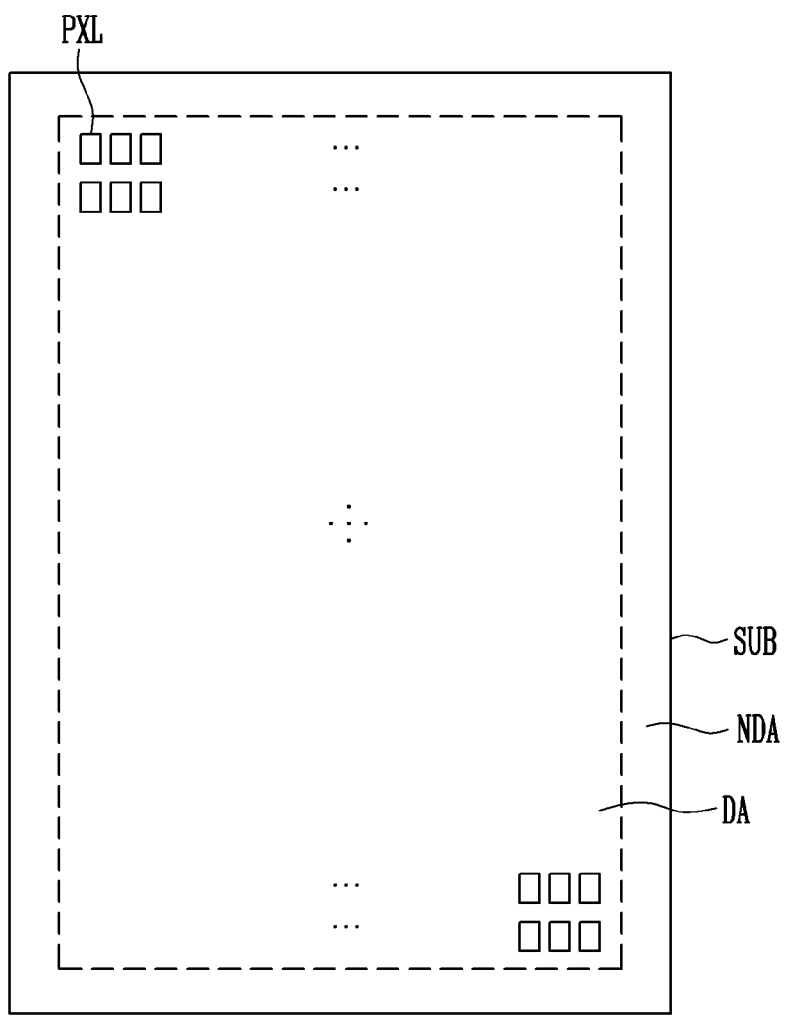
FIG. 2 illustrates a display device in accordance with an embodiment of the disclosure, and particularly, is a schematic plan view illustrating a display device using any one light emitting element of the light emitting elements illustrated in FIGS. 1A to 1H as a light emitting source.

FIG. 2 illustrates a display device in accordance with an embodiment, and particularly, is a schematic plan view illustrating a display device using any of the light emitting elements illustrated in FIGS. 1A to 1H as a light emitting source.

For the sake of explanation, FIG. 2 schematically illustrates the structure of the display device, focusing on a display area in which an image is displayed. Although not illustrated in the drawings, at least one driving circuit (e.g., a scan driver and a data driver) and/or lines may be further provided in the display device.

Referring to FIGS. 1A to 1H, and 2, the display device in accordance with an embodiment may include a substrate SUB, pixels PXL provided on the substrate SUB and each including at least one light emitting element LD, a driver (not illustrated) provided on the substrate SUB and configured to drive the pixels PXL, and a line component (not illustrated) provided to electrically connect the pixels PXL with the driver.

The display device may be classified into a passive-matrix type display device and an active-matrix type display device according to a method of driving the light emitting element LD. For example, in case that the display device in accordance with an embodiment is implemented as an active matrix type, each of the pixels PXL may include a driving transistor configured to control the amount of current to be supplied to the light emitting element LD, and a switching transistor configured to transmit data signals to the driving transistor.

Recently, active-matrix type display devices capable of selectively turning on each pixel PXL taking into account the resolution, the contrast, and the working speed have been mainstreamed. However, the disclosure is not limited thereto. For example, passive-matrix type display devices in which pixels PXL may be turned on by groups may also employ components (e.g., first and second electrodes) for driving the light emitting element LD.

The substrate SUB may include a display area DA and a non-display area NDA.

In an embodiment, the display area DA may be disposed in a central area of the display device, and the non-display area NDA may be disposed in a perimeter area of the display device in such a way as to enclose the display area DA. The locations of the display area DA and the non-display area NDA are not limited thereto, and the locations thereof may be changed.

The display area DA may be an area in which the pixels PXL for displaying an image are provided. The non-display area NDA may be an area in which the driver for driving the pixels PXL and some of the line component for electrically connecting the pixels PXL to the driver are provided.

The display area DA may have various shapes. For example, the display area DA may be provided in various forms such as a closed polygon including sides formed of linear lines, a circle, an ellipse or the like including a side formed of a curved line, and a semicircle, a semi-ellipse or the like including sides formed of a linear line and a curved line.

The non-display area NDA may be provided in at least one side of the display area DA. In an embodiment, the non-display area NDA may enclose the perimeter of the display area DA.

The substrate SUB may include a transparent insulating material to allow light transmission.

The substrate SUB may be a rigid substrate. For example, the substrate SUB as the rigid substrate may be one of a glass substrate, a quartz substrate, a glass ceramic substrate, and a crystalline glass substrate.

The substrate SUB may be a flexible substrate. Here, the substrate as the flexible substrate may be either a film substrate or a plastic substrate which includes a polymer organic material. For example, the substrate as the flexible substrate may include at least one of the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

However, materials forming (or constituting) the substrate SUB may be changed, and include, for example, fire-reinforced plastic (FRP).

An area of the substrate SUB is provided as the display area DA in which the pixels PXL are disposed, and the other area thereof is provided as the non-display area NDA. For example, the substrate SUB may include the display area DA including pixel areas in which the respective pixels PXL are formed, and the non-display area NDA disposed around the display area DA.

The pixels PXL may be disposed in the display area DA on the substrate SUB. In an embodiment, the pixels PXL may be arranged in the display area DA in a stripe or a PENTILE™ structure, but the disclosure is not limited thereto.

Each pixel PXL may include a light emitting element LD configured to be driven in response to a corresponding scan signal and a corresponding data signal. The light emitting element LD may have a small size corresponding to the micrometer scale or the nanometer scale and be electrically connected in parallel to light emitting elements LD disposed adjacent thereto, but the disclosure is not limited thereto. The light emitting element LD may form a light source of each pixel PXL.

Each of the pixels PXL may include at least one light source which is driven by a predetermined control signal (e.g., a scan signal and a data signal) and/or a predetermined power supply (e.g., a first driving power supply and a second driving power supply). For example, each of the pixels PXL may include a light emitting element LD illustrated in each of the embodiments of FIGS. 1A to 1G, e.g., at least one subminiature light emitting element LD having a small size corresponding to a nanometer scale or a micrometer scale. However, in embodiments of the present disclosure, the type of the light emitting element LD which may be used as a light source of the pixel PXL is not limited thereto.

In an embodiment, the color, the type, and/or the number of pixels PXL are not particularly limited. For example, the color of light emitted from each pixel PXL may be changed in various ways.

The driver may provide a signal to each pixel PXL through the line component and thus control the operation of the pixel PXL. For the sake of explanation, in FIG. 2, the line component is omitted.

The driver may include a scan driver configured to transmit scan signals to the pixels PXL through scan lines, an emission driver configured to transmit emission control signals to the pixels PXL through emission control lines, a data driver configured to provide data signals to the pixels PXL through data lines, and a timing controller. The timing controller may control the scan driver, the emission driver, and the data driver.

Figure 3A:
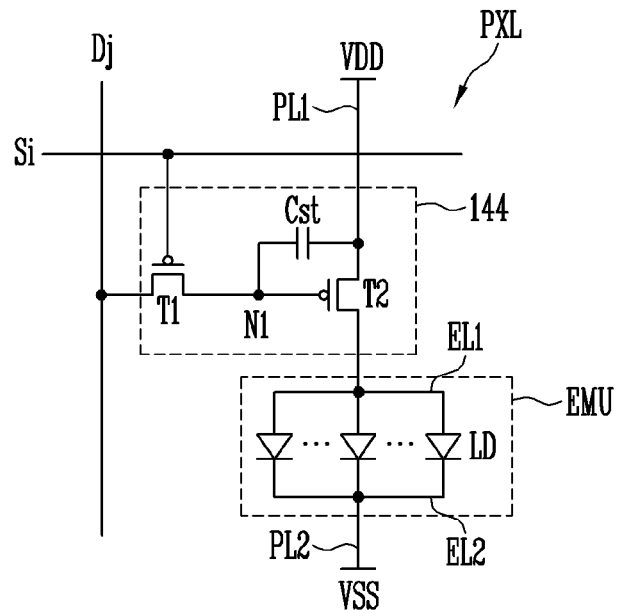
FIGS. 3A to 3C are schematic circuit diagrams illustrating various embodiments of electrical connection relationship of components included in any one pixel of the pixels illustrated in FIG. 2.
Figure 3B:
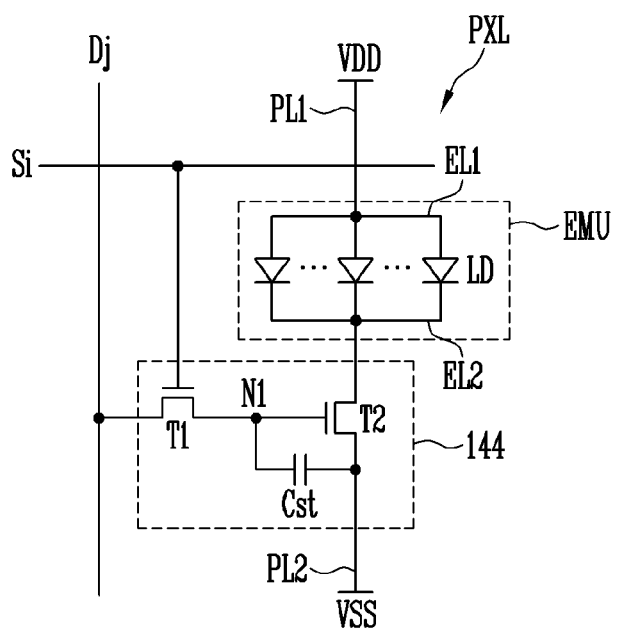
Figure 3C:
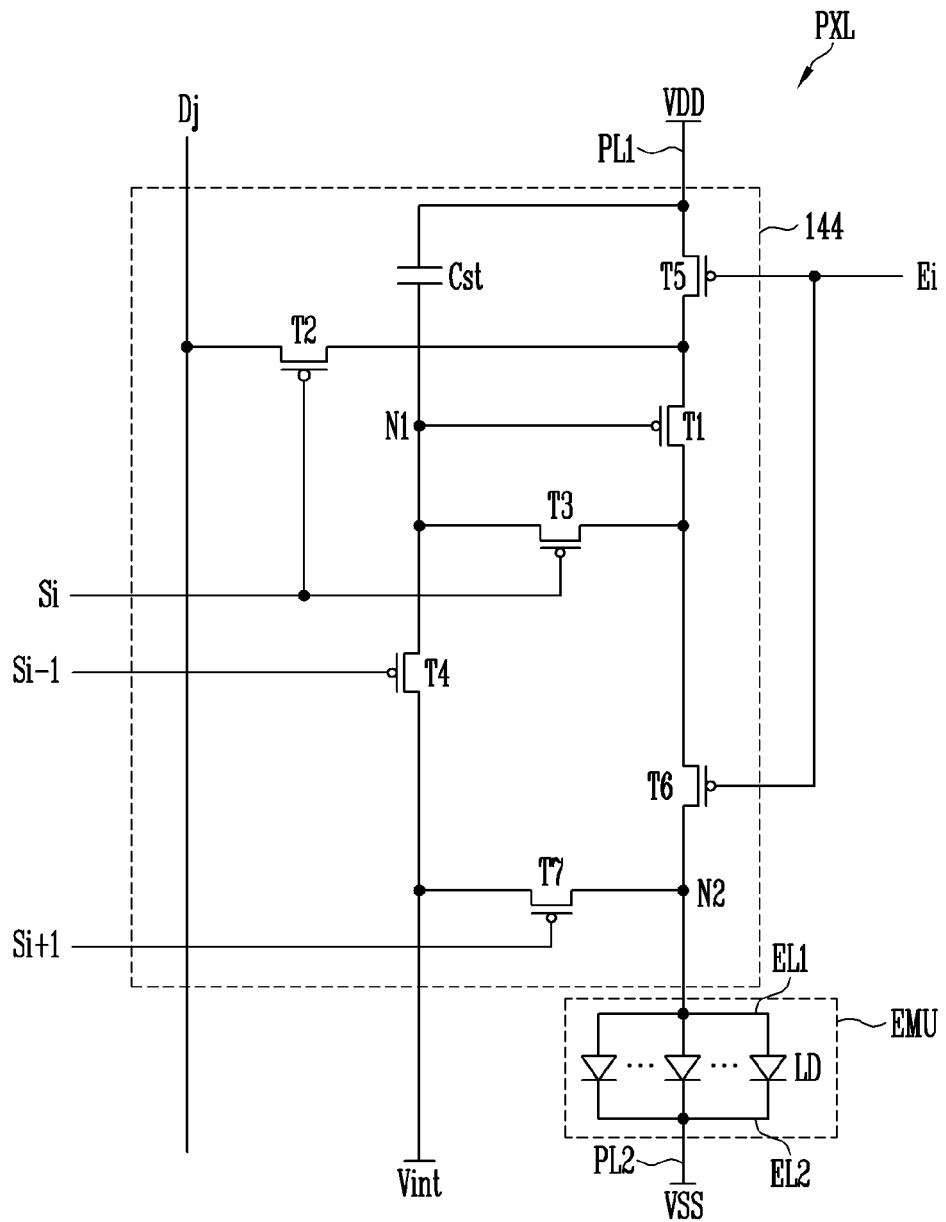

FIGS. 3A to 3C are schematic circuit diagrams illustrating various embodiments of electrical connection relationship of components included in any pixel of the pixels illustrated in FIG. 2.

For example, FIGS. 3A to 3C illustrate different embodiments of the electrical connection relationship of components included in a pixel PXL which may be employed in an active display device. However, the types of the components included in the pixel PXL to which embodiments may be applied are not limited thereto.

In FIGS. 3A to 3C, not only the components included in each of the pixels PXL illustrated in FIG. 2 but also an area in which the components are provided is embraced in the definition of the term "pixel PXL". In an embodiment, each pixel PXL illustrated in FIGS. 3A to 3C may be any of the pixels PXL provided in the display device of FIG. 2. The pixels PXL may have substantially the same or similar structure.

Referring to FIGS. 1A to 1H, 2, and 3A to 3C, each pixel PXL may include an emission part EMU configured to generate light having a luminance corresponding to a data signal. The pixel PXL may selectively further include a pixel circuit 144 configured to drive the emission part EMU.

In an embodiment, the emission part EMU may include light emitting elements LD electrically connected in parallel between a first power supply line PL1 to which a first driving power supply VDD is applied and a second power supply line PL2 to which a second driving power supply VSS is applied. For example, the emission part EMU may include a first electrode EL1 (or a "first alignment electrode") electrically connected to the first driving power supply VDD via a first power supply line PL1, a second electrode EL2 (or "second alignment electrode") electrically connected to the second driving power supply VSS through a second power supply line PL2, and a plurality of light emitting elements LD connected in parallel to each other in an identical direction between the first and second electrodes EL1 and EL2. In an embodiment, the first electrode EL1 may be an anode electrode, and the second electrode EL2 may be a cathode electrode.

In an embodiment, each of the light emitting elements LD included in the emission part EMU may include a first end electrically connected to the first driving power supply VDD through the first electrode EL1, and a second end electrically connected to the second driving power supply VSS through the second electrode EL2. The first driving power supply VDD and the second driving power supply VSS may have different potentials. For example, the first driving power supply VDD may be set as a high-potential power supply, and the second driving power supply VSS may be set as a low-potential power supply. Here, a difference in potential between the first and second driving power supplies VDD and VSS may be set to a value equal to or greater than a threshold voltage of the light emitting elements LD during a light emission period of the pixel PXL.

As described above, the light emitting elements LD that are electrically connected in parallel to each other in the same direction (e.g., in a forward direction) between the first electrode EL1 and the second electrode EL2 to which voltages having different potentials are respectively supplied, may form respective valid light sources. The valid light sources may collectively form the emission part EMU of the pixel PXL.

The light emitting elements LD of the emission part EMU may emit light having a luminance corresponding to driving current supplied thereto through the pixel circuit 144. For example, during each frame period, the pixel circuit 144 may supply driving current corresponding to a grayscale of corresponding frame data to the emission part EMU. The driving current supplied to the emission part EMU may be divided into (or include) the light emitting elements LD electrically connected to each other in an identical direction. Hence, each of the light emitting elements LD may emit light having a luminance corresponding to current applied thereto, so that the emission part EMU may emit light having a luminance corresponding to the driving current.

Although FIGS. 3A to 3C illustrate embodiments in which the light emitting elements LD are electrically connected to each other in the identical direction between the first and second driving power supplies VDD and VSS, the disclosure is not limited thereto. In an embodiment, the emission part EMU may further include at least one invalid light source, as well as the light emitting elements LD that form the respective valid light sources. For example, at least a reverse light emitting element (not shown) may be further electrically connected between the first and second electrodes EL1 and EL2 of the emission part EMU. The reverse light emitting element, along with the light emitting elements LD that form the valid light sources, may be electrically connected in parallel to each other between the first and second electrodes EL1 and EL2. Here, the reverse light emitting element may be electrically connected between the first and second electrodes EL1 and EL2 in a direction opposite to that of the light emitting elements LD. Even in case that a predetermined driving voltage (e.g., a normal directional driving voltage) is applied between the first and second electrodes EL1 and EL2, the reverse light emitting element remains disabled. Hence, current does not substantially flow through the reverse light emitting element.

The pixel circuit 144 may be electrically connected to a scan line Si and a data line Dj of the corresponding pixel PXL. For example, if the pixel PXL is disposed in an i-th row (where i is a natural number) and a j-th column (where j is a natural number) of the display area DA, the pixel circuit 144 of the pixel PXL may be electrically connected to an i-th scan line Si and a j-th data line Dj of the display area DA. In an embodiment, the pixel circuit 144 may include first and second transistors T1 and T2, and a storage capacitor Cst, as illustrated in FIG. 3A. The structure of the pixel circuit 144 is not limited to that of the embodiment illustrated in FIG. 3A.

A first terminal of the first transistor (T1; switching transistor) may be electrically connected to the data line Dj, and a second terminal thereof may be electrically connected to a first node N1. Here, the first terminal and the second terminal of the first transistor T1 may be different from each other, and, for example, in case that the first terminal is a source electrode, the second terminal may be a drain electrode. A gate electrode of the first transistor T1 may be electrically connected to the scan line Si.

In case that a scan signal having a voltage (e.g., a low-level voltage) capable of turning on the first transistor T1 is supplied from the scan line Si, the first transistor T1 is turned on to electrically connect the data line Dj with the first node N1. Here, a data signal of a corresponding frame is supplied to the data line Dj, whereby the data signal is transmitted to the first node N1. The data signal transmitted to the first node N1 may be charged to the storage capacitor Cst.

A first terminal of the second transistor (T2; driving transistor) may be electrically connected to the first driving power supply VDD, and a second terminal thereof may be electrically connected to the first electrode EL1 for the light emitting elements LD. A gate electrode of the second transistor T2 may be electrically connected to the first node N1. As such, the second transistor T2 may control the amount of driving current to be supplied to the light emitting elements LD in response to the voltage of the first node N1.

A first electrode of the storage capacitor Cst may be electrically connected to the first driving power supply VDD, and a second electrode thereof may be electrically connected to the first node N1. The storage capacitor Cst is charged with a voltage corresponding to a data signal supplied to the first node N1, and maintains the charged voltage until a data signal of a subsequent frame is supplied.

FIG. 3A illustrates the pixel circuit 144 including the first transistor T1 configured to transmit a data signal to the pixel PXL, the storage capacitor Cst configured to store the data signal, and the second transistor T2 configured to supply driving current corresponding to the data signal to the light emitting elements LD.

However, the disclosure is not limited thereto, and the structure of the pixel circuit 144 may be changed in various ways. For example, the pixel circuit 144 may further include at least one transistor element such as a transistor element configured to compensate for the threshold voltage of the second transistor T2, a transistor element configured to initialize the first node N1, and/or a transistor element configured to control a light emission time of the light emitting elements LD, or other circuit elements such as a boosting capacitor for boosting the voltage of the first node N1.

Furthermore, although in FIG. 3A the transistors, e.g., the first and second transistors T1 and T2, included in the pixel circuit 144 are illustrated as being formed of P-type transistors, the disclosure is not limited thereto. In other words, at least one of the first and second transistors T1 and T2 included in the pixel circuit 144 may be changed to an N-type transistor.

Next, referring to FIGS. 1A to 1H, 2, and 3B, the first and second transistors T1 and T2 in accordance with an embodiment may be formed of N-type transistors. The configuration and operation of the pixel circuit 144 illustrated in FIG. 3B may be different from those of the pixel circuit 144 of FIG. 3A at least in connection positions of some components due to a change in the type of transistor. Therefore, detailed descriptions of identical configurations will be omitted.

In an embodiment, the configuration of the pixel circuit 144 is not limited to the embodiments illustrated in FIGS. 3A and 3B. For example, the pixel circuit 144 may be configured in the same manner as that of an embodiment shown in FIG. 3C.

As illustrated in FIG. 3C, the pixel circuit 144 may be electrically connected to a scan line Si and a data line Dj of the pixel PXL. For example, if the pixel PXL is disposed in an i-th row and a j-th column of the display area DA, the pixel circuit 144 of the pixel PXL may be electrically connected to an i-th scan line Si and a j-th data line Dj of the display area DA.

In an embodiment, the pixel circuit 144 may also be electrically connected to at least one scan line. For example, the pixel PXL disposed in the i-th row of the display area DA may also be electrically connected to an i−1-th scan line Si−1 and/or an i+1-th scan line Si+1. In an embodiment, the pixel circuit 144 may be electrically connected not only to the first and second driving power supplies VDD and VSS but also to a third power supply. For example, the pixel circuit 144 may also be electrically connected to an initialization power supply Vint.

The pixel circuit 144 may include first to seventh transistors T1 to T7, and a storage capacitor Cst.

The first transistor T1 (driving transistor) may include a first electrode, e.g., a source electrode, electrically connected to the first driving power supply VDD via the fifth transistor T5, and a second electrode, e.g., a drain electrode thereof may be electrically connected to a first end of the light emitting elements LD via the sixth transistor T6. A gate electrode of the first transistor T1 may be electrically connected to a first node N1. The first transistor T1 may control driving current flowing between the first driving power supply VDD and the second driving power supply VSS via the light emitting elements LD in response to the voltage of the first node N1.

The second transistor T2 (switching transistor) may be electrically connected between the j-th data line Dj electrically connected to the pixel PXL and the source electrode of the first transistor T1. A gate electrode of the second transistor T2 may be electrically connected to the i-th scan line Si electrically connected to the pixel PXL. In case that a scan signal having a gate-on voltage (e.g., a low-level voltage) is supplied from the i-th scan line Si, the second transistor T2 may be turned on to electrically connect the j-th data line Dj to the source electrode of the first transistor T1. Hence, if the second transistor T2 is turned on, a data signal supplied from the j-th data line Dj may be transmitted to the first transistor T1.

The third transistor T3 may be electrically connected between the drain electrode of the first transistor T1 and the first node N1. A gate electrode of the third transistor T3 may be electrically connected to the i-th scan line Si. In case that a scan signal having a gate-on voltage is supplied from the scan line Si, the third transistor T3 may be turned on to electrically connect the drain electrode of the first transistor T1 to the first node N1.

The fourth transistor T4 may be electrically connected between the first node N1 and an initialization power supply line to which the initialization power supply Vint is to be applied. A gate electrode of the fourth transistor T4 may be electrically connected to a preceding scan line, e.g., the i−1-th scan line Si−1. In case that a scan signal having a gate-on voltage is supplied to the i−1-th scan line Si−1, the fourth transistor T4 may be turned on so that the voltage of the initialization power supply Vint may be transmitted to the first node N1. Here, the initialization power supply Vint may have a voltage equal to or less than the minimum voltage of the data signal.

The fifth transistor T5 may be connected between the first driving power supply VDD and the first transistor T1. A gate electrode of the fifth transistor T5 may be connected to a corresponding emission control line, e.g., an i-th emission control line Ei. The fifth transistor T5 may be turned off in case that an emission control signal having a gate-off voltage is supplied to the i-th emission control line Ei, and may be turned on in other cases.

The sixth transistor T6 may be electrically connected between the first transistor T1 and the first ends of the light emitting elements LD. A gate electrode of the sixth transistor T6 may be electrically connected to the i-th emission control line Ei. The sixth transistor T6 may be turned off in case that an emission control signal having a gate-off voltage is supplied to the i-th emission control line Ei, and may be turned on in other cases.

The seventh transistor T7 may be electrically connected between a second node N2 and the initialization power supply line to which the initialization power supply Vint is to be applied. A gate electrode of the seventh transistor T7 may be electrically connected to any of the scan lines of a subsequent stage, e.g., to the i+1-th scan line Si+1. In case that a scan signal having a gate-on voltage is supplied to the i+1-th scan line Si+1, the seventh transistor T7 may be turned on so that the voltage of the initialization power supply Vint may be supplied to the first ends of light emitting elements LD.

The storage capacitor Cst may be electrically connected between the first driving power supply VDD and the first node N1. The storage capacitor Cst may store a voltage corresponding both to the data signal applied to the first node N1 during each frame period and to the threshold voltage of the first transistor T1.

Although in FIG. 3C the transistors included in the pixel circuit 144, e.g., the first to seventh transistors T1 to T7, are illustrated as being formed of P-type transistors, the disclosure is not limited thereto. For example, at least one of the first to seventh transistors T1 to T7 may be changed to an N-type transistor.

Although FIGS. 3A to 3C illustrate embodiments in which all light emitting elements LD of each emission part EMU are electrically connected in parallel to each other, the disclosure is not limited thereto. In an embodiment, the emission part EMU may include at least one serial stage including light emitting elements LD electrically connected in parallel to each other. In other words, the emission part EMU may be formed of a serial/parallel combination structure.

The structure of the pixel PXL which may be applied to the disclosure is not limited to the embodiments illustrated in FIGS. 3A to 3C, and the corresponding pixel may have various structures. In an embodiment, each pixel PXL may be configured in a passive light emitting display device, or the like. In this case, the pixel circuit 144 may be omitted, and the opposite ends of the light emitting elements LD included in the emission part EMU may be directly electrically connected to the scan lines Si−1, Si, and Si+1, the data line Dj, the first power supply line PL1 to which the first driving power supply VDD is to be applied, the second power supply line PL2 to which the second driving power supply VSS is to be applied, and/or a control line.

Figure 4:
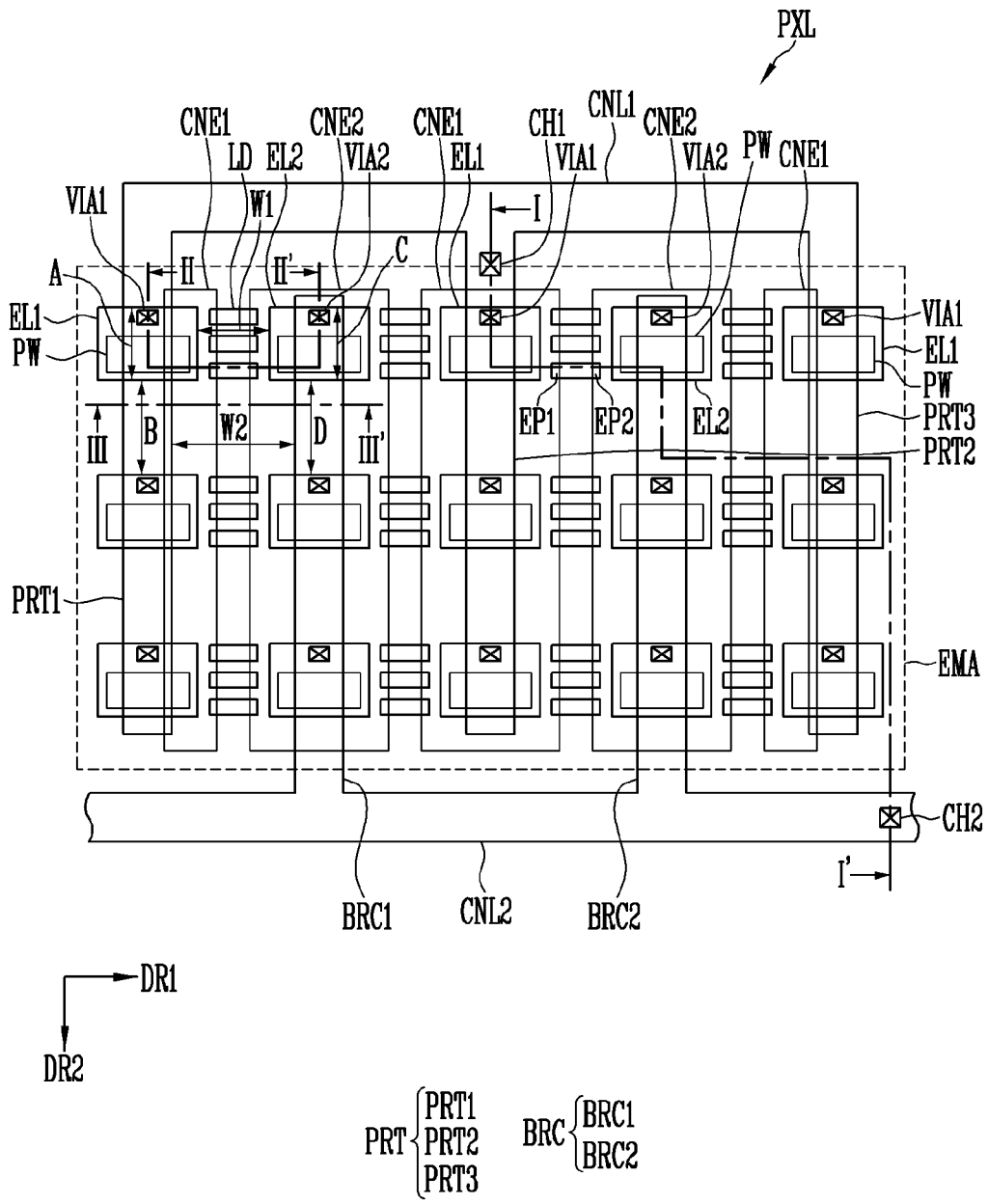
FIG. 4 is a plan view schematically illustrating a pixel of the pixels shown in FIG. 2.
Figure 5:
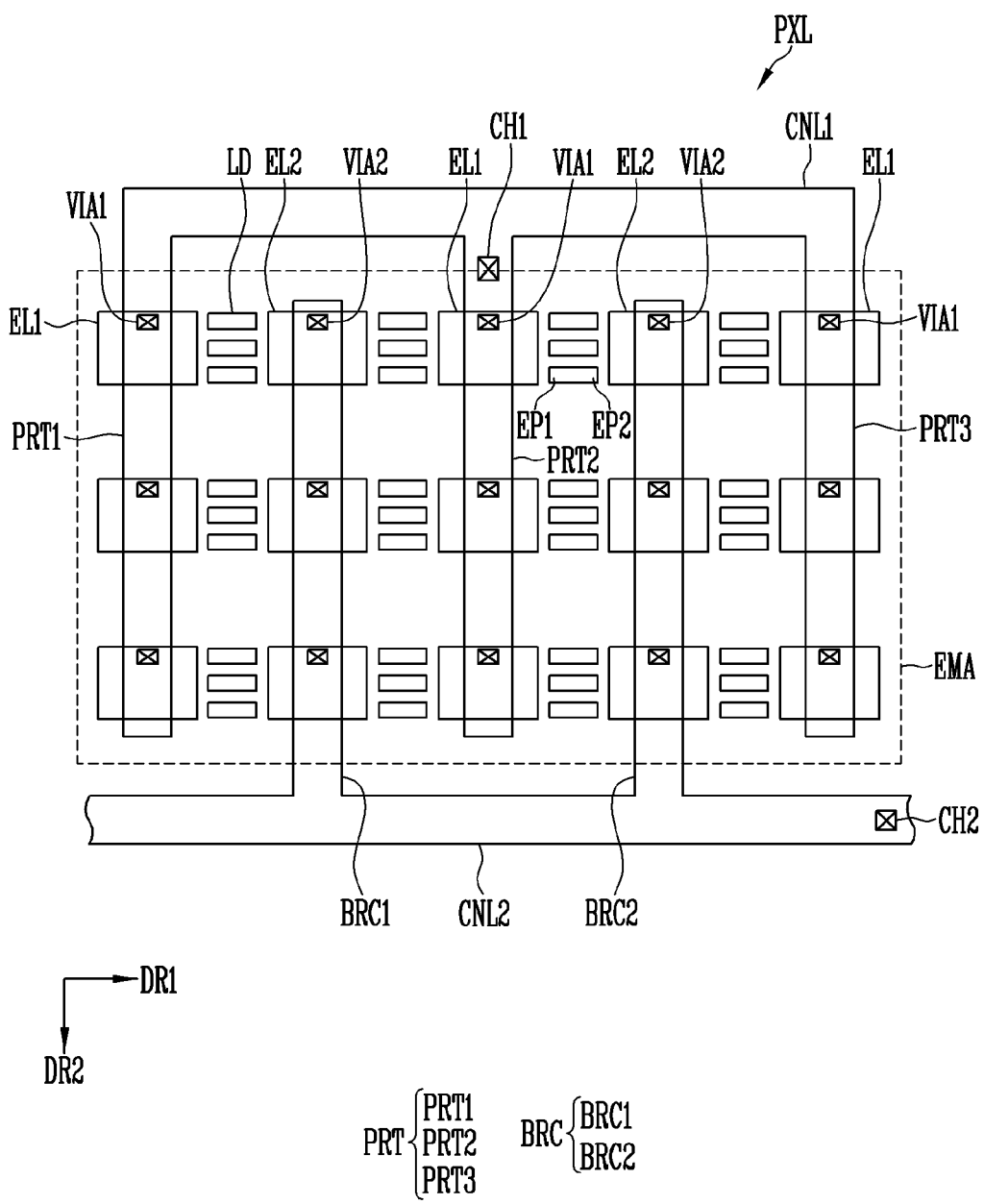
FIG. 5 is a plan view schematically illustrating only some components in a pixel shown in FIG. 4.
Figure 6:
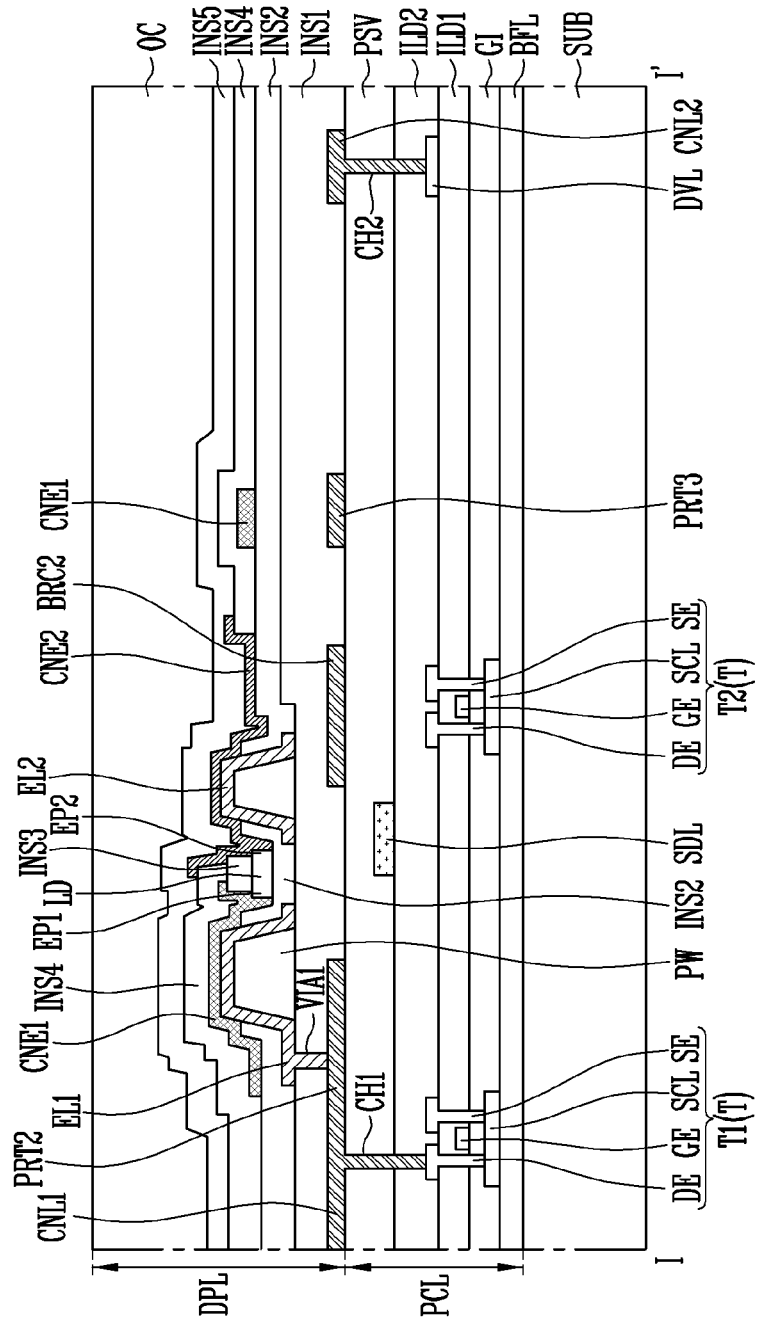
FIG. 6 is a schematic cross-sectional view taken along line of FIG. 4.
Figure 7:
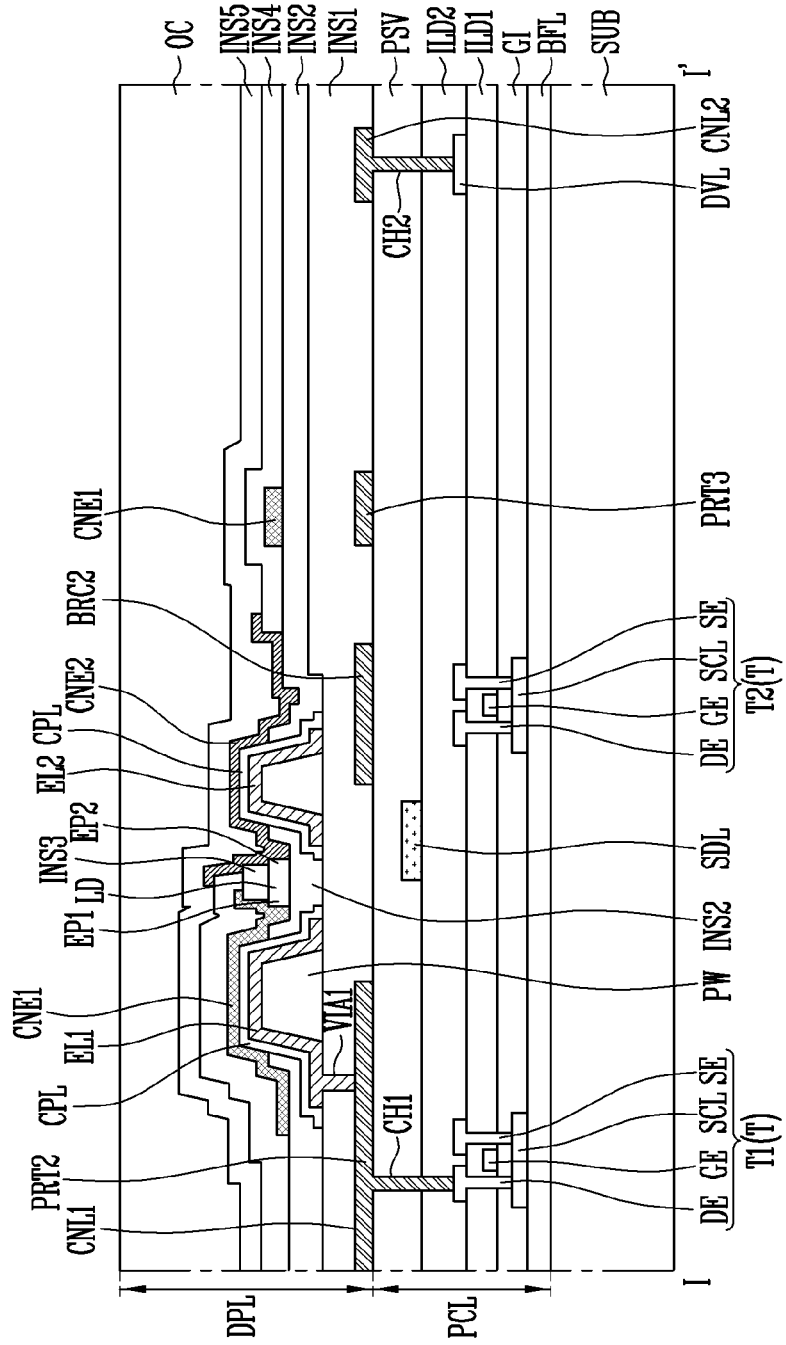
FIG. 7 illustrates an embodiment in which capping layers are respectively disposed on a first electrode and a second electrode shown in FIG. 6, and is a schematic cross-sectional view corresponding to line of FIG. 4.
Figure 8:
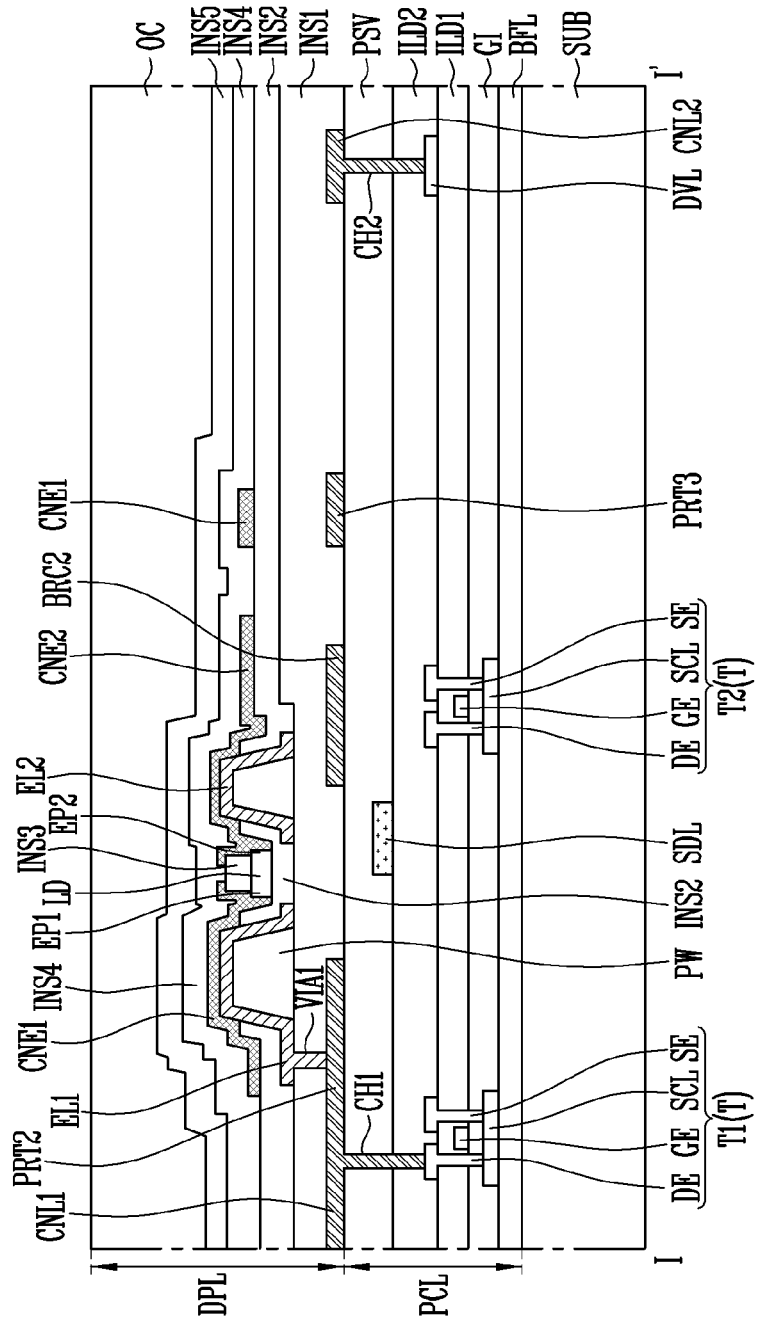
FIG. 8 illustrates an embodiment in which the first and second electrodes shown in FIG. 6 are disposed on an identical layer, and is a schematic cross-sectional view corresponding to line I-I' of FIG. 4.
Figure 9:
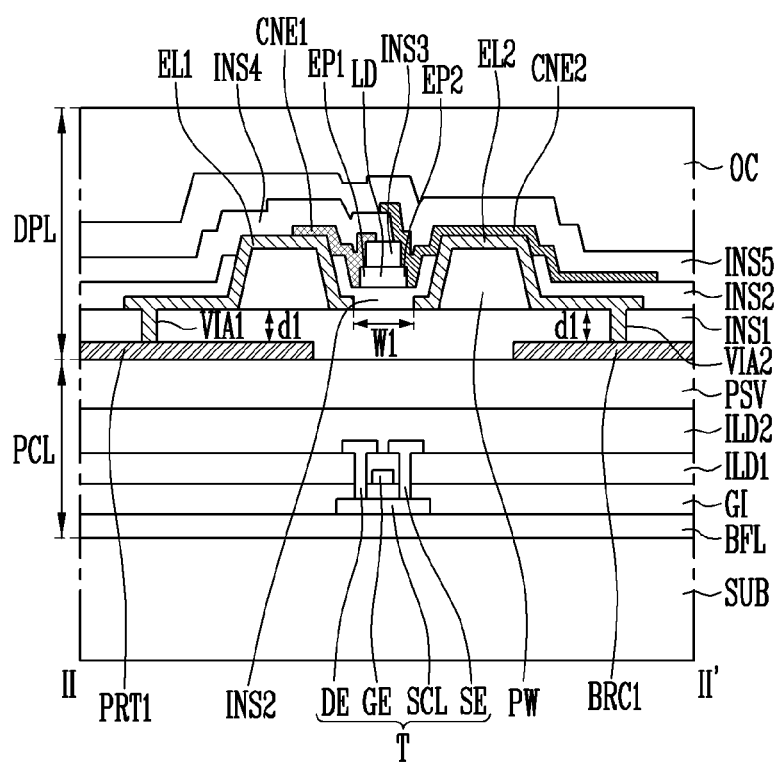
FIG. 9 is a schematic cross-sectional view taken along line II-II' of FIG. 4.
Figure 10:
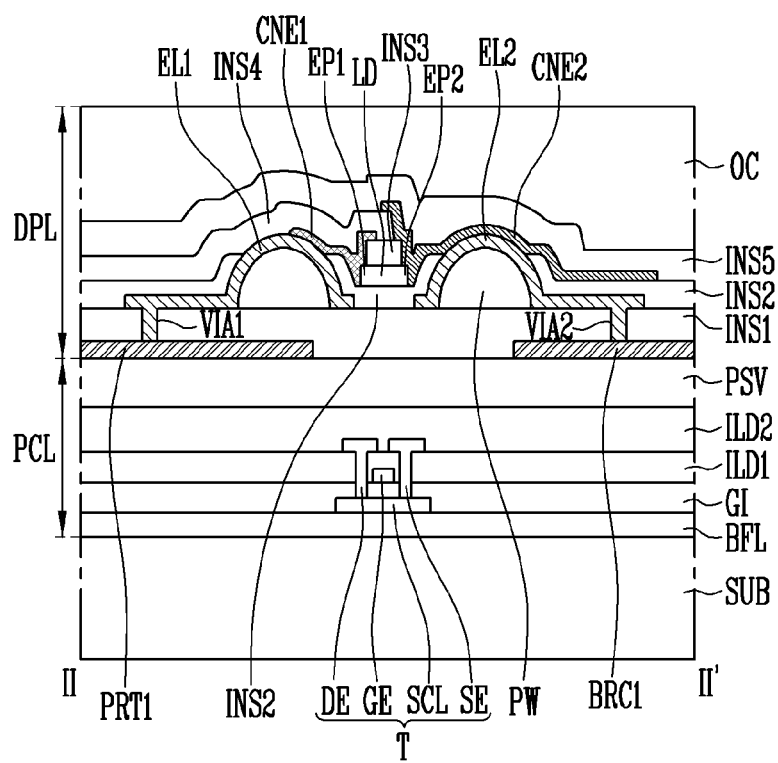
FIG. 10 illustrates another shape of a bank pattern illustrated in FIG. 9, and is a schematic cross-sectional view corresponding to line II-II' of FIG. 4.
Figure 11:
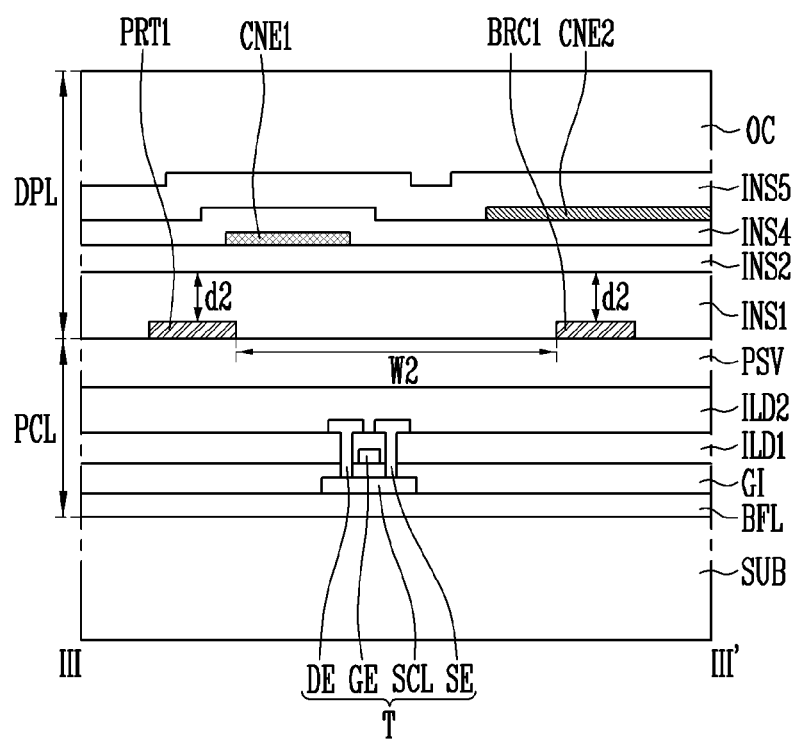
FIG. 11 is a schematic cross-sectional diagram taken along line of FIG. 4.
Figure 12A:
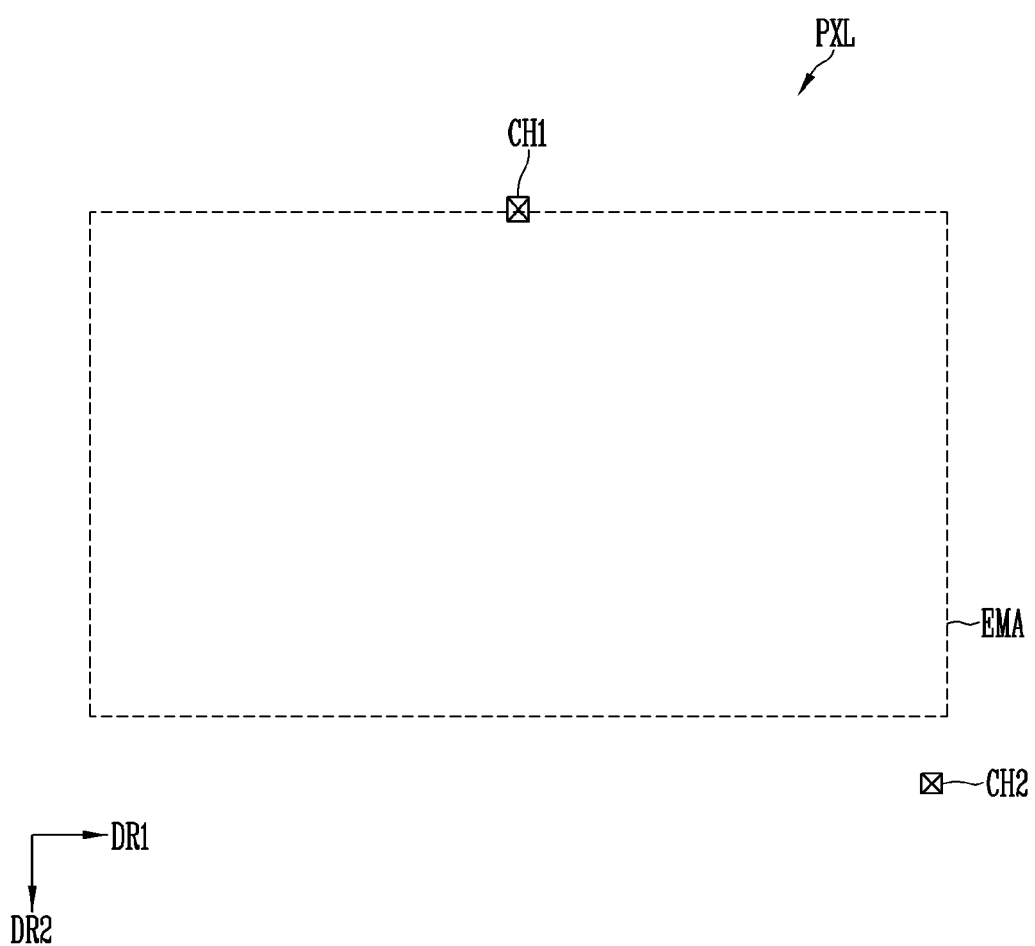
FIGS. 12A to 12I are schematic plan views sequentially illustrating a method of fabricating a pixel illustrated in FIG. 4.
Figure 12B:
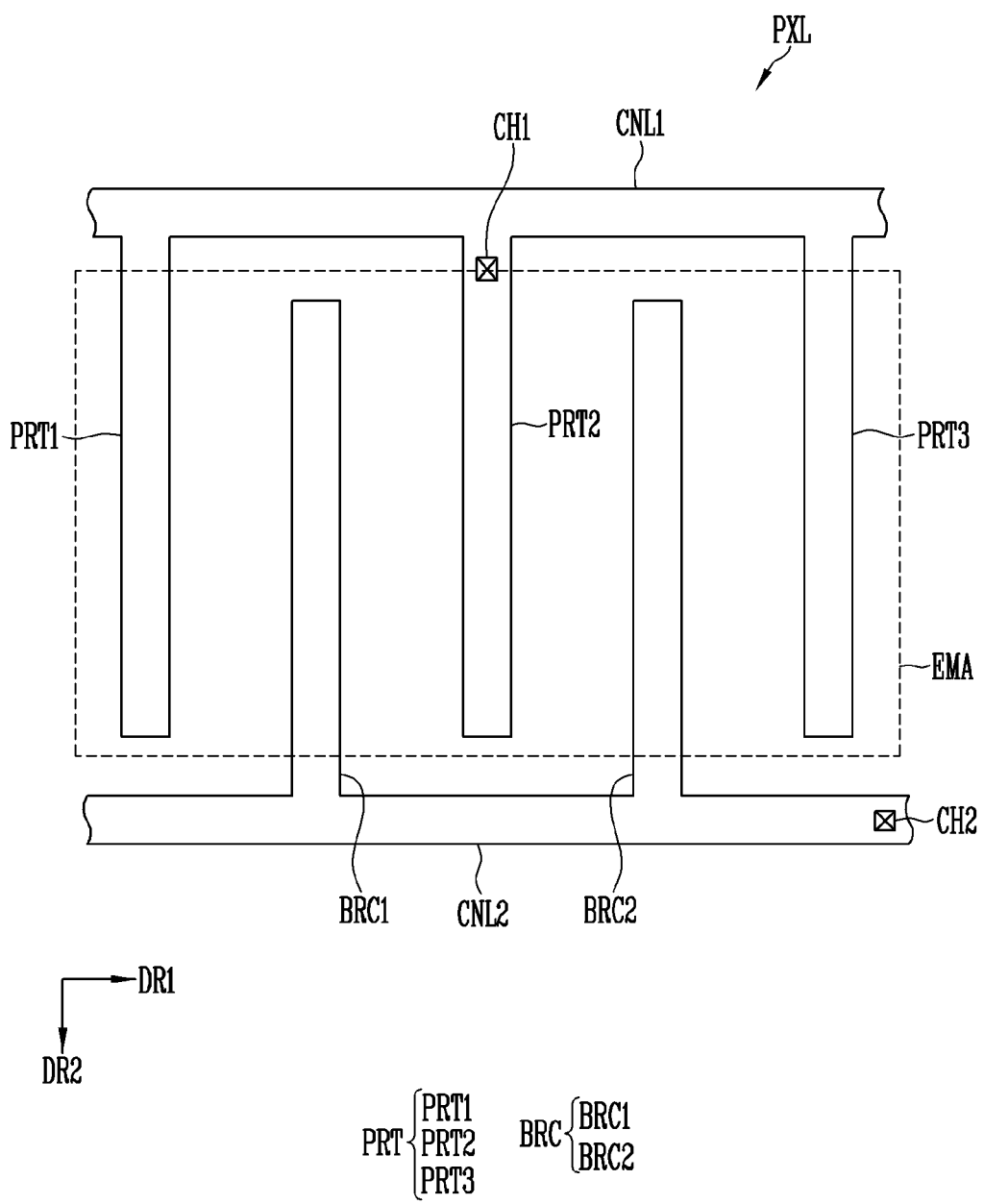
Figure 12C:
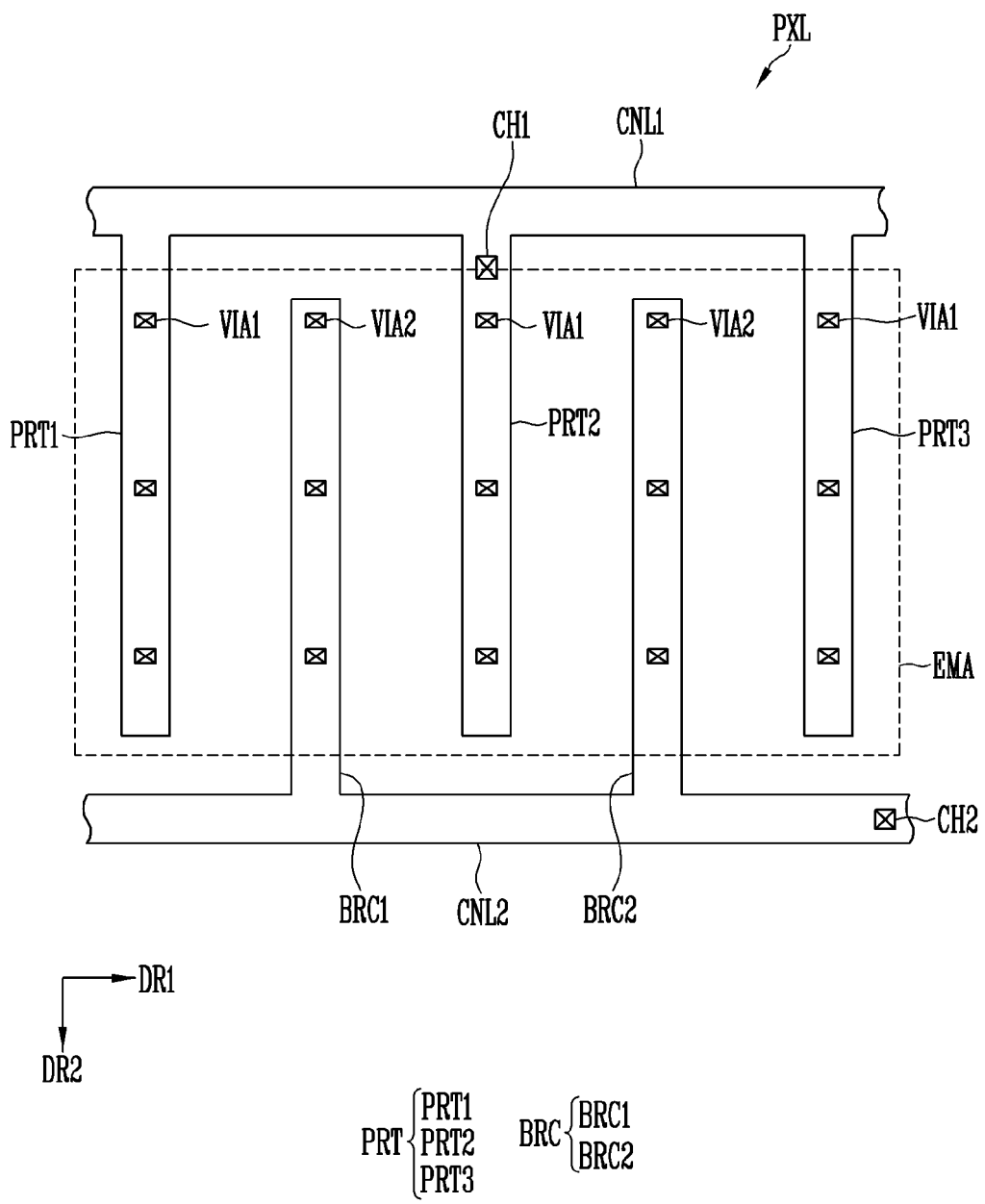
Figure 12D:
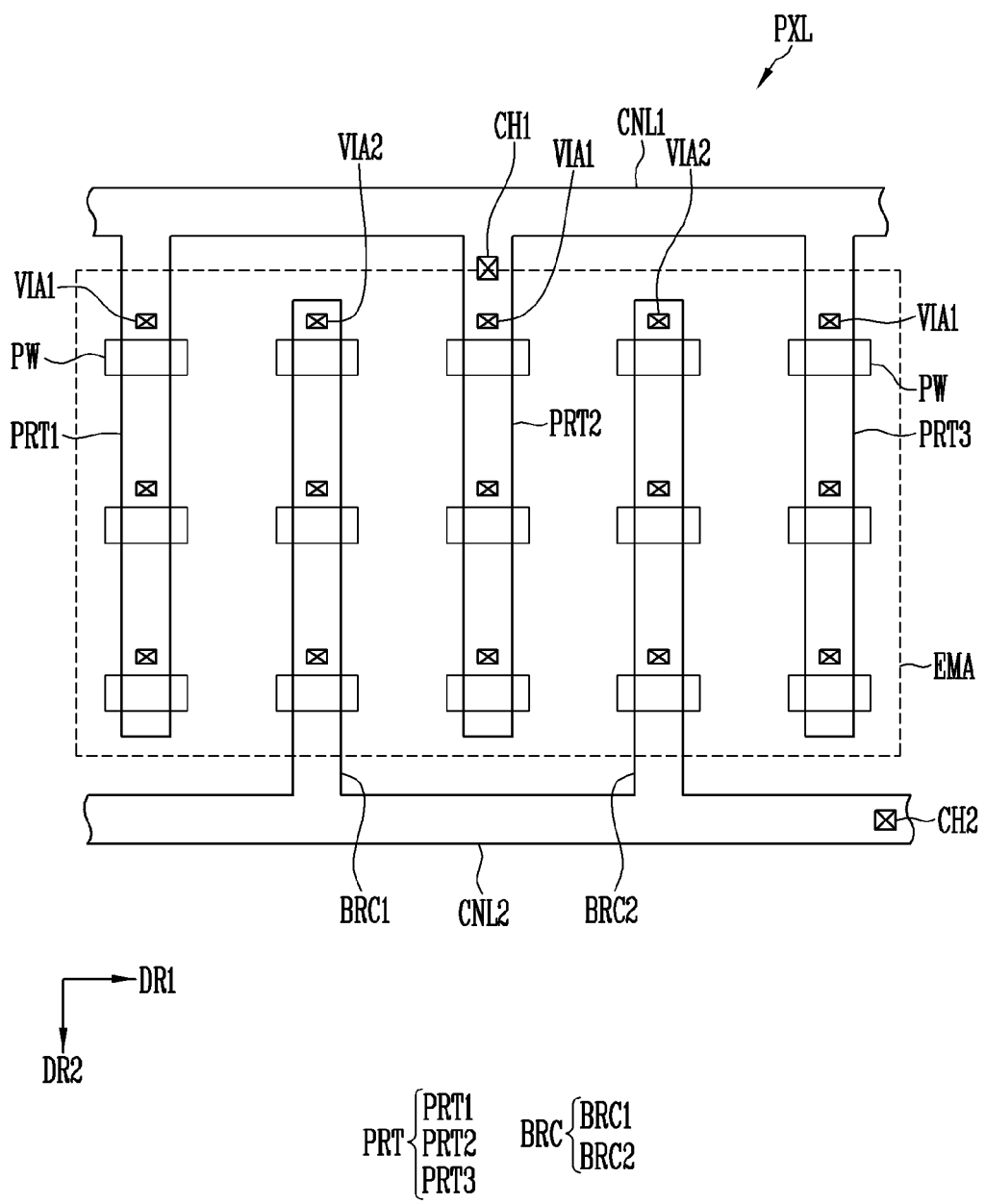
Figure 12E:
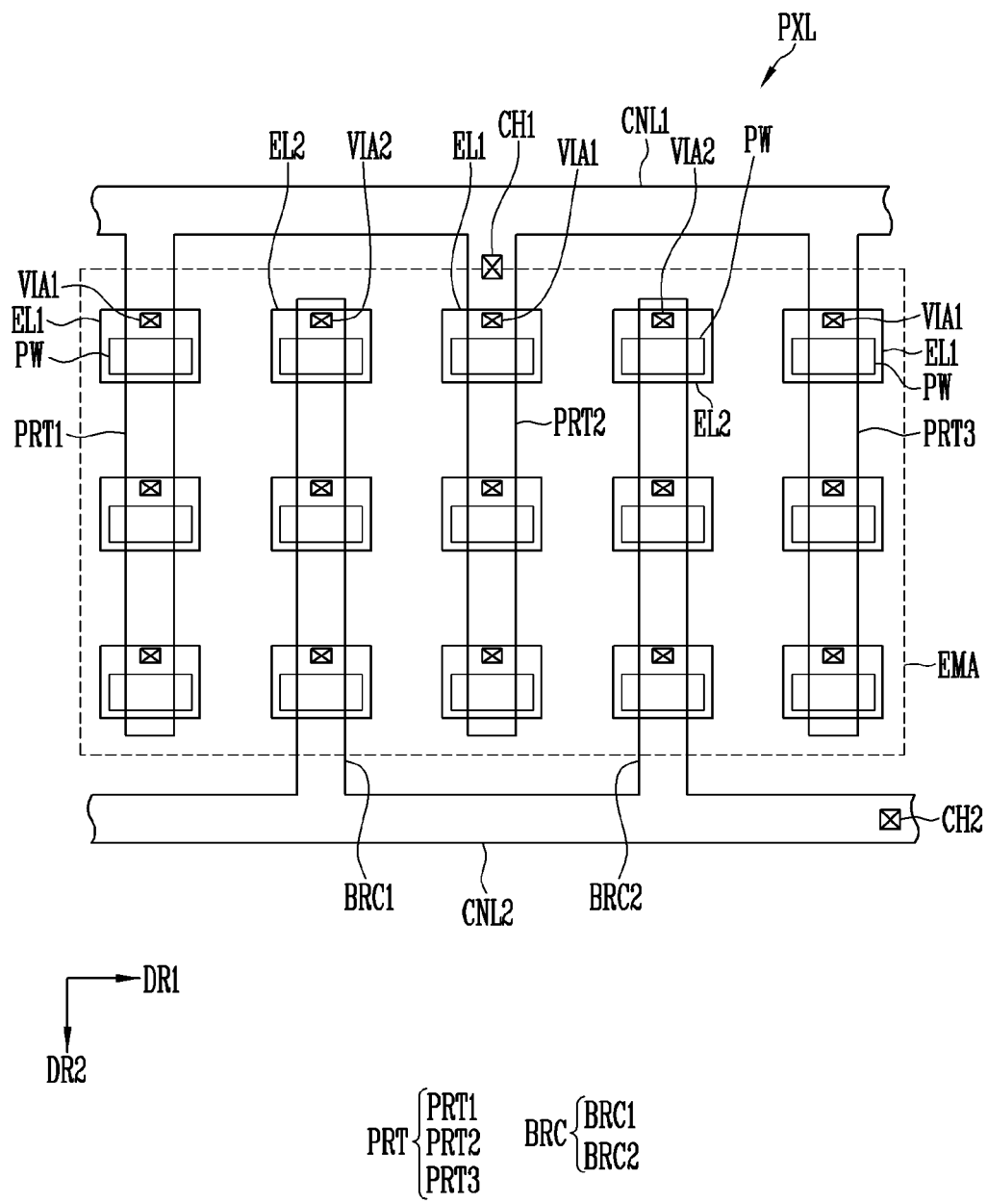
Figure 12F:
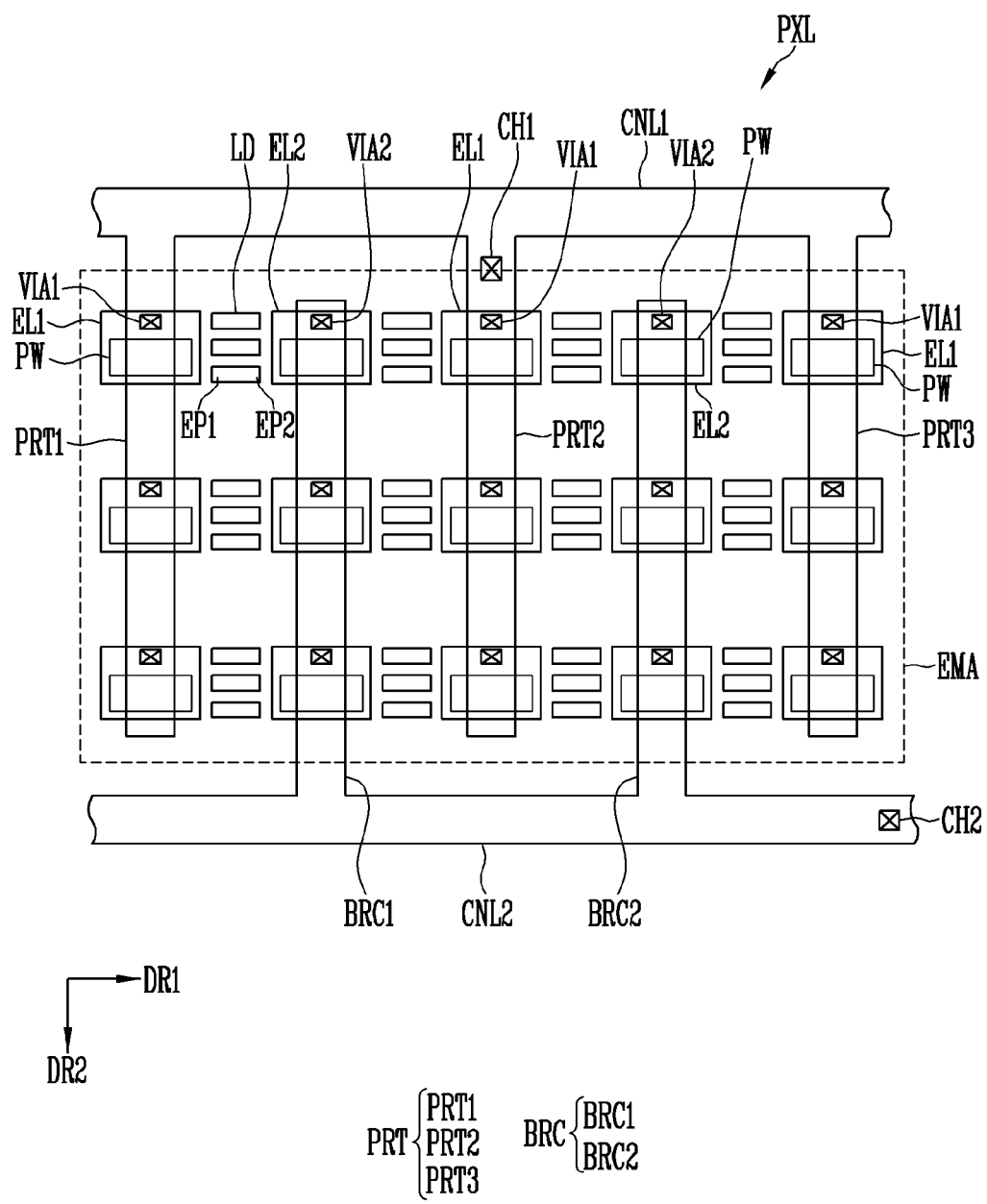
Figure 12G:
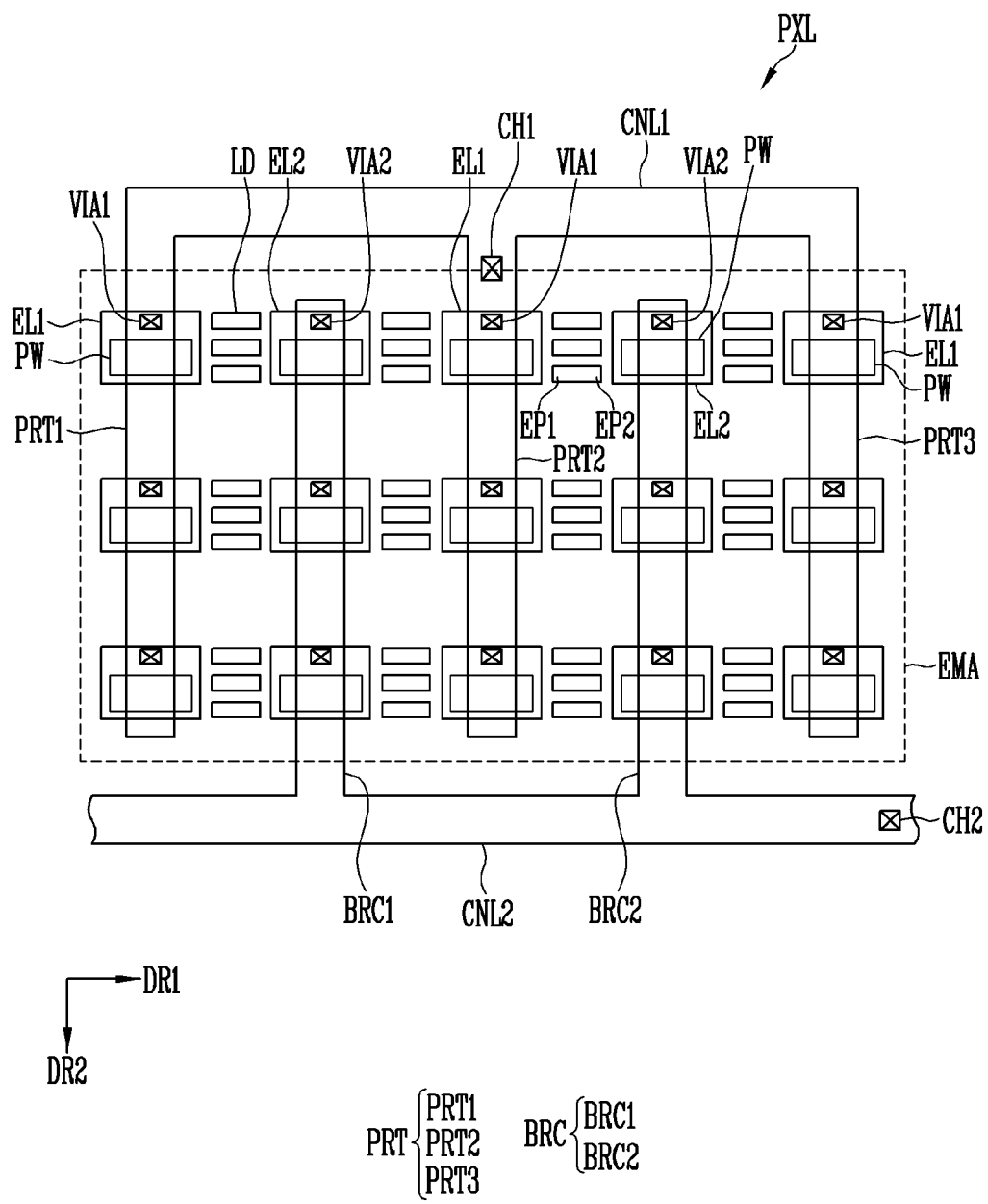
Figure 12H:
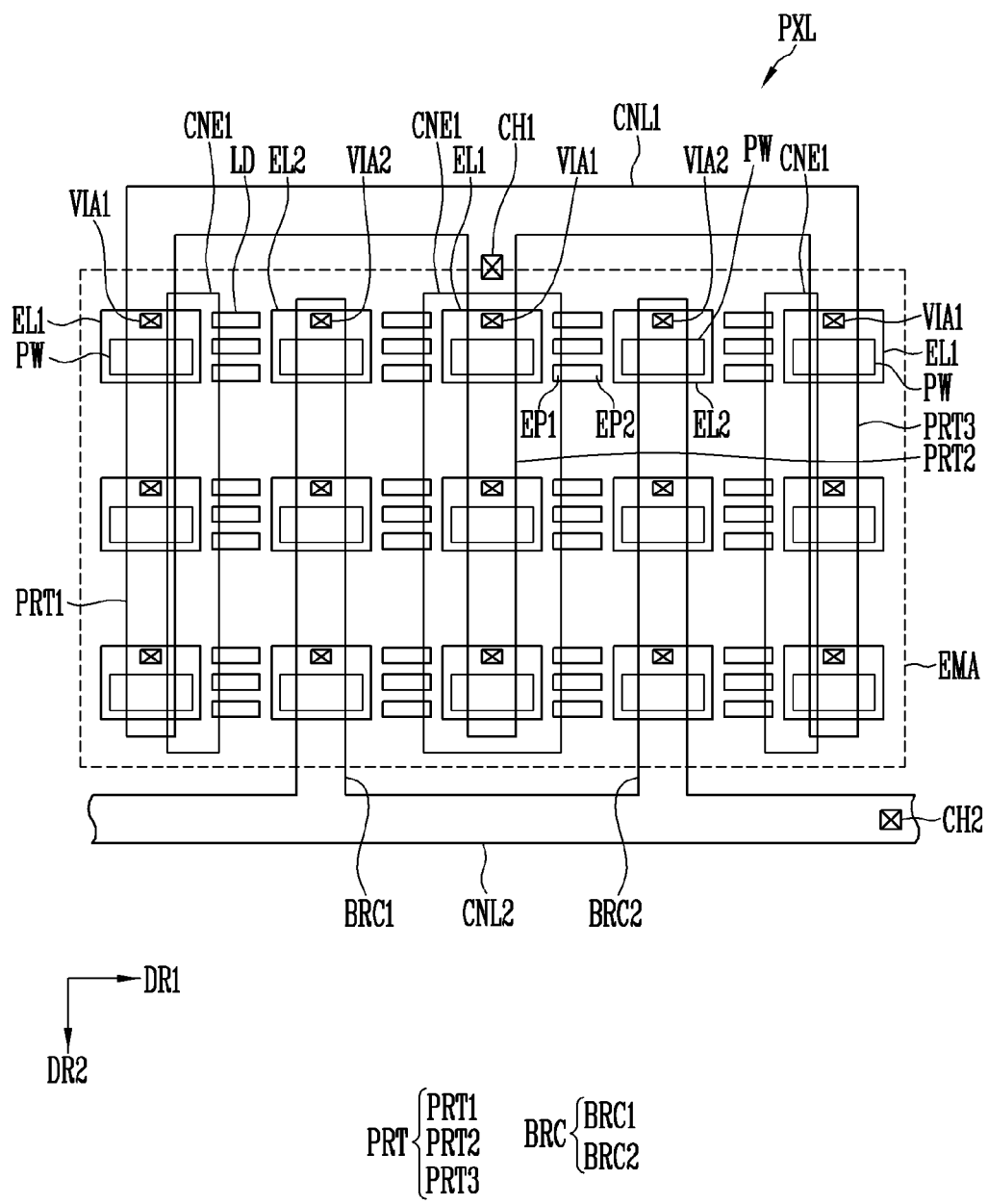
Figure 12I:
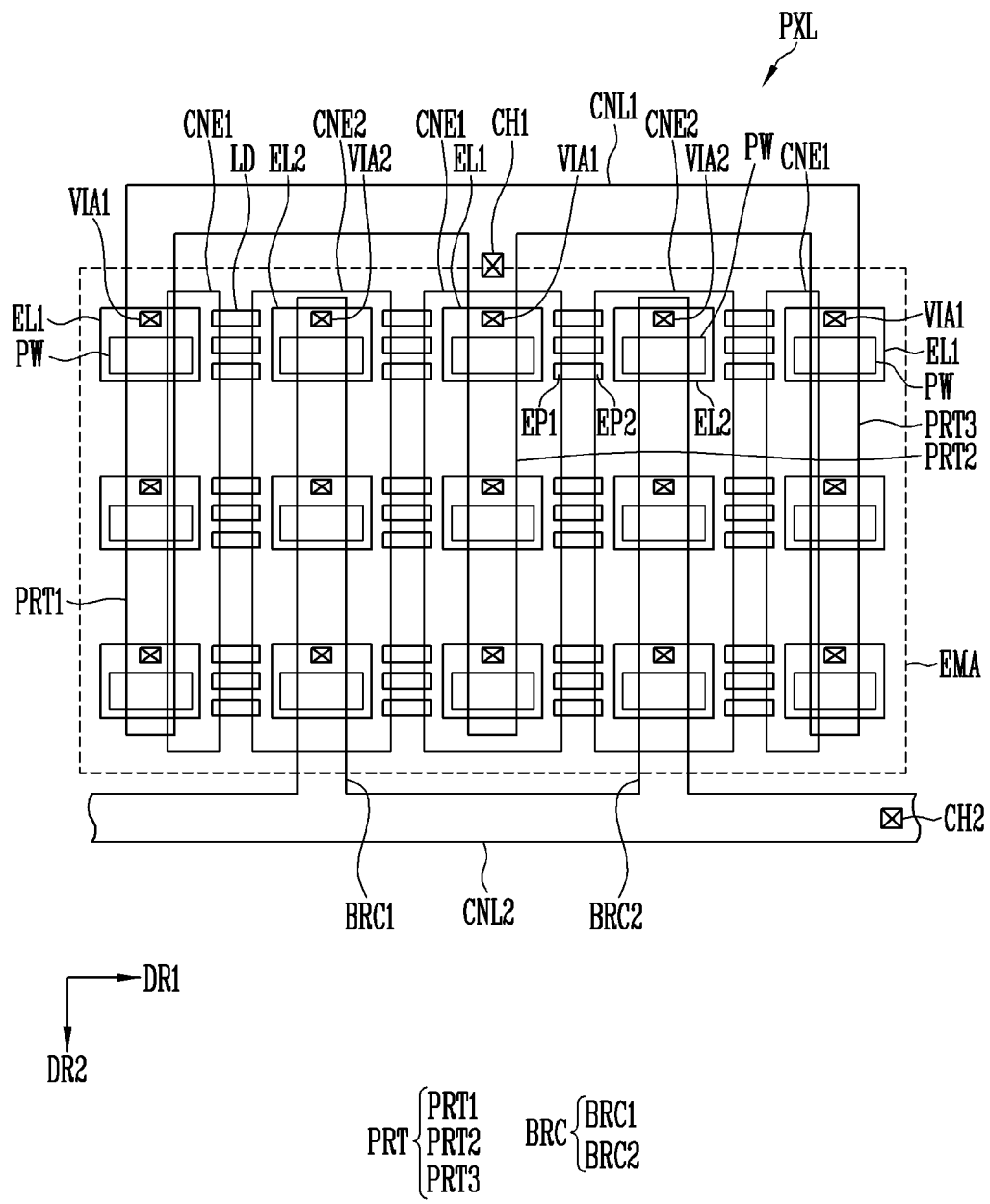

FIG. 4 is a plan view schematically illustrating one of the pixels shown in FIG. 2. FIG. 5 is a plan view schematically illustrating only some components in a pixel shown in FIG. 4. FIG. 6 is a schematic cross-sectional view taken along line I-I' of FIG. 4. FIG. 7 illustrates an embodiment in which capping layers are respectively disposed on a first electrode and a second electrode shown in FIG. 6, and is a schematic cross-sectional view corresponding to line I-I' of FIG. 4. FIG. 8 illustrates an embodiment in which the first and second electrodes shown in FIG. 6 are disposed on an identical layer, and is a sectional view corresponding to line I-I' of FIG. 4. FIG. 9 is a schematic cross-sectional view taken along line II-II' of FIG. 4. FIG. 10 illustrates another shape of a bank pattern illustrated in FIG. 9, and is a schematic cross-sectional view corresponding to line II-II' of FIG. 4. FIG. 11 is a schematic cross-sectional diagram taken along line of FIG. 4.

In FIGS. 4 and 5, for the sake of explanation, illustration of transistors electrically connected to the light emitting elements, and signal lines electrically connected to the transistors are omitted in FIG. 5.

Although FIGS. 4 to 11 simply illustrate the structure of a pixel, e.g., illustrating that each electrode is formed of a single electrode layer and each insulating layer is formed of a single insulating layer, the disclosure is not limited thereto.

In an embodiment, the words "components are provided and/or formed on the same layer" may mean that the components are formed by the same process.

Referring to FIGS. 1A to 11, the display device in accordance with an embodiment may include a substrate SUB, a line component, and pixels PXL.

Each of the pixels PXL may be provided on the substrates SUB, and include an emission area EMA which emits light, a peripheral area disposed around the emission area EMA. In an embodiment, the emission area EMA may mean an area from which light is emitted, and the peripheral area may refer to an area from which light is not emitted. The pixel area of each of the pixels PXL may include an emission area EMA of the corresponding pixel PXL, and a peripheral area formed therearound.

The substrate SUB, a pixel circuit layer PCL, and a display element layer DPL may be provided and/or formed in the pixel area of each of the pixels PXL.

The substrate SUB may include a transparent insulating material and thus allows light to pass therethrough. The substrate SUB may be a rigid substrate or a flexible substrate.

A material applied to the substrate SUB may have resistance (thermal resistance) to high treatment temperatures during a process of fabricating the display device.

The pixel circuit layer PCL of each of the pixels PXL may include a buffer layer BFL disposed on the substrate SUB, at least one transistor T disposed on the buffer layer BFL, a driving voltage line DVL, and a shielding electrode line SDL. Furthermore, the pixel circuit layer PCL of each of the pixels PXL may further include a passivation layer PSV.

The buffer layer BFL may prevent impurities from diffusing into the transistor T. The buffer layer BFL may be provided in a single layer structure or a multilayer structure having at least two or more layers. In case that the buffer layer BFL has a multi-layer structure, the respective layers may be formed of the same material or different materials.

The buffer layer BFL may be omitted depending on the material of the substrate SUB and/or processing conditions.

The transistor T may include a first transistor T1 and a second transistor T2. In an embodiment of the present disclosure, the first transistor T1 may be a driving transistor electrically connected to light emitting elements LD of a corresponding pixel PXL and configured to drive the light emitting elements LD. The second transistor T2 may be a switching transistor configured to switch the first transistor T1.

Each of the first transistor T1 and the second transistor T2 may include a semiconductor layer SCL, a gate electrode GE, a first terminal SE, and a second terminal DE. The first terminal SE may be either a source electrode or a drain electrode, and the second terminal DE may be the other electrode. For example, in case that the first terminal SE is the source electrode, the second terminal DE may be the drain electrode.

The semiconductor layer SCL may be disposed on the buffer layer BFL. The semiconductor layer SCL may include a first area which contacts the first terminal SE, and a second area which contacts the second terminal DE. An area between the first area and the second area may be a channel area.

The semiconductor layer SCL may be a semiconductor pattern formed of polysilicon, amorphous silicon, an oxide semiconductor, etc. The channel area may be an intrinsic semiconductor, which is an undoped semiconductor pattern. The first area and the second area each may be a semiconductor pattern doped with impurities.

The gate electrode GE may be provided on the semiconductor layer SCL with a gate insulating layer GI interposed therebetween.

The first terminal SE and the second terminal DE may respectively contact the first area and the second area of the semiconductor layer SCL through corresponding contact holes that pass through a first interlayer insulating layer ILD1 and the gate insulating layer GI.

In an embodiment, at least one transistor T included in the pixel circuit layer PCL of each of the pixels PXL may be formed of a low-temperature polycrystalline silicon (LTPS) thin-film transistor, but the present disclosure is not limited thereto. In some embodiments, the at least one transistor T may be formed of an oxide semiconductor thin-film transistor. Furthermore, in an embodiment of the disclosure, the transistor T is illustrated as being a thin film transistor having a top gate structure, but the disclosure is not limited thereto. In an embodiment, the transistor T may be a thin film transistor having a bottom gate structure.

The driving voltage line DVL may be provided and/or formed on the first interlayer insulating layer ILD1, but the disclosure is not limited thereto. In some embodiments, the driving voltage line DVL may be provided on any one of the insulating layers included in the pixel circuit layer PCL. The second driving power supply VSS (see FIG. 3A) may be applied to the driving voltage line DVL. In an embodiment, the driving voltage line DVL may be the second power supply line PL2 to which the second driving power supply VSS is applied, as illustrated in each of FIGS. 3A to 3C.

A second interlayer insulating layer ILD2 may be provided and/or formed on the driving voltage line DVL. The second interlayer insulating layer ILD2 may cover (or overlap) the first transistor T1, the second transistor T2, and the driving voltage line DVL. The second interlayer insulating layer ILD2 may be an inorganic insulating layer including an inorganic material or an organic insulating layer including an organic material.

A shielding electrode line SDL may be provided and/or formed on the second interlayer insulating layer ILD2. The shielding electrode line SDL may block an electric field induced from the first transistor T1 and the second transistor T2 so as to prevent the electric field from affecting alignment and/or operation of the light emitting elements LD provided on the display element layer DPL.

The passivation layer PSV may be provided and/or formed on the shielding electrode line SDL to cover (or overlap) the shielding electrode line SDL. The passivation layer PSV may be provided in the form of an organic insulating layer, an inorganic insulating layer, or a structure including the organic insulating layer disposed on the inorganic insulating layer. The inorganic insulating layer may include at least one of silicon oxide ($SiO_x$) and silicon nitride ($SiN_x$). The organic insulating layer may include an organic insulating material allowing light to pass therethrough. The organic insulating layer may include, for example, at least one of polyacrylates resin, epoxy resin, phenolic resin, polyamide resin, polyimide rein, unsaturated polyester resin, polyphenylene ether resin, polyphenylene sulfide resin, and benzocyclobutene resin.

In an embodiment, a predetermined area of the second terminal DE of the first transistor T1 may be exposed through a first contact hole CH1 that successively passes through the second interlayer insulating layer ILD2 and the passivation layer PSV. Furthermore, a predetermined area of the driving voltage line DVL may be exposed through a second contact hole CH2 that successively passes through the second interlayer insulating layer ILD2 and the passivation layer PSV.

The display element layer DPL of each of the pixels PXL may include first and second connection lines CNL1 and CNL2, a bank pattern PW, first electrodes ELL second electrodes EL2, light emitting elements LD, at least one sub-electrode PRT, and at least one branch electrode BRC. The display element layer DPL of each of the pixels PXL may selectively further include at least one first contact electrode CNE1 which is directly electrically connected to each of the first electrodes ELL and at least one second contact electrode CNE2 which is directly electrically connected to each of the second electrodes EL2.

The first connection line CNL1 may be provided and/or formed on the pixel circuit layer PCL of each of the pixels PXL. In detail, the first connection line CNL1 may be provided and/or formed on the passivation layer PSV of the pixel circuit layer PCL of each of the pixels PXL. The first connection line CNL1 may be provided and/or formed, to independently (or individually) drive each of the adjacent pixels PXL, in only the corresponding pixel PXL, and electrically and/or physically separated from the first connection line CNL1 provided and/or formed in each of the adjacent pixels PXL.

In an embodiment, the first connection line CNL1 may extend in a first direction DR1 (e.g., a "row direction") on the passivation layer PSV of the pixel circuit layer PCL of each of the pixels PXL. The first connection line CNL1 may be electrically and/or physically connected with at least one sub-electrode PRT.

The sub-electrode PRT may be provided and/or formed on the passivation layer PSV of the pixel circuit layer PCL of each of the pixels PXL. The sub-electrode PRT may include a first sub-electrode PRT1, a second sub-electrode PRT2, and a third sub-electrode PRT3 which extend in a second direction DR2 (e.g., a "column direction") intersecting the first direction DR1.

The first to third sub-electrodes PRT1 to PRT3 may be disposed at positions spaced apart from each other by a predetermined distance in an identical plane, e.g., on the passivation layer PSV of the pixel circuit layer PCL of each of the pixels PXL. In an embodiment, the first to third sub-electrodes PRT1 to PRT3 may diverge in the second direction DR2 from the first connection line CNL1 into the emission area EMA of each pixel PXL. The first to third sub-electrodes PRT1 to PRT3 and the first connection line CNL1 may be integral with each other and electrically and/or physically connected to each other. In case that the first to third sub-electrodes PRT1 to PRT3 and the first connection line CNL1 are integral with each other, each of the first to third sub-electrodes PRT1 to PRT3 may be a predetermined area of the first connection line CNL1, or the first connection line CNL1 may be a predetermined area of any one of the first to third sub-electrodes PRT1 to PRT3.

In a plan view, the first to third sub-electrodes PRT1 to PRT3 may be successively disposed in the first direction DR1. For example, in the emission area EMA of each of the pixels PXL, the second sub-electrode PRT2 may be disposed adjacent, in the first direction DR1, to the first sub-electrode PRT1, and the third sub-electrode PRT3 may be disposed adjacent, in the first direction DR1, to the second sub-electrode PRT2.

The second sub-electrode PRT2 may be electrically connected to the second terminal DE of the first transistor T1 of the pixel circuit layer PCL of each of the pixels PXL through the first contact hole CH1 that successively passes through the passivation layer PSV and the second interlayer insulating layer ILD2. Hence, a signal (or a voltage) applied to the first transistor T1 may be transmitted to the second sub-electrode PRT2 of the corresponding pixel PXL. A signal (or voltage) applied to the second sub-electrode PRT2 may be transmitted to the first connection line CNL1 and the first and third sub-electrode PRT1 and PRT3.

Although in the foregoing embodiment there has been described that the second sub-electrode PRT2 corresponds to the first contact hole CH1 and is electrically connected to the first transistor T1 of the pixel circuit layer PCL of each of the pixels PXL through the first contact hole CH1, the disclosure is not limited thereto. In an embodiment, any one of the first connection line CNL1, and the first and third sub-electrodes PRT1 and PTR3 may correspond to the first contact hole CH1 and be electrically connected to the first transistor T1 of the pixel circuit layer PCL of each of the pixels PXL through the first contact hole CH1.

The second connection line CNL2 may be provided and/or formed on the passivation layer PSV of the pixel circuit layer PCL of each of the pixels PXL. The second connection line CNL2 may extend in a direction parallel to a direction in which the first connection line CNL1 extends. In other words, the second connection line CNL2 may extend in the first direction DR1. The second connection line CNL2 may be provided in common to adjacent pixels PXL. Hence, pixels PXL disposed in the same pixel row in the first direction DR1 may be electrically connected in common to the second connection line CNL2. However, the disclosure is not limited thereto. After the light emitting elements LD are aligned in the emission area EMA of each pixel PXL, a portion of the second connection line CNL2 may be removed between adjacent pixels PXL so that each of the pixels PXL may be operated independently from adjacent pixels PXL.

The second connection line CNL2 may be electrically connected to the driving voltage line DVL of the pixel circuit layer PCL of each of the pixels PXL through the second contact hole CH2 that successively passes through the passivation layer PSV and the second interlayer insulating layer ILD2. As the second connection line CNL2 is electrically connected to the driving voltage line DVL, a second driving power supply VSS applied to the driving voltage line DVL may be transmitted to the second connection line CNL2 provided in common to pixels PXL that are disposed in an identical pixel row.

The second connection line CNL2 may be electrically and/or physically connected to a branch electrode BRC.

The branch electrode BRC may be provided and/or formed on the passivation layer PSV of the pixel circuit layer PCL of each of the pixels PXL. The branch electrode BRC may include a first branch electrode BRC1 and a second branch electrode BRC2 which diverge from the second connection line CNL2 into the respective emission areas EMA of the pixels PXL in the second direction DR2.

The first branch electrode BRC1 and the second branch electrode BRC2 may be disposed in the same plane and spaced apart from each other by a predetermined distance. The first and second branch electrodes BRC1 and BRC2 and the second connection line CNL2 may be integral with each other and electrically and/or physically connected to each other. In case that the first and second branch electrodes BRC1 and BRC2 and the second connection line CNL2 are integral with each other, each of the first and second branch electrodes BRC1 and BRC2 may be a predetermined area of the second connection line CNL2. Hence, the second driving power supply VSS transmitted to the second connection line CNL2 may be transmitted to each of the first and second branch electrodes BRC1 and BRC2.

The first and second branch electrodes BRC1 and BRC2 may be disposed at positions spaced apart from the first to third sub-electrodes PRT1 to PRT3 by a predetermined distance. In a plan view, the first and second branch electrodes BRC1 and BRC2 and the first to third sub-electrodes PRT1 to PRT3 may be alternately disposed in the first direction DR1. For example, in a plan view, the first sub-electrode PRT1 and the second sub-electrode PRT2 may be spaced apart from each other with the first branch electrode BRC1 interposed therebetween (or disposed at an intermediate position therebetween), and the second sub-electrode PRT2 and the third sub-electrode PRT3 may be spaced apart from each other with the second branch electrode BRC2 interposed therebetween (or disposed at an intermediate position therebetween).

The first connection line CNL1, the first to third sub-electrodes PRT1 to PRT3, the second connection line CNL2, and the first and second branch electrodes BRC1 and BRC2 may be provided and/or formed on an identical layer. In other words, the first connection line CNL1, the first to third sub-electrodes PRT1 to PRT3, the second connection line CNL2, and the first and second branch electrodes BRC1 and BRC2 may include identical material and be formed by an identical process.

The first connection line CNL1, the first to third sub-electrodes PRT1 to PRT3, the second connection line CNL2, and the first and second branch electrodes BRC1 and BRC2 may be formed of a conductive material. The conductive material may include metal, conductive oxide, a conductive polymer such as PEDOT, etc. The material of each of the first connection line CNL1, the first to third sub-electrodes PRT1 to PRT3, the second connection line CNL2, and the first and second branch electrodes BRC1 and BRC2 is not limited to the foregoing examples.

A first insulating layer INS1 may be disposed on the first connection line CNL1, the first to third sub-electrodes PRT1 to PRT3, the second connection line CNL2, and the first and second branch electrodes BRC1 and BRC2.

The first insulating layer INS1 may be an inorganic insulating layer including an inorganic material or an organic insulating layer including an organic material. The first insulating layer INS1 may protect the first connection line CNL1, the first to third sub-electrodes PRT1 to PRT3, the second connection line CNL2, and the first and second branch electrodes BRC1 and BRC2.

The first insulating layer INS1 may include first via holes VIA1 which expose respective predetermined areas of the first to third sub-electrodes PRT1 to PRT3 to the outside, and second via holes VIA2 which expose respective predetermined areas of the first and second branch electrodes BRC1 and BRC2.

In an embodiment, in a cross-sectional view, the first insulating layer INS1 may change in thickness in areas thereof overlapping with the first and second electrodes EL1 and EL2. However, the disclosure is not limited thereto. In an embodiment, the first insulating layer INS1 may have a constant thickness regardless of whether to the first insulating layer INS1 overlaps the first and second electrodes EL1 and EL2. Detailed description of an embodiment in which the thickness of the first insulating layer INS1 changes in areas thereof overlapping the first and second electrodes EL1 and EL2 will be made below in connection with the first and second electrodes EL1 and EL2.

The bank pattern PW may be a support or an insulating pattern which supports each of the first and second electrodes EL1 and EL2 so as to change a surface profile of each of the first and second electrodes EL1 and EL2 so that light emitted from the light emitting elements LD can more effectively travel in an image display direction of the display device.

The bank pattern PW may be provided and/or formed on the first insulating layer INS1 of the emission area EMA of each of the pixels PXL. The bank pattern PW may include an inorganic insulating layer formed of an inorganic material or an organic insulating layer formed of an organic material. In an embodiment, the bank pattern PW may include an organic insulating layer having a single layer structure and/or an inorganic insulating layer having a single layer structure, but the disclosure is not limited thereto. For example, the bank pattern PW may have a multi-layer structure formed by stacking at least one or more organic insulating layers and at least one or more inorganic insulating layers.

The bank pattern PW may have a trapezoidal cross-section in which the width thereof reduces from a surface of the first insulating layer INS1 upward, but the disclosure is not limited thereto. In an embodiment, the bank pattern PW may include a curved surface having a cross-section such as a semi-elliptical cross-section, a semi-circular cross-section, etc., in which the width thereof reduces from a surface of the first insulating layer INS1 upward, as illustrated in FIG. 10. In a cross-sectional view, the shape of the bank pattern PW is not limited to the foregoing examples, and may be changed in various ways as long as the efficiency of light emitted from each of the light emitting elements LD can be enhanced. The adjacent bank patterns PW may be disposed in a same plane on the passivation layer PSV and have the same height.

In an embodiment, the bank pattern PW may be provided and/or formed on the first insulating layer INS1 not to correspond to (or overlap) the first and second via holes VIA1 and VIA2 of the first insulating layer INS1.

The display element layer DPL of each of the pixels PXL may further include a bank (not illustrated) disposed, to enclose the emission area EMA of each pixel PXL, in the peripheral area (e.g., a non-emission area in which the light emitting elements LD are not disposed) of the corresponding pixel PXL. The bank may be a structure configured to define (or partition) each emission area EMA and, for example, may be a pixel defining layer. The bank may include at least one light shielding material and/or reflective material and thus prevent a defect, in which light (or rays) leaks between adjacent pixels PXL, from occurring.

In an embodiment, a reflective material layer may be formed on the bank so as to further enhance the efficiency of light emitted from each of the pixels PXL. Although the bank may be formed and/or provided on a layer different from that of the bank pattern PW, the disclosure is not limited thereto. In an embodiment, the bank and the bank pattern PW may be formed and/or provided on the same layer.

Each of the first and second electrodes EL1 and EL2 may be provided and/or formed on the bank pattern PW and the first insulating layer INS1 in the emission area EMA of each of the pixels PXL. The first electrodes EL1 and the second electrodes EL2 may be provided on an identical surface and spaced apart from each other by a predetermined distance. In a plan view, one of the first electrodes EL1 and one of the second electrodes EL2 may be disposed in an identical row. In a plan view, based on row in the emission area EMA of each of the pixels PXL, the first electrodes EL1 and the second electrodes EL2 may be alternately disposed in the first direction DR1.

The first electrodes EL1 may be disposed in the second direction DR2. Each of the first electrodes EL1 may be spaced apart from an adjacent first electrode EL1 in the second direction DR2. In other words, each of the first electrodes EL1 may be electrically and/or physically separated from an adjacent first electrode EL1 in the second direction DR2. Each of the first electrodes EL1 may have a surface profile corresponding to a shape of the bank pattern PW disposed therebelow. For example, in a cross-sectional view, the bank pattern PW has a curved-shape or protruding shape in which the width thereof is reduced upward from a surface of the first insulating layer INS1. Hence, each of the first electrodes EL1 disposed over the bank pattern PW may have a surface profile corresponding to the protruding shape.

Each of the first electrodes EL1 may have a large surface area sufficient to completely cover (or overlap) the corresponding bank pattern PW and the corresponding first via hole VIA1. Although, in an embodiment of the disclosure, each of the first electrodes EL1 may have a rectangular shape in a plan view, the disclosure is not limited thereto. In an embodiment, the shape of the first electrodes EL1 may be changed in various ways.

In an embodiment, the first electrodes EL1 may be disposed on the sub-electrode PRT and overlap the sub-electrode PRT. For example, some of the first electrodes EL1 may be disposed on the first sub-electrode PRT1 and overlap the first sub-electrode PRT1, some of the first electrodes EL1 may be disposed on the second sub-electrode PRT2 and overlap the second sub-electrode PRT2, and the other first electrodes EL1 may be disposed on the third sub-electrode PRT3 and overlap the third sub-electrode PRT3. In the following embodiment, the first electrodes EL1 that are disposed on the first sub-electrode PRT1 will be referred to as 1-1-th electrodes ELL the first electrodes EL1 that are disposed on the second sub-electrode PRT2 will be referred to as 1-2-th electrodes ELL and the first electrodes EL1 that are disposed on the third sub-electrode PRT3 will be referred to as 1-3-th electrodes EL1.

In a plan view, the 1-1-th electrodes EL1 may be disposed over the first sub-electrode PRT1 in an extension direction of the first sub-electrode PRT1 and overlap the first sub-electrode PRT1. In a cross-sectional view, the 1-1-th electrodes EL1 may be disposed on the first sub-electrode PRT1 with the first insulating layer INS1 and the bank pattern PW interposed therebetween. Each of the 1-1-th electrodes EL1 may be electrically and/or physically connected with the first sub-electrode PRT1 disposed therebelow through the corresponding first via hole VIA1 that passes through the first insulating layer INS1. Therefore, a signal (or a voltage) applied to the first sub-electrode PRT1 may be transmitted to the 1-1-th electrodes EL1.

In a plan view, the 1-2-th electrodes EL1 may be disposed over the second sub-electrode PRT2 in an extension direction of the second sub-electrode PRT2, and overlap the second sub-electrode PRT2. In a cross-sectional view, the 1-2-th electrodes EL1 may be disposed on the second sub-electrode PRT2 with the first insulating layer INS1 and the bank pattern PW interposed therebetween. Each of the 1-2-th electrodes EL1 may be electrically and/or physically connected with the second sub-electrode PRT2 disposed therebelow through the corresponding first via hole VIA1 that passes through the first insulating layer INS1. Therefore, a signal (or a voltage) applied to the second sub-electrode PRT2 may be transmitted to the 1-2-th electrodes EL1.

In a plan view, the 1-3-th electrodes EL1 may be disposed over the third sub-electrode PRT3 in an extension direction of the third sub-electrode PRT3, and overlap the third sub-electrode PRT3. In a cross-sectional view, the 1-3-th electrodes EL1 may be disposed on the third sub-electrode PRT3 with the first insulating layer INS1 interposed therebetween. Each of the 1-3-th electrodes EL1 may be electrically and/or physically connected with the third sub-electrode PRT3 disposed therebelow through the corresponding first via hole VIA1 that passes through the first insulating layer INS1. Therefore, a signal (or a voltage) applied to the third sub-electrode PRT3 may be transmitted to the 1-3-th electrodes EL1.

As described above, each of the first electrodes EL1 may be electrically and/or physically connected with the corresponding sub-electrode PRT through a corresponding first via hole VIA1 of the first via holes VIA1 passing through the first insulating layer INS1. Although, in the foregoing embodiment, there has been described that each of the first electrodes EL1 is electrically and/or physically connected with the corresponding sub-electrode PRT through a first via hole VIAL the disclosure is not limited thereto. In an embodiment, each of the first electrodes EL1 may be electrically and/or physically connected with the corresponding sub-electrode PRT through at least one or more first via holes VIA1.

In an embodiment, each of the first to third sub-electrodes PRT1 to PRT3 may be divided into a first area A which overlaps each of the first electrodes ELL and a second area B other than the first area A. Here, the second area B may refer to a portion in which each of the first to third sub-electrodes PRT1 to PRT3 does not overlap the first electrodes EL1.

A thickness d1 of the first insulating layer INS1 that corresponds to the first area A of each of the first to third sub-electrodes PRT1 to PRT3 may differ from a thickness d2 of the first insulating layer INS1 that corresponds to the second area B of each of the first to third sub-electrodes PRT1 to PRT3.

In an embodiment, the thickness d1 of the first insulating layer INS1 that corresponds to the first area A of each of the first to third sub-electrodes PRT1 to PRT3 may be less than the thickness d2 of the first insulating layer INS1 that corresponds to the second area B of each of the first to third sub-electrodes PRT1 to PRT3. In other words, the first insulating layer INS1 that corresponds to the second area B of each of the first to third sub-electrodes PRT1 to PRT3 may be designed to have a thickness greater than that of the first insulating layer INS1 that corresponds to the first area A of each of the first to third sub-electrodes PRT1 to PRT3.

The second electrodes EL2 may be disposed in the second direction DR2. Each of the second electrodes EL2 may be spaced apart from an adjacent second electrode EL2 in the second direction DR2. In other words, each of the second electrodes EL2 may be electrically and/or physically separated from an adjacent second electrode EL2 in the second direction DR2. Each of the second electrodes EL2 may have a surface profile corresponding to a shape of the bank pattern PW disposed therebelow. For example, in a cross-sectional view, the bank pattern PW has a protruding shape in which the width thereof reduces upward from a surface of the first insulating layer INS1. Hence, each of the second electrodes EL2 disposed on the bank pattern PW may have a surface profile corresponding to the protruding shape.

Each of the second electrodes EL2 may have a large surface area sufficient to completely cover (or overlap) the corresponding bank pattern PW and the corresponding second via hole VIA2. Although, in an embodiment of the disclosure, each of the second electrodes EL2 may have a rectangular shape in a plan view, the present disclosure is not limited thereto. In an embodiment, the shape of the second electrodes EL2 may be changed in various ways. Furthermore, the second electrode EL2 may have a shape identical to that of the first electrode ELL but the disclosure is not limited thereto. In an embodiment, the second electrodes EL2 may have a shape different from that of the first electrode EL1. In addition, the second electrodes EL2 may have a size (or a surface area) identical to that of the first electrodes ELL but the disclosure is not limited thereto. The second electrodes EL2 may have a size (or a surface area) different from that of the first electrodes EL1.

In an embodiment of the disclosure, the second electrodes EL2 may be disposed on the branch electrode BRC and overlap the branch electrode BRC. For example, some of the second electrodes EL2 may be disposed on the first branch electrode BRC1 and overlap the first branch electrode BRC1, and the other second electrodes EL2 may be disposed on the second branch electrode BRC2 and overlap the second branch electrode BRC2. In the following embodiment, the second electrodes EL2 disposed on the first branch electrode BRC1 will be referred to as 2-1-th electrodes EL2, and the second electrodes EL2 disposed on the second branch electrode BRC2 will be referred to as 2-2-th electrodes EL2.

In a plan view, the 2-1-th electrodes EL2 may be disposed over the first branch electrode BRC1 in an extension direction of the first branch electrode BRC1 and overlap the first branch electrode BRC1. In a cross-sectional view, the 2-1-th electrodes EL2 may be disposed on the first branch electrode BRC1 with the first insulating layer INS1 interposed therebetween. Each of the 2-1-th electrodes EL2 may be electrically and/or physically connected with the first branch electrode BRC1 disposed therebelow through the second via hole VIA2 that passes through the first insulating layer INS1. Hence, the second driving power supply VSS applied to the first branch electrode BRC1 may be transmitted to the 2-1-th electrodes EL2.

In a plan view, the 2-2-th electrodes EL2 may be disposed over the second branch electrode BRC2 in an extension direction of the second branch electrode BRC2 and overlap the second branch electrode BRC2. In a cross-sectional view, the 2-2-th electrodes EL2 may be disposed on the second branch electrode BRC2 with the first insulating layer INS1 interposed therebetween. Each of the 2-2-th electrodes EL2 may be electrically and/or physically connected with the second branch electrode BRC2 disposed therebelow through the second via hole VIA2 that passes through the first insulating layer INS1. Hence, the second driving power supply VSS applied to the second branch electrode BRC2 may be transmitted to the 2-2-th electrodes EL2.

As described above, each of the second electrodes EL2 may be electrically and/or physically connected with the corresponding branch electrode BRC through a corresponding second via hole VIA2 passing through the second via holes VIA2 of the first insulating layer INS1. Although, in the foregoing embodiment, there has been described that each of the second electrodes EL2 is electrically and/or physically connected with the corresponding branch electrode BRC through a second via hole VIA2, the disclosure is not limited thereto. In an embodiment, each of the second electrodes EL2 may be electrically and/or physically connected with the corresponding branch electrode BRC through at least one or more second via holes VIA2.

In an embodiment, each of the first and second sub-electrodes BRC1 and BRC2 may be divided into a third area C which overlaps each of the second electrodes EL2, and a fourth area D other than the third area C. Here, the fourth area D may refer to a portion in which each of the first and second branch electrodes BRC1 and BRC2 does not overlap the second electrodes EL2.

A thickness d1 of the first insulating layer INS1 that corresponds to the third area C of each of the first and second branch electrodes BRC1 and BRC2 may differ from a thickness d2 of the first insulating layer INS1 that corresponds to the fourth area D of each of the first and second branch electrodes BRC1 and BRC2.

In an embodiment of the disclosure, the thickness d1 of the first insulating layer INS1 that corresponds to the third area C of each of the first and second branch electrodes BRC1 and BRC2 may be less than the thickness d2 of the first insulating layer INS1 that corresponds to the fourth area D of each of the first and second branch electrodes BRC1 and BRC2. In other words, the first insulating layer INS1 that corresponds to the fourth area D of each of the first and second branch electrodes BRC1 and BRC2 may be designed to have a thickness greater than that of the first insulating layer INS1 that corresponds to the third area C of each of the first and second branch electrodes BRC1 and BRC2. The reason for this is to prevent light emitting elements LD from being aligned in an area between the fourth area D of each of the first and second branch electrodes BRC1 and BRC2 and the second area B of each of the first to third sub-electrodes PRT1 to PRT3 by reducing the intensity of an electric field formed between the first and second branch electrodes BRC1 and BRC2 and the first to third sub-electrodes PRT1 to PRT3. In other words, the reason why the first insulating layer INS1 is designed to have different thicknesses by areas is to prevent the light emitting elements LD from being aligned in areas other than a target area (e.g., an area between the first and second electrodes EL1 and EL2) in the emission area EMA of each of the pixels PXL.

Although in the foregoing embodiment there has been described that the first insulating layer INS1 has different thicknesses by areas, the disclosure is not limited thereto. In an embodiment, the first insulating layer INS1 may have a constant thickness regardless of areas.

In an embodiment, the first to third sub-electrodes PRT1 to PRT3 and the first and second branch electrodes BRC1 and BRC2 may function as alignment voltage application electrodes for transmitting alignment voltages to the first and second electrodes EL1 and EL2. The first electrodes EL1 and the second electrodes EL2 may function as alignment electrodes for aligning light emitting elements LD in the emission area EMA of each of the pixels PXL.

Before the light emitting elements LD are aligned in the emission area EMA of each of the pixels PXL, a first alignment voltage may be applied to the first to third sub-electrodes PRT1 to PRT3 through the first connection line CNL1, and a second alignment voltage may be applied to the first and second branch electrodes BRC1 and BRC2 through the second connection line CNL2.

In case that a first alignment voltage is applied to each of the first to third sub-electrodes PRT1 to PRT3, the first alignment voltage may be applied to each of the first electrodes EL1 through the first via holes VIA1 passing through the first insulating layer INS1. In case that a second alignment voltage is applied to each of the first and second branch electrodes BRC1 and BRC2, the second alignment voltage may be applied to each of the second electrodes EL2 through the second via holes VIA2 of the first insulating layer INS1. The first alignment voltage and the second alignment voltage may have different voltage levels. For example, the first alignment voltage may be a ground voltage, and the second alignment voltage may be an alternating current voltage.

As predetermined alignment voltages having different voltage levels are respectively applied to the first electrodes EL1 and the second electrodes EL2, the light emitting elements LD may be aligned between at least one of the first electrodes EL1 and at least one of the second electrodes EL2.

After the light emitting elements LD are aligned in the emission area EMA of each of the pixels PXL, each of the first electrodes EL1 and the second electrodes EL2 may function as a driving electrode for driving the light emitting elements LD.

Each of the first electrodes EL1 and each of the second electrodes EL2 may be made of a material having a predetermined reflectivity to allow light emitted from the opposite ends (or first and second ends) EP1 and EP2 of each of the light emitting elements LD to travel in an image display direction (e.g., in a frontal direction) of the display device. In an embodiment of the disclosure, the first electrodes EL1 and the second electrodes EL2 may have an identical material and be formed of an identical process. In other words, the first and second electrodes EL1 and EL2 may be provided on an identical layer.

The first and second electrodes EL1 and EL2 may be made of a conductive material having a predetermined reflectivity. The conductive material may include metal such as Ag, Mg, Al, Pt, Pd, Au, Ni, Nd, Ir, Cr, Ti, or an alloy thereof, a conductive oxide such as an indium tin oxide (ITO), an indium zinc oxide (IZO), a zinc oxide (ZnO), or an indium tin zinc oxide (ITZO), and a conductive polymer such as PEDOT. In case that the first and second electrodes EL1 and EL2 are formed of a transparent conductive oxide and a conductive polymer, a separate reflective conductive layer formed of an opaque metal may be provided to reflect light emitted by the light emitting elements LD. The material of each of the first and second electrodes EL1 and EL2 is not limited to the foregoing materials. Furthermore, in an embodiment, the first and second electrodes EL1 and EL2 may be formed of material identical to that of the first and second connection lines CNL1 and CNL2.

Each of the first and second electrodes EL1 and EL2 may be formed of a single layer, but the disclosure is not limited thereto. In an embodiment, the first and second electrodes EL1 and EL2 may be formed in a multi-layer structure formed by stacking two or more materials among metals, alloys, conductive oxides, and conductive polymers. Each of the first and second electrodes EL1 and EL2 may be formed of a multi-layer structure including at least two layers to minimize distortion resulting from a signal delay in case that signals (or voltages) are transmitted to opposite ends EP1 and EP2 of each of the light emitting elements LD. For example, each of the first and second electrodes EL1 and EL2 may be formed of a multi-layer structure in which layers are stacked in a sequence of ITO/Ag/ITO.

As described above, since each of the first and second electrodes EL1 and EL2 has a surface profile corresponding to the shape of the bank pattern PW disposed therebelow, light emitted from the opposite ends EP1 and EP2 of each of the light emitting elements LD may be reflected by the first and second electrodes EL1 and EL2 and more effectively travel in the image display direction of the display device. Consequently, the efficiency of light emitted from each of the light emitting elements LD may be further enhanced.

In an embodiment of the disclosure, the bank pattern PW and the first and second electrodes EL1 and EL2 may function as a reflective component configured to guide light emitted from the light emitting elements LD in a desired direction and thus enhance the light efficiency of the display device. In other words, the bank pattern PW and the first and second electrodes EL1 and EL2 may function as reflective components configured to enable light emitted from the light emitting elements LD to travel in the image display direction of the display device, thereby enhancing the light output efficiency of the light emitting elements LD.

One of the first electrodes EL1 and the second electrodes EL2 may be an anode electrode, and the other may be a cathode electrode. In an embodiment of the disclosure, the first electrodes EL1 may be anode electrodes, and the second electrodes EL2 may be cathode electrodes.

Each of the light emitting elements LD may be formed of a light emitting diode which is made of a material having an inorganic crystal structure and has a subminiature size, e.g., corresponding to a nanoscale or microscale size. The light emitting elements LD may be aligned between at least one of the first electrodes EL1 and at least one of the second electrodes EL2 in each of the pixels PXL.

Although at least two to several tens of light emitting elements LD may be aligned in the emission area EMA of each of the pixels PXL, the number of light emitting elements LD aligned in the emission area EMA of each pixel PXL may be changed without restriction depending on embodiments.

Each of the light emitting elements LD may include a cylindrical light emitting element LD fabricated by an etching method, as illustrated in FIGS. 1A, 1C, and 1E, or a light emitting element LD that has a core-shell structure and is fabricated by a growth method, as illustrated in FIG. 1G.

In case that each of the light emitting elements LD is a cylindrical light emitting element LD, each light emitting element LD may include an emission stack (or a stacked pattern) formed by successively stacking a first conductive semiconductor layer 11, an active layer 12, a second conductive semiconductor layer 13, and an electrode layer 15 in the longitudinal direction (L) of the light emitting element LD. In case that each of the light emitting elements LD is a light emitting element LD having a core-shell structure, each light emitting element LD may include an emission pattern 10 having a first conductive semiconductor layer 11 disposed in a central portion of the light emitting element LD, an active layer 12 which encloses at least one side of the first conductive semiconductor layer 11, a second conductive semiconductor layer 13 which encloses at least one side of the active layer 12, and an electrode layer 15 which encloses at least one side of the second conductive semiconductor layer 13.

Each of the light emitting elements LD may include a first end EP1 and a second end EP2. One of the first conductive semiconductor layer 11 and the second conductive semiconductor layer 13 may be disposed on the first end EP1 of each of the light emitting elements LD, and the other of the first conductive semiconductor layer 11 and the second conductive semiconductor layer 13 may be disposed on the second end EP2 of each of the light emitting element LD. Each of the light emitting elements LD may emit color light or white light.

The light emitting elements LD may be aligned between at least one of the first electrodes EL1 and at least one of the second electrodes EL2 by an electric field formed between the first electrodes EL1 and the second electrodes EL2 in the emission area EMA of each of the pixels PXL.

In detail, the light emitting elements LD may be input into the emission area EMA of each of the pixels PXL by spraying and/or applying a fluidic solvent mixed with light emitting elements LD by an inkjet printing method or the like after the electric field has been formed between the first electrodes EL1 and the second electrodes EL2. In an embodiment, the solvent may be one or more of acetone, water, alcohol, and toluene, but the disclosure is not limited thereto. For example, the solvent may include a material which may be vaporized at room temperature or by heat. Furthermore, the solvent may have the form of ink or paste. A method of spraying and/or applying the light emitting elements LD is not limited to that of the foregoing embodiment. The method of spraying and/or applying the light emitting elements LD may be changed in various ways. After the light emitting elements LD have been input into the emission area EMA of each of the pixels PXL, the solvent may be removed.

In case that the light emitting elements LD are input into the emission area EMA of each of the pixels PXL, self-alignment of the light emitting elements LD may be induced by the electric field formed between the first electrodes EL1 and the second electrodes EL2. Hence, the light emitting elements LD may be aligned between the first electrodes EL1 and the second electrodes EL2. In other words, the light emitting elements LD may be aligned in only a target area, e.g., an area between at least one of the first electrodes EL1 and at least one of the second electrodes EL2 in the emission area EMA of each of the pixels PXL.

One end of the first and second ends EP1 and EP2 of each of the light emitting elements LD may be electrically connected to at least one of the first electrodes ELL and the other thereof may be electrically connected to at least one of the second electrodes EL2. Hence, a signal (or voltage) of the first transistor T1 of the pixel circuit layer PCL of each of the pixels PXL may be applied to one of the opposite ends EP1 and EP2 of each of the light emitting elements LD via the first electrodes EL1 The second driving power supply VSS of the driving voltage line DVL may be applied to the other end via the second electrodes EL2.

The light emitting elements LD may form a light source of each of the pixels PXL. For example, if driving current flows through each of the pixels PXL during each frame period, the light emitting elements LD electrically connected to the first and second electrodes EL1 and EL2 of each pixel PXL may emit light having a luminance corresponding to the driving current.

The above-mentioned light emitting elements LD may be aligned on a second insulating layer INS2 in the emission area EMA of each of the pixels PXL.

The second insulating layer INS2 may be formed and/or provided under each of the light emitting elements LD between the first electrodes EL1 and the second electrodes EL2 in the emission area EMA of each of the pixels PXL. The second insulating layer INS2 may fill space between each of the light emitting elements LD and the first insulating layer INS1, thereby stably supporting the light emitting elements LD and preventing the light emitting elements LD from being removed from the first insulating layer INS1.

In the emission area EMA of each of the pixels PXL, the second insulating layer INS2 may expose a predetermined area of each of the first electrodes EL1 and cover (or overlap) a remaining area of each of the first electrodes EL1 other than the exposed predetermined area to protect the remaining area of each of the first electrodes EL1 Furthermore, the second insulating layer INS2 may expose a predetermined area of each of the second electrodes EL2, and cover a remaining area of each of the second electrodes EL2 other than the exposed predetermined area to protect the remaining area of each of the second electrodes EL2. The second insulating layer INS2 may be provided and/or formed on the first insulating layer INS1 in the peripheral area of each of the pixels PXL and thus protect components, e.g., the first and second connection lines CNL1 and CNL2, disposed in the peripheral area.

The second insulating layer INS2 may be formed of an inorganic insulating layer including an inorganic material or an organic insulating layer including an organic material. Although in an embodiment of the disclosure the second insulating layer INS2 may be formed of an inorganic insulating layer having an advantage in protecting the light emitting elements LD from the pixel circuit layer PCL of each of the pixels PXL, the disclosure is not limited thereto. In an embodiment, the second insulating layer INS2 may be formed of an organic insulating layer that has an advantage in planarization of support surfaces of the light emitting elements LD.

A third insulating layer INS3 may be provided and/or formed on the light emitting elements LD. The third insulating layer INS3 may be provided and/or formed on each of the light emitting elements LD to cover (or overlap) a portion of an upper surface of each of the light emitting elements LD and expose the opposite ends EP1 and EP2 of each of the light emitting elements LD to the outside. The third insulating layer INS3 may be formed in an independent pattern in the emission area EMA of each of the pixels PXL, but the disclosure is not limited thereto. In an embodiment, the third insulating layer INS3 may be omitted. In this case, the first contact electrode CNE1 may contact one of the opposite ends EP1 and EP2 of each of the light emitting elements LD. The second contact electrode CNE2 may contact the other of the opposite ends EP1 and EP2 of each of the light emitting elements LD. Here, the first contact electrode CNE1 and the second contact electrode CNE2 may be electrically disconnected from each other.

The third insulating layer INS3 may be formed of a single layer or multi-layer, and include an inorganic insulating layer including at least one inorganic material or an organic insulating layer including at least one organic material. The third insulating layer INS3 may affix in place each of the light emitting elements LD aligned in the emission area EMA of each of the pixels PXL. In an embodiment of the disclosure, the third insulating layer INS3 may include an inorganic insulating layer that has an advantage in protecting the active layer 12 of each of the light emitting elements LD from external oxygen, water, etc. However, the disclosure is not limited thereto. The third insulating layer INS3 may be formed of an organic insulating layer including an organic material, depending on design conditions, etc. of the display device to which the light emitting elements LD are applied.

In an embodiment of the disclosure, after the alignment of the light emitting elements LD in the emission area EMA of each of the pixels PXL have been completed, the third insulating layer INS3 is formed on the light emitting elements LD so that the light emitting elements LD may be prevented from being removed from the aligned position. If space (or a gap) is present between the second insulating layer INS2 and the light emitting elements LD before the third insulating layer INS3 is formed, the space (or the gap) may be filled with the third insulating layer INS3 during a process of forming the third insulating layer INS3. Consequently, the light emitting elements LD may be stably supported. In case that, the third insulating layer INS3 may be formed of an organic insulating layer which has an advantage in filling the space (or the gap) between the second insulating layer INS2 and the light emitting elements LD with the third insulating layer INS3.

In an embodiment of the disclosure, the third insulating layer INS3 may be formed on each of the light emitting elements LD so that the active layer 12 of each light emitting element LD may be prevented from contacting an external conductive material. The third insulating layer INS3 may cover (or overlap) only a portion of the upper surface of each of the light emitting elements LD such that the opposite ends EP1 and EP2 of each of the light emitting elements LD may be exposed to the outside.

In an embodiment of the disclosure, after the light emitting elements LD are aligned in the emission area EMA of each of the pixels PXL, the first connection line CNL1 may be separated between adjacent pixels PXL during a process of forming the second and third insulating layers INS2 and INS3. A portion of the first connection line CNL1 that is provided in common in the pixels PXL disposed in an identical row may be removed between adjacent pixels PXL by a method such as a laser cutting method or an etching method for removing a portion of a conductive layer, so that each pixel PXL may be driven individually (or independently) from the adjacent pixel PXL.

As described above, after the light emitting elements LD are aligned in the emission area EMA of each of the pixels PXL, the first connection line CNL1 of each pixel PXL may be electrically connected to the pixel circuit 144 of the corresponding pixel PXL so that a first driving power supply VDD passing through the pixel circuit 144 may be transmitted to the first electrodes EL1, whereby the light emitting elements LD can be driven.

The first contact electrode CNE1 may be provided on the first electrodes EL1 of each of the pixels PXL to electrically and/or physically reliably connect each of the first electrodes EL1 with one of the opposite ends EP1 and EP2 of each of the light emitting elements LD. The second contact electrode CNE2 may be provided on the second electrodes EL2 of each of the pixels PXL to electrically and/or physically reliably connect each of the second electrodes EL2 with the other of the opposite ends EP1 and EP2 of each of the light emitting elements LD.

Each of the first and second contact electrodes CNE1 and CNE2 may be formed of various transparent conductive materials. For example, each of the first and second contact electrodes CNE1 and CNE2 may be formed of a transparent conductive material for minimizing loss of light that is emitted from each of the light emitting elements LD and reflected in the image display direction of the display device by the corresponding electrode. The transparent conductive material may include at least one of various conductive materials, e.g., ITO, IZO, and ITZO, and may be substantially transparent or semi-transparent to satisfy a predetermined transmittance.

Each of the first and second contact electrodes CNE1 and CNE2 may have a bar shape extending in the second direction DR2. The first contact electrode CNE1 may partially overlap one of the opposite ends EP1 and EP2 of each of the light emitting elements LD. The second contact electrode CNE2 may partially overlap the other of the opposite ends EP1 and EP2 of each of the light emitting elements LD.

In an embodiment, the first and second contact electrodes CNE1 and CNE2 may be provided on respective different layers. In this case, the first contact electrode CNE1 may be provided and/or formed on the third insulating layer INS3 and covered with a fourth insulating layer INS4. Furthermore, the second contact electrode CNE2 may be provided and/or formed on the fourth insulating layer INS4 and covered with a fifth insulating layer INS5. The fourth and fifth insulating layers INS4 and INS5 may be formed of any of an inorganic insulating layer including an inorganic material and an organic insulating layer including an organic material. An overcoat layer OC may be provided and/or formed on the fifth insulating layer INS5.

Although in the foregoing embodiment there has been described that the first and second contact electrodes CNE1 and CNE2 are provided and/or formed on respective different layers, the disclosure is not limited thereto. In an embodiment, the first and second contact electrodes CNE1 and CNE2 may be provided and/or formed on an identical layer, as illustrated in FIG. 8. In this case, the first contact electrode CNE1 and the second contact electrode CNE2 may be spaced apart from each other by a predetermined distance on the third insulating layer INS3 and thus electrically and physically separated from each other, and may be covered (or overlapped) with the fourth insulating layer INS4. The overcoat layer OC may be provided and/or formed on the fourth insulating layer INS4. Here, the fourth insulating layer INS4 may correspond to the fifth insulating layer INS5 in case that the first and second contact electrodes CNE1 and CNE2 are provided and/or formed on respective different layers.

The overcoat layer OC may be an encapsulation layer configured to mitigate step differences (or height differences) formed by the bank pattern PW, the first to third sub-electrodes PRT1 to PRT3, the first and second branch electrodes BRC1 and BRC2, the first and second electrodes EL1 and EL2, the first and second contact electrodes CNE1 and CNE2, etc. and prevent oxygen or water from permeating the light emitting elements LD. In an embodiment, the overcoat layer OC may be omitted taking into design conditions, etc. of the display device.

As described above, predetermined voltages are applied to the opposite ends EP1 and EP2 of each of the light emitting elements LD through the first electrodes EL1 and the second electrodes EL2 so that each of the light emitting elements LD may emit light by coupling of electron-hole pairs in the active layer 12 of each of the light emitting elements LD. Each of the light emitting elements LD may emit light having a wavelength band, e.g., ranging from about 400 nm to about 900 nm.

In an embodiment, in the emission area EMA of each of the pixels PXL, the capping layer CPL may be provided and/or formed, as illustrated in FIG. 7.

In a plan view, the capping layer CPL may be respectively disposed between each of the first electrodes EL1 and the first contact electrode CNE1 and between each of the second electrodes EL2 and the second contact electrode CNE2.

The capping layer CPL may prevent the corresponding first and second electrodes EL1 and EL2 from being damaged by defects, etc. caused during a process of fabricating the display device, and reinforce adhesive force between the corresponding first and second electrodes EL1 and EL2 and the first insulating layer INS1. The capping layer CPL may be formed of a transparent conductive material such as indium zinc oxide (IZO) to minimize loss of light emitted from each of the light emitting elements LD and reflected by the corresponding first and second electrodes EL1 and EP2 in the image display direction of the display device.

In an embodiment of the disclosure, each of the first electrodes EL1 may have a width greater (or larger) than that of the sub-electrode PRT in a direction, e.g., in the first direction DR1 to fully cover (or overlap) a corresponding sub-electrode PRT disposed under each of the first electrode EL1. Each of the second electrodes EL2 may have a width greater (or larger) than that of a corresponding branch electrode BRC in a direction, e.g., in the first direction DR1 to fully cover the corresponding branch electrode BRC disposed under the second electrode EL2. In case that each of the first and second electrodes EL1 and EL2 has a great (or large) width in a direction, a width W1 between at least one first electrode EL1 and at least one second electrode EL2 that are disposed in an identical row in the emission area EMA of each of the pixels PXL may be reduced.

Here, if corresponding alignment voltages are respectively applied to the first to third sub-electrodes PRT1 to PRT3 and the first and second branch electrodes BRC1 and BRC2 through the first and second connection lines CNL1 and CNL2, an electric field may be formed in each of areas between the first and second electrodes EL1 and EL2, between the first sub-electrode PRT1 and the first branch electrode BRC1, between the first branch electrode BRC1 and the second sub-electrode PRT2, between the second sub-electrode PRT2 and the second branch electrode BRC2, and between the second branch electrode BRC2 and the third sub-electrode PRT3.

In an embodiment of the disclosure, an electric field having an intensity greater than that of an electric field formed between at least one sub-electrode PRT and at least one branch electrode BRC may be formed between at least one of the first electrodes EL1 and at least one second electrode EL2 disposed in a row identical to that of the at least one first electrode ELL The reason for this is because of the fact that the width W1 between at least one first electrode EL1 and at least one second electrode EL2 that are disposed in an identical row is less (or smaller) than a width W2 between at least one sub-electrode PRT and at least one branch electrode BRC.

Furthermore, although the first insulating layer INS1 and the second insulating layer INS2 are successively stacked on at least one sub-electrode PRT and at least one branch electrode BRC, only the second insulating layer INS2 is provided on the first electrodes EL1 and the second electrodes EL2, so that the intensity of an electric field formed between the first electrodes EL1 and the second electrodes EL2 may be relatively increased.

In case that light emitting elements LD are input to the emission area EMA of each of the pixels PXL, the light emitting elements LD may be intensively aligned between at least one first electrode EL1 and at least one second electrode EL2 between which an electric field having a relatively high intensity is formed. In other words, in the emission area EMA of each of the pixels PXL, the light emitting elements LD may be intensively aligned only in an area where an electric field having a relatively high intensity is formed, rather than being aligned in an area where an electric field having a relatively low intensity is formed. Consequently, in the emission area EMA of each of the pixels PXL, the light emitting elements LD may be intensively aligned in only a target area, e.g., an area between the first electrodes EL1 and the second electrodes EL2. Therefore, alignment distributions of the light emitting elements LD by pixels PXL may become uniform, so that the intensities (or the amounts) of light emitted from the emission areas EMA of the respective pixels PXL may be substantially identical or similar to each other. Hence, the display device in an embodiment may have uniform emission distribution in the overall area thereof.

Furthermore, in the emission area EMA of each of the pixels PXL, the light emitting elements LD may be intensively aligned in only a target area, so that an abnormal alignment defect in which the light emitting elements LD are aligned in an undesired area may be prevented from being caused.

Moreover, since the light emitting elements LD are intensively aligned in only a target area in the emission area EMA of each of the pixels PXL, a contact defect between each of the light emitting elements LD and the electrodes that are electrically and/or physically connected to the light emitting elements LD may be minimized.

Figure 13A:
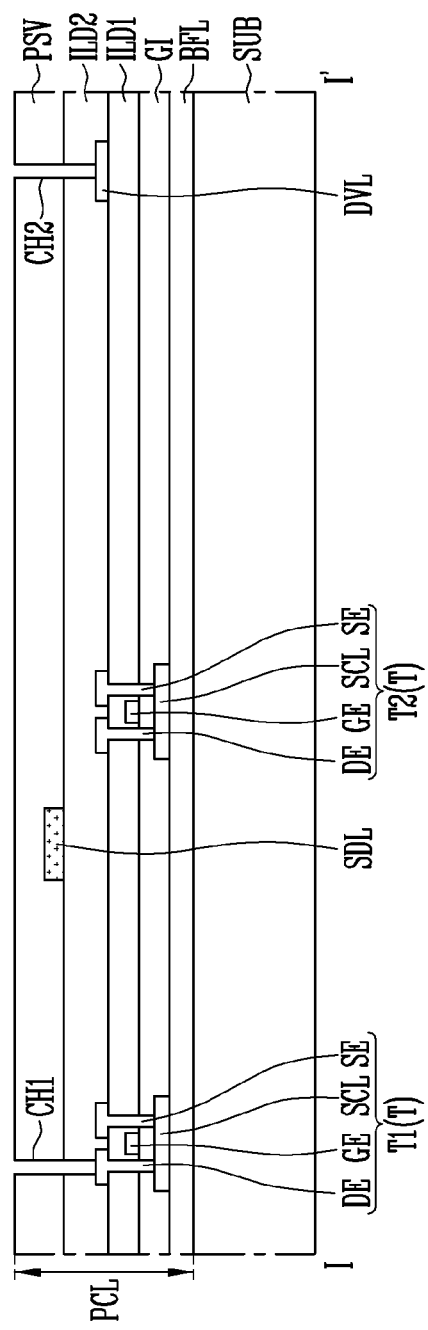
FIGS. 13A to 13N are schematic cross-sectional diagrams sequentially illustrating a method of fabricating the display device illustrated in FIG. 6.
Figure 13B:
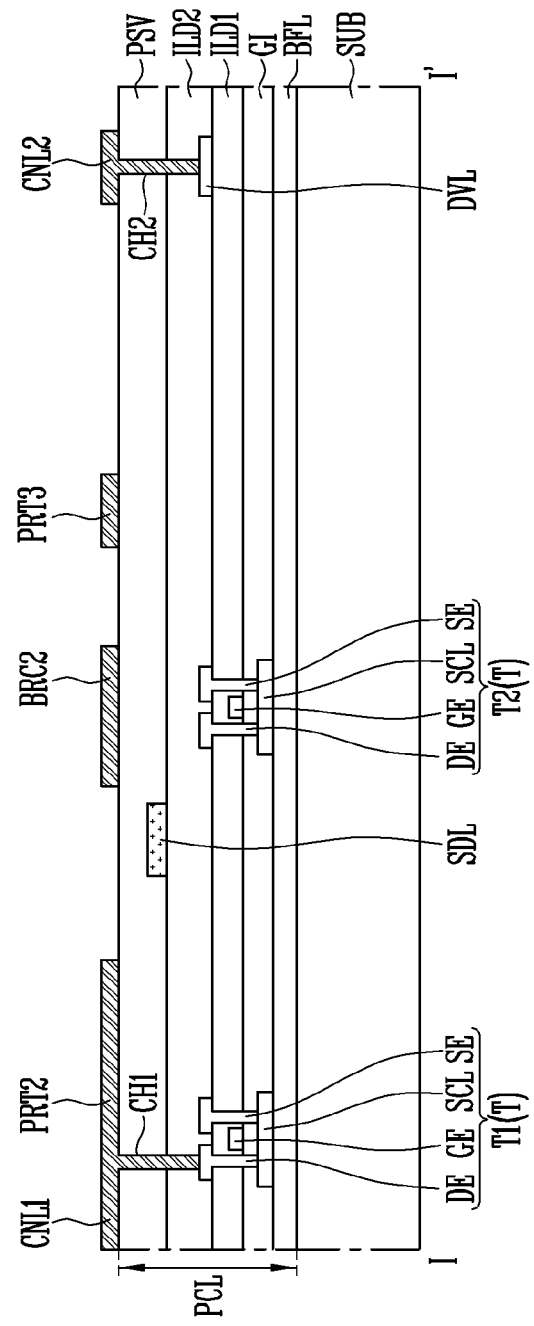
Figure 13C:
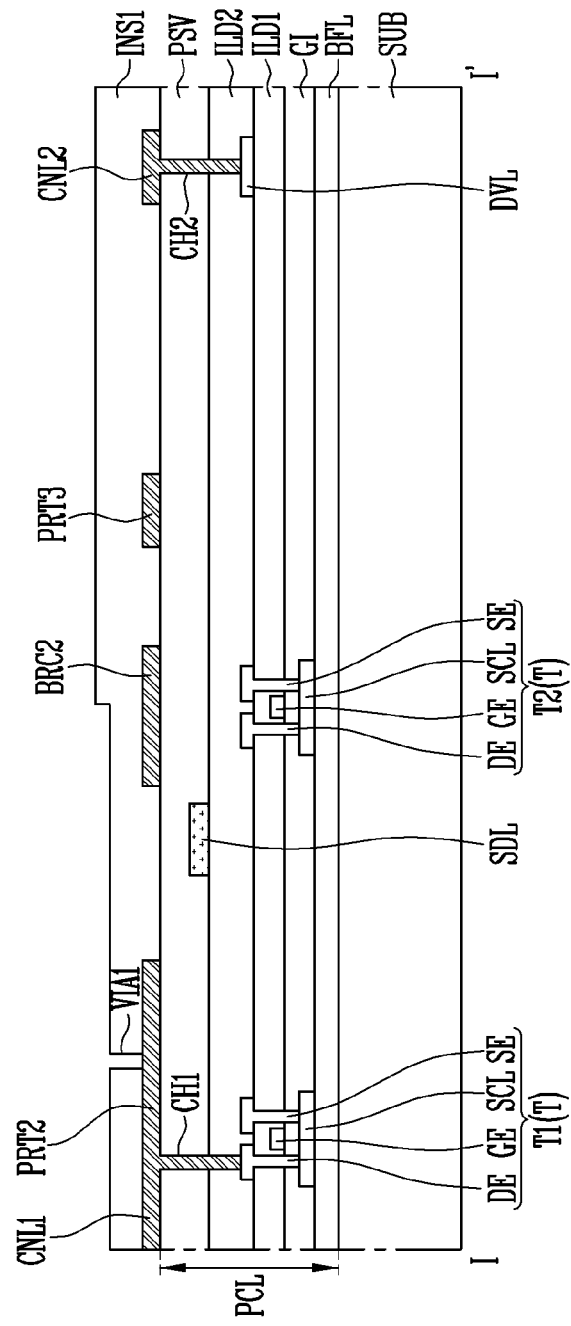
Figure 13D:
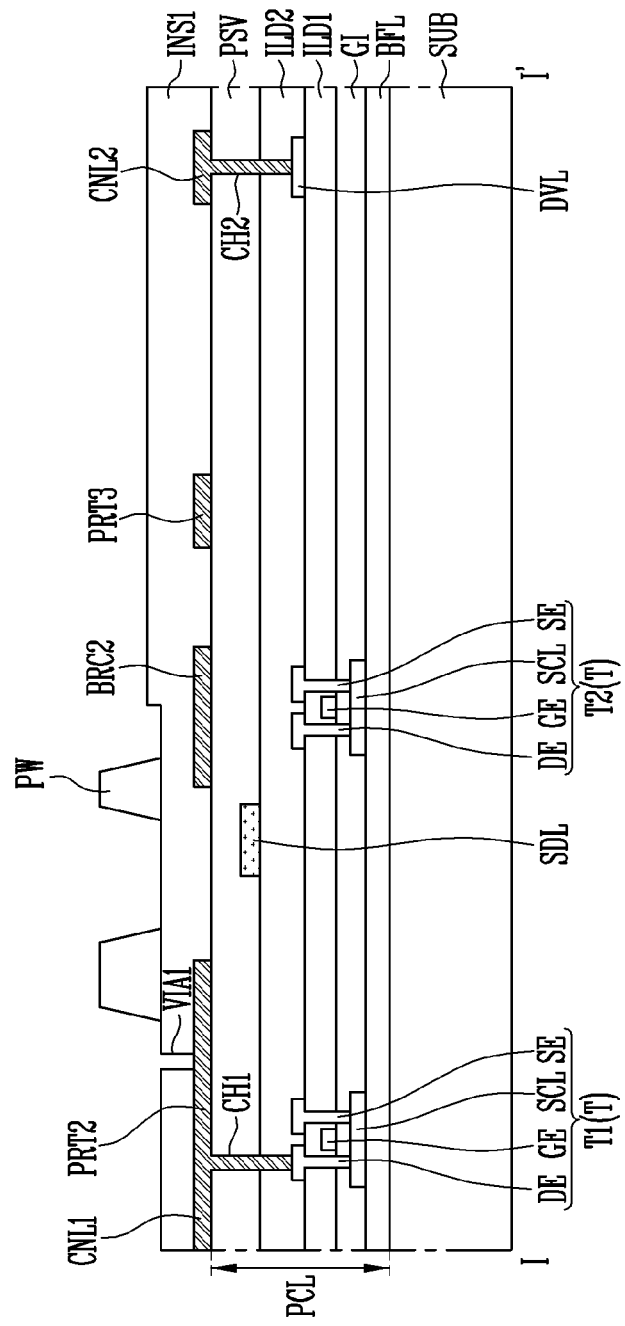
Figure 13E:
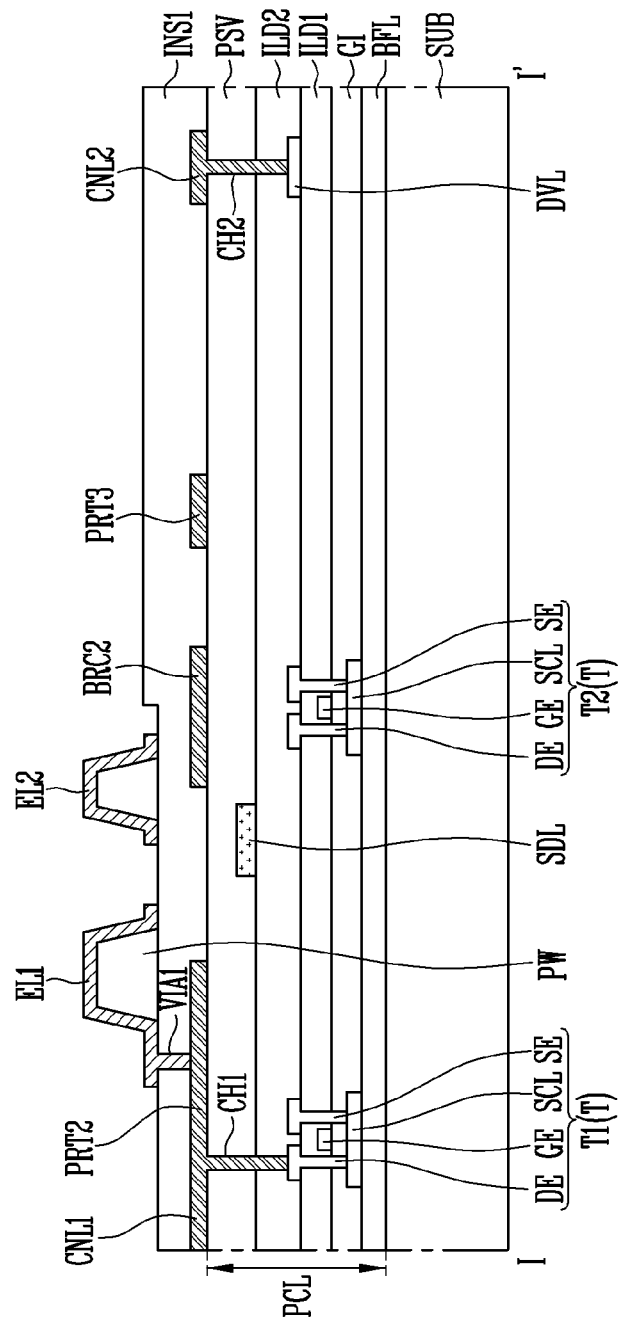
Figure 13F:
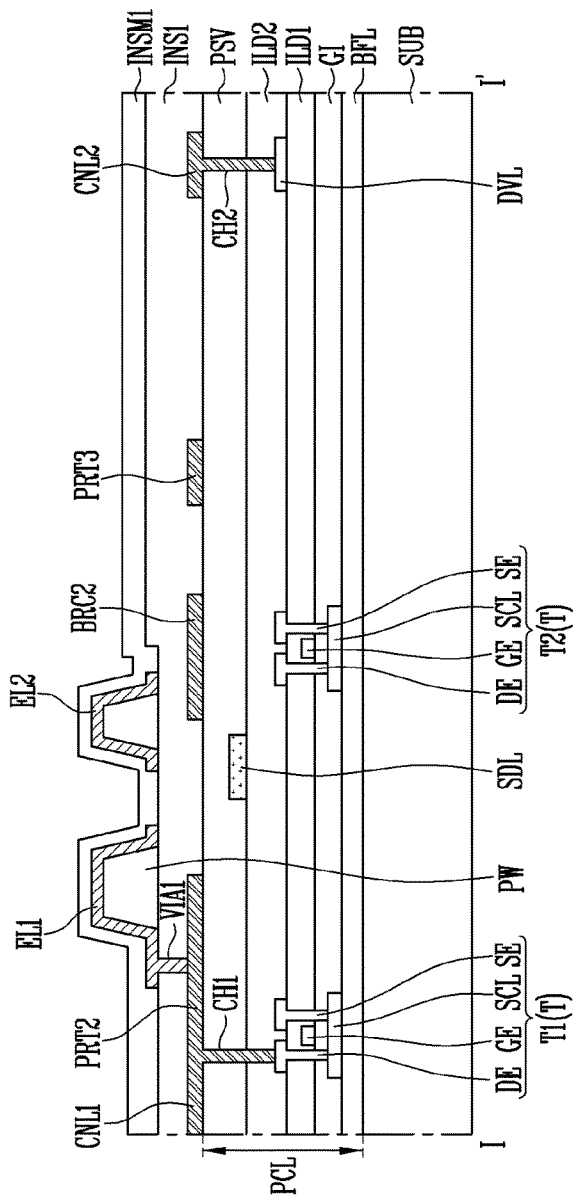
Figure 13G:
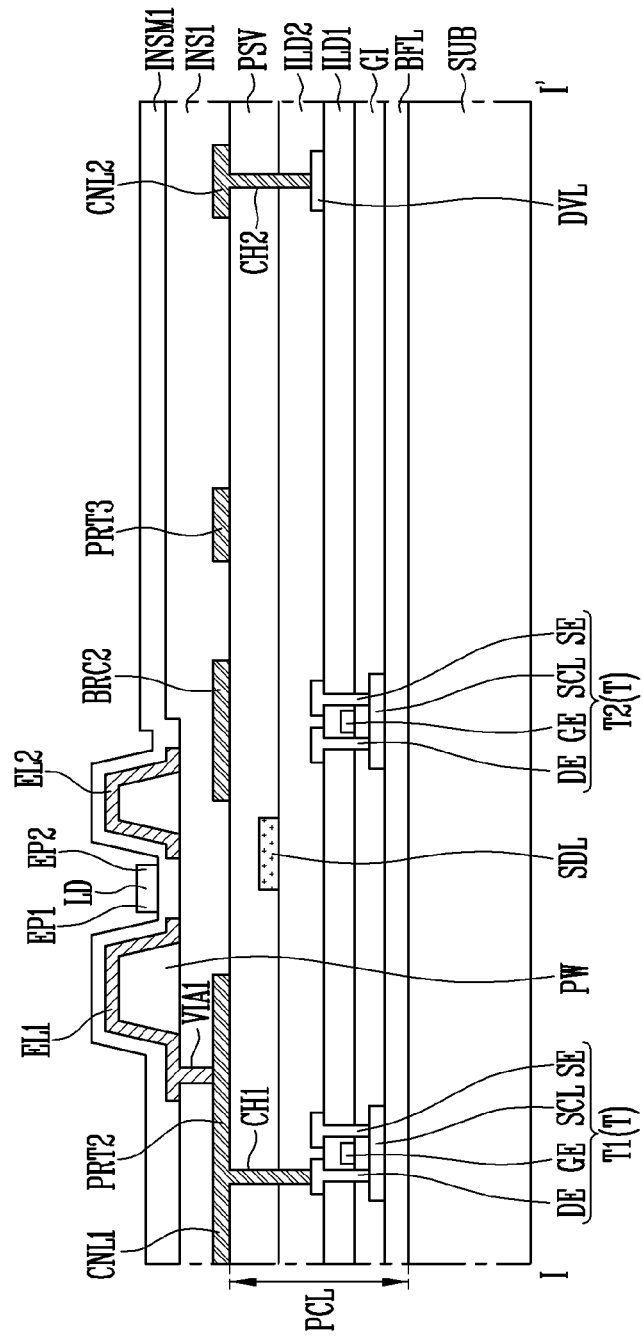
Figure 13I:
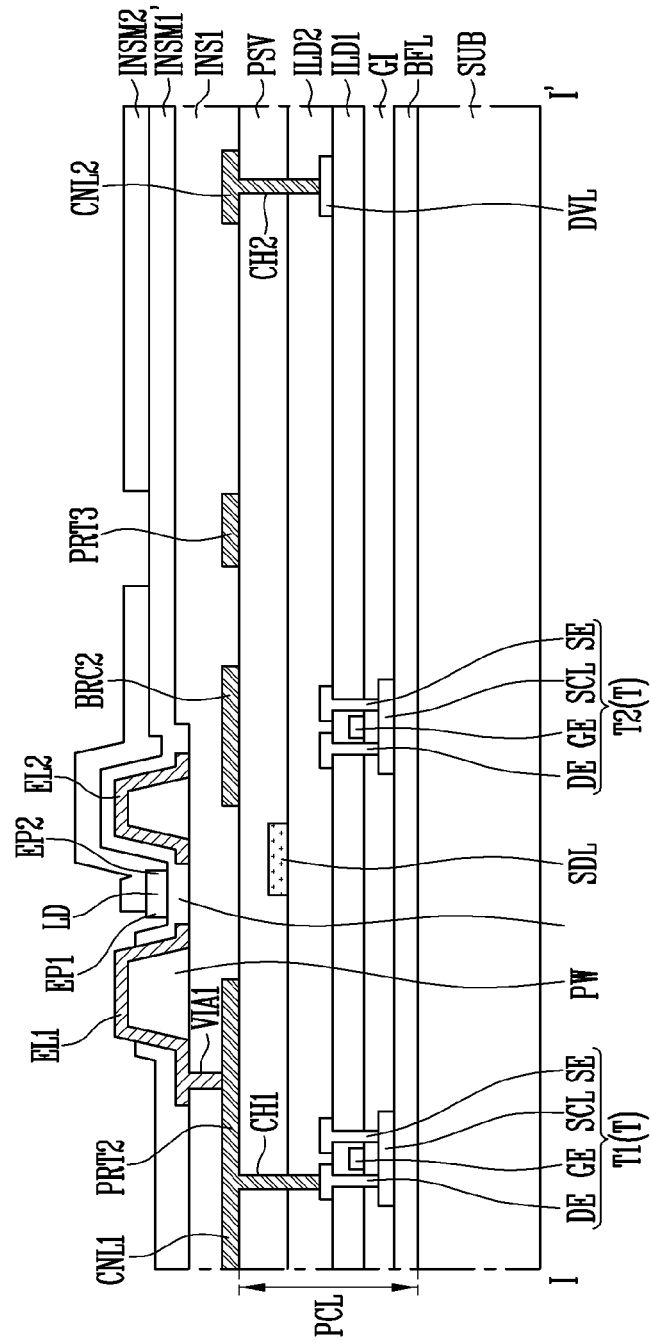
Figure 13J:
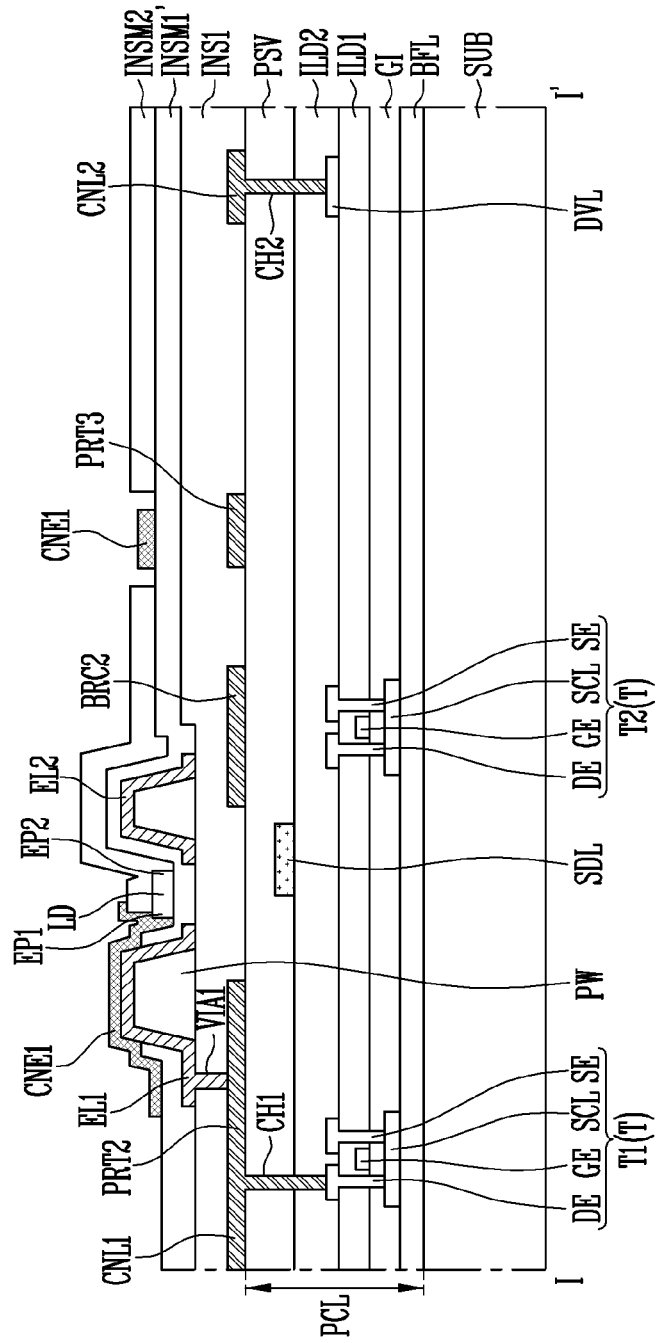
Figure 13K:
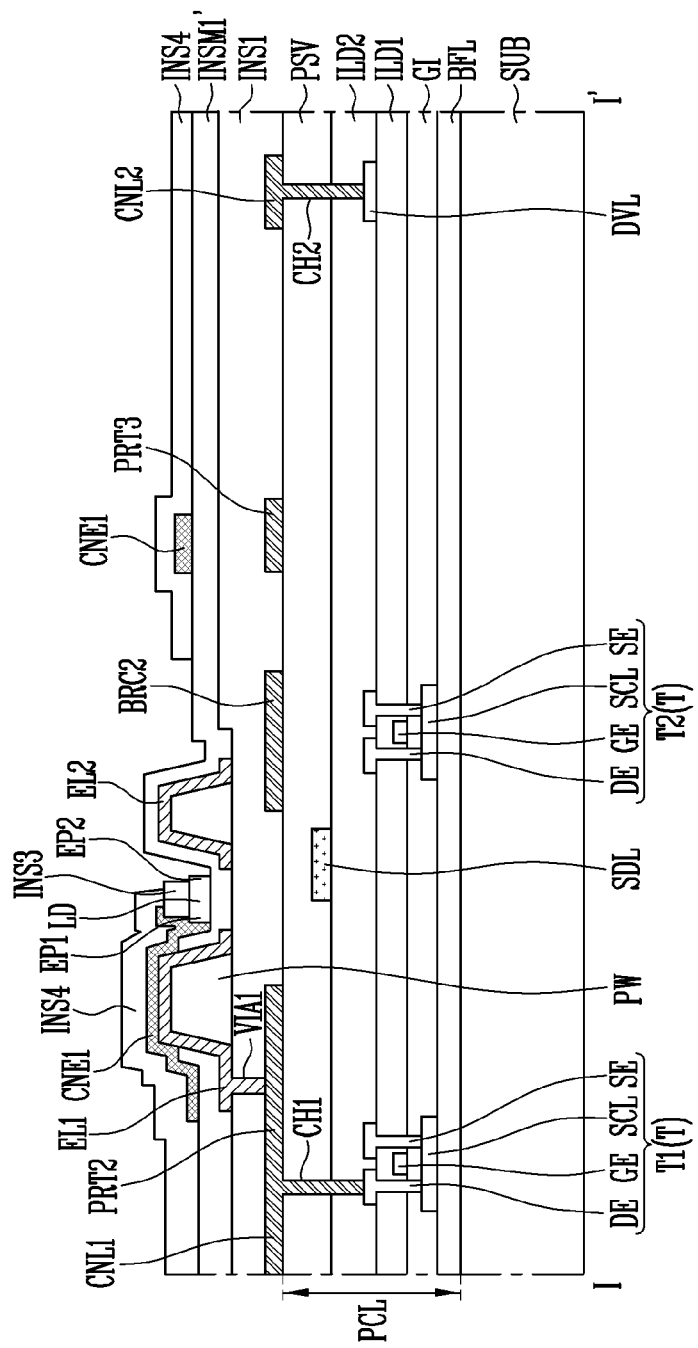
Figure 13L:
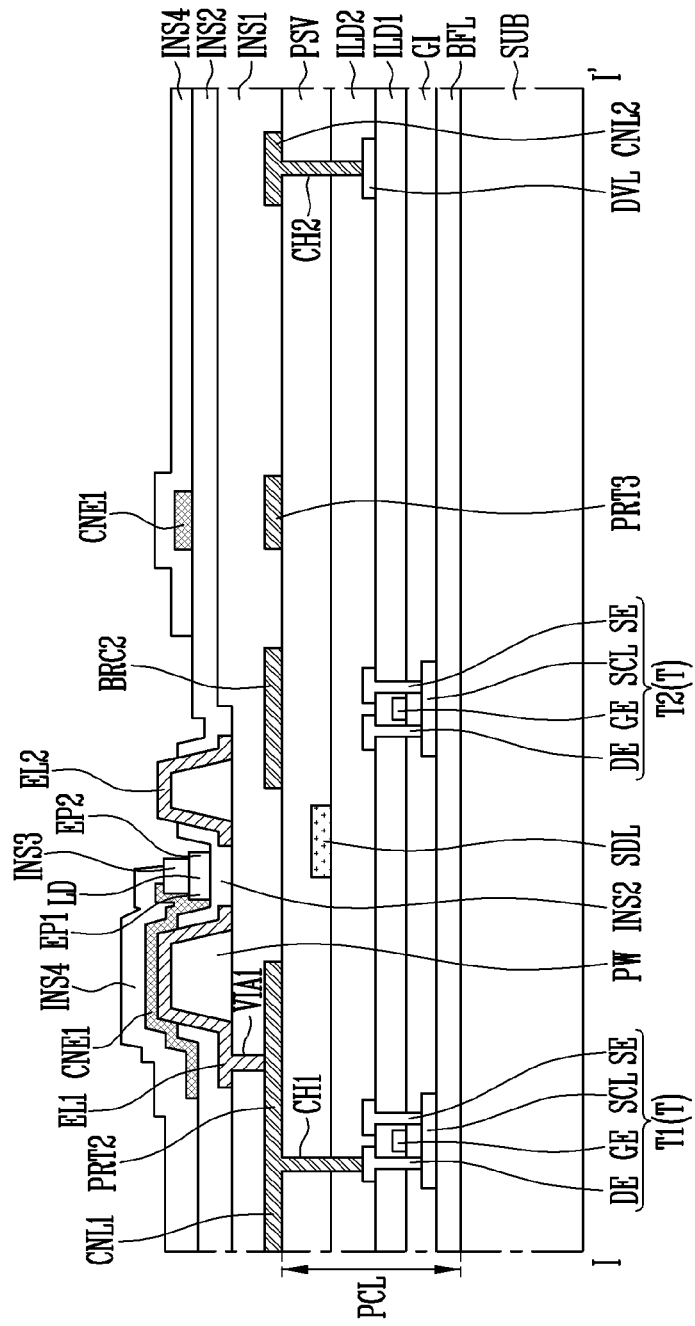
Figure 13M:
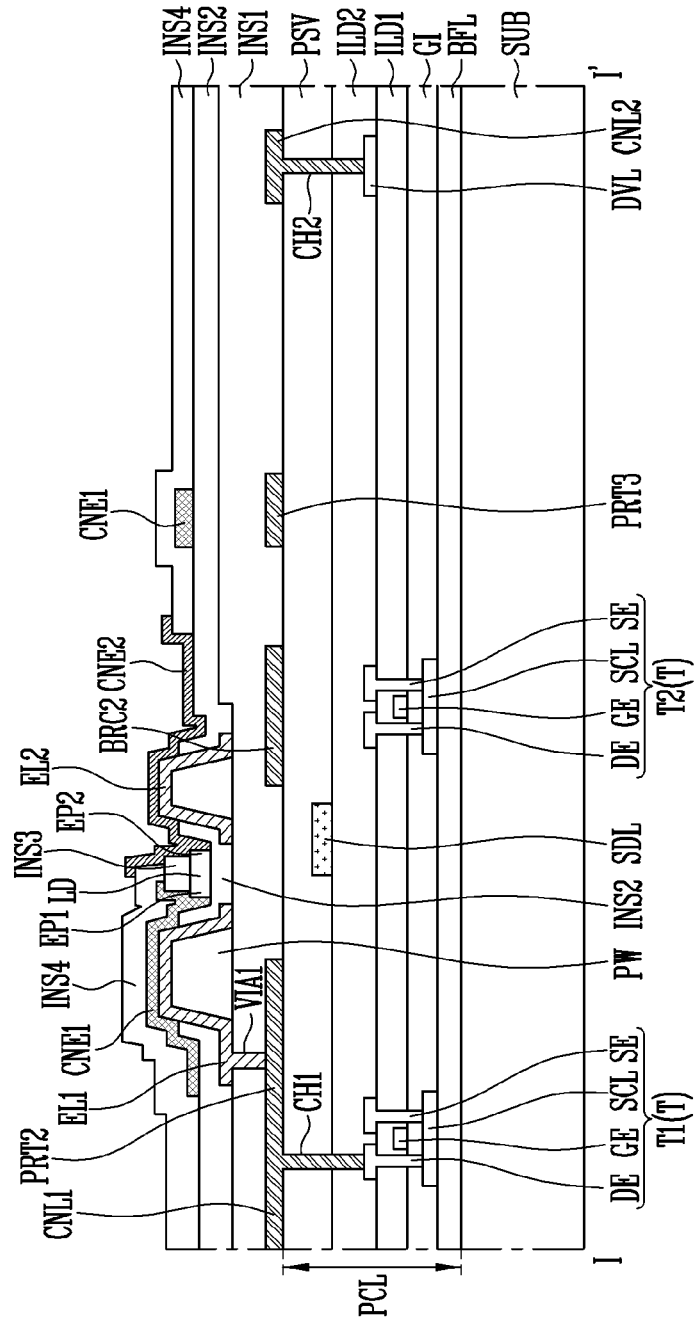
Figure 13N:
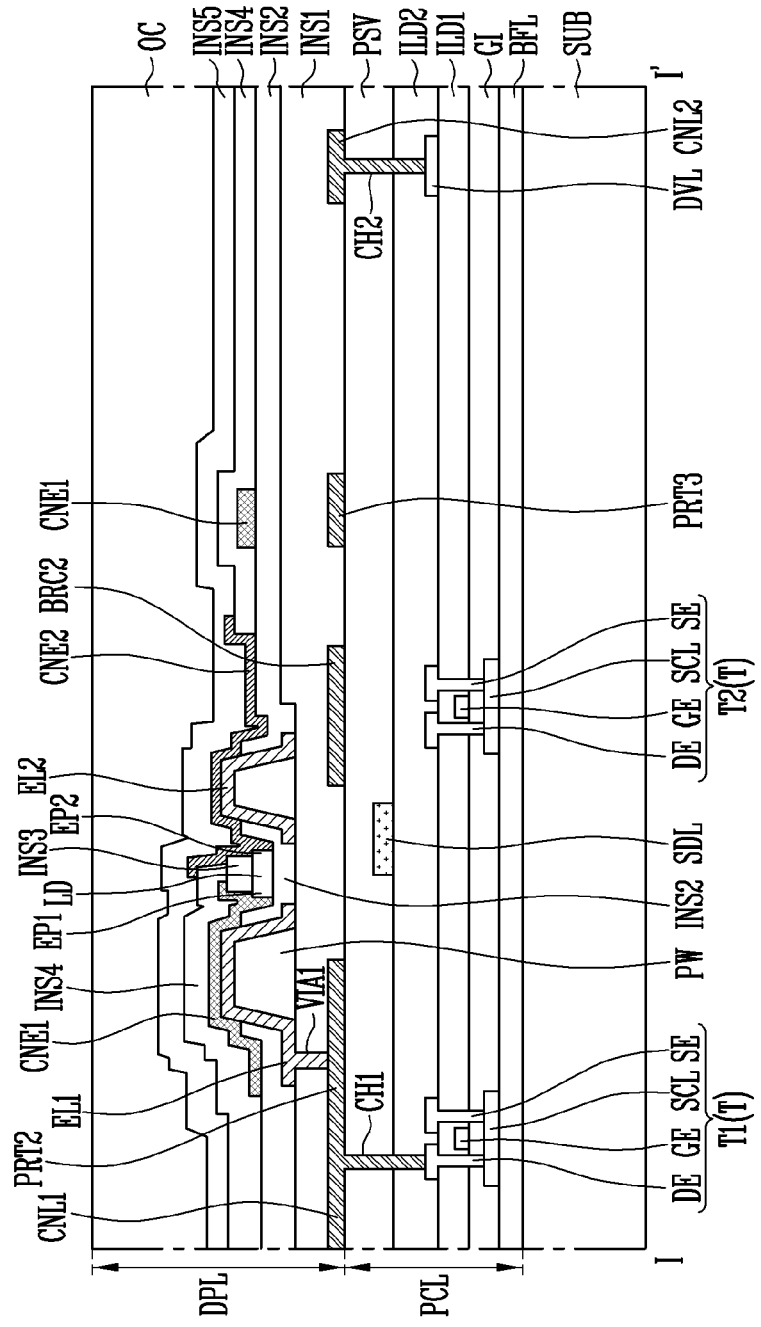

FIGS. 12A to 12I are schematic plan views sequentially illustrating a method of fabricating a pixel illustrated in FIG. 4. FIGS. 13A to 13N are cross-sectional views sequentially illustrating a method of fabricating the display device illustrated in FIG. 6.

Referring to FIGS. 1A to 1H, 2, 3A, 4, 6, 12A, and 13A, the pixel circuit layer PCL of each of the pixels PXL is formed on the substrate SUB. Each of the pixels PXL may include an emission area EMA, and a peripheral area disposed around the emission area EMA.

The pixel circuit layer PCL may include the first transistor T1, the second transistor T2, the driving voltage line DVL, the shielding electrode line SDL, and the passivation layer PSV.

A predetermined area of the second terminal DE of the first transistor T1 may be exposed to the outside through the first contact hole CH1 that passes through the passivation layer PSV and the second interlayer insulating layer ILD2. Furthermore, a predetermined area of the driving voltage line DVL may be exposed to the outside through the second contact hole CH2 that passes through the passivation layer PSV and the second interlayer insulating layer ILD2.

Referring to FIGS. 1A to 1H, 2, 3A, 4, 6, 12B, 13A, and 13B, the first and second connection lines CNL1 and CNL2, the first to third sub-electrodes PRT1 to PRT3, and the first and second branch electrodes BRC1 and BRC2 are formed on the passivation layer PSV in the emission area EMA of each of the pixels PXL.

Each of the first and second connection lines CNL1 and CNL2 may be provided in common to pixels PXL disposed in an identical row. In other words, the pixels PXL that are disposed in an identical row may be electrically connected in common to the first and second connection lines CNL1 and CNL2.

The first to third sub-electrodes PRT1 to PRT3 may be integral with the first connection line CNL1 and may diverge from the first connection line CNL1 in the second direction DR2 and be disposed in the emission area EMA of each of the pixels PXL. The second sub-electrode PRT2 may be electrically connected to the second terminal DE of the first transistor T1 of the pixel circuit layer PCL of each of the pixels PXL through the first contact hole CH1.

The first and second branch electrodes BRC1 and BRC2 may be integral with the second connection line CNL2, and may diverge from the second connection line CNL2 in the second direction DR2 and be disposed in the emission area EMA of each of the pixels PXL. The second connection line CNL2 may be electrically connected to the driving voltage line DVL of the pixel circuit layer PCL of each of the pixels PXL through the second contact hole CH2.

The first to third sub-electrodes PRT1 to PRT3 and the first and second branch electrodes BRC1 and BRC2 may be disposed at positions spaced apart from each other by a predetermined distance and be electrically and/or physically separated from each other. In a plan view, the first to third sub-electrodes PRT1 to PRT3 and the first and second branch electrodes BRC1 and BRC2 may be alternately disposed in the first direction DR1.

Referring to FIGS. 1A to 1H, 2, 3A, 4, 6, 12C, 13A to 13C, an insulating material layer (not shown) is deposited on the passivation layer PSV including the first to third sub-electrodes PRT1 to PRT3, the first and second branch electrodes BRC1 and BRC2, and the first and second connection lines CNL1 and CNL2. Subsequently, after a half tone mask (not shown) is disposed over the insulating material layer, the first insulating layer INS1 including the first via holes VIA1 and the second via holes VIA2 is formed by patterning the insulating material layer by a mask process.

The first via holes VIA1 of the first insulating layer INS1 may expose respective predetermined areas of the first to third sub-electrodes PRT1 to PRT3. The second via holes VIA2 of the first insulating layer INS1 may expose respective predetermined areas of the first and second branch electrodes BRC1 and BRC2.

In an embodiment, the first insulating layer INS1 may have different thicknesses by areas. The first insulating layer INS1 on a predetermined area of at least one sub-electrode PRT that overlaps the first electrodes EL1 to be formed during a process to be described below may have a thickness less than that of the first insulating layer INS1 on the other area of the sub-electrode PRT that does not overlap the first electrodes EL1. Furthermore, the first insulating layer INS1 on a predetermined area of at least one branch electrode BRC that overlaps the second electrodes EL2 to be formed during the process identical to that of the first electrodes EL1, may have a thickness less than that of the first insulating layer INS1 on the other area of the branch electrode BRC that does not overlap to the second electrodes EL2.

Referring to FIGS. 1A to 1H, 2, 3A, 4, 6, 12D, and 13A to 13D, the bank pattern PW is formed on the first insulating layer INS1. The bank pattern PW may be spaced apart from an adjacent bank pattern PW by a predetermined distance on the first insulating layer INS1. The bank pattern PW may include an inorganic insulating layer formed of an inorganic material or an organic insulating layer formed of an organic material.

In a plan view, the bank pattern PW may overlap each of a corresponding sub-electrode PRT and a corresponding branch electrode BRC. Furthermore, the bank pattern PW does not overlap each of the first via holes VIA1 that exposes a predetermined area of the corresponding sub-electrode PRT, and does not overlap each of the second via holes VIA2 that exposes a predetermined area of the corresponding branch electrode BRC.

Referring to FIGS. 1A to 1H, 2, 3A, 4, 6, 12E, and 13A to 13E, the first electrodes EL1 and the second electrodes EL2 are formed on the first insulating layer INS1 including the bank pattern PW.

Each of the first electrodes EL1 may be spaced apart from an adjacent first electrode EL1 by a predetermined distance in the second direction DR2. Furthermore, each of the first electrodes EL1 may be spaced apart from the second electrodes EL2 by a predetermined distance. In an embodiment of the disclosure, in a plan view, at least one of the first electrodes EL1 may be disposed in a row identical to that of at least one of the second electrodes EL2.

Each of the first electrodes EL1 may be disposed on the corresponding bank pattern PW and overlap the corresponding bank pattern PW, in a plan view. Furthermore, each of the first electrodes EL1 may be disposed on the corresponding sub-electrode PRT and overlap the sub-electrode PRT. Each of the first electrodes EL1 may be electrically and/or physically connected with the corresponding sub-electrode PRT disposed therebelow through the corresponding first via hole VIA1.

Each of the second electrodes EL2 may be disposed on the corresponding bank pattern PW and overlap the corresponding bank pattern PW, in a plan view. Furthermore, each of the second electrodes EL2 may be disposed on the corresponding branch electrode BRC and overlap the branch electrode BRC. Each of the second electrodes EL2 may be electrically and/or physically connected with the corresponding branch electrode BRC disposed therebelow through the corresponding second via hole VIA2.

In a plan view, each of the first and second electrodes EL1 and EL2 may have a rectangular shape. In an embodiment, each of the first electrodes EL1 may have a width greater (or larger) than that of the sub-electrode PRT in a direction (e.g., in the first direction DR1) to fully cover (or overlap) a predetermined area of at least one sub-electrode PRT. Each of the second electrodes EL2 may have a width greater (or larger) than that of the branch electrode BRC in the first direction DR1 to fully cover a predetermined area of at least one branch electrode BRC.

Referring to FIGS. 1A to 1H, 2, 3A, 4, 6, and 13A to 13F, a first insulating material layer INSM1 is formed on an overall surface of the first insulating layer INS1 including the first and second electrodes EL1 and EL2. The first insulating material layer INSM1 may be formed of an inorganic insulating layer including an inorganic material, or an organic insulating layer including an organic material.

Referring to FIGS. 1A to 1H, 2, 3A, 4, 6, 12F, and 13A to 13G, an electric field is formed between the first and second electrodes EL1 and EL2 by respectively applying alignment voltages to the first electrodes EL1 and the second electrodes EL2 through the first and second connection lines CNL1 and CNL2.

In case that direct current power having a predetermined voltage or alternating current power having predetermined period is repeatedly applied several times to each of the first and second electrodes EL1 and EL2 through the first and second connection lines CNL1 and CNL2, an electric field may be formed between the first and second electrodes EL1 and EL2.

After the electric field has been formed between the first and second electrodes EL1 and EL2, a solvent including light emitting elements LD is input by an inkjet printing method or the like. For example, the light emitting elements LD may be fed to the emission area EMA of each of the pixels PXL by disposing a nozzle (not shown) over the first insulating layer INS1 and spraying a solvent including the light emitting elements LD through the nozzle. In case that the light emitting elements LD are input into the emission area EMA of each of the pixels PXL, self-alignment of the light emitting elements LD may be induced by an electric field that is formed between the first and second electrodes EL1 and EL2 and has a relatively high intensity. Therefore, the light emitting elements LD may be aligned between at least one of the first electrodes EL1 and at least one of the second electrodes EL2. In other words, the light emitting elements LD may be aligned in only a target area, e.g., only an area between the first and second electrodes EL1 and EL2 of each of the pixels PXL. Each of the light emitting elements LD may be aligned on the first insulating material layer INSM1 in the emission area EMA of each of the pixels PXL.

Referring to FIGS. 1A to 1H, 2, 3A, 4, 6, 12G, and 13A to 13H, after the light emitting elements LD are aligned in the emission area EMA of each of the pixels PXL, the first connection line CNL1 is separated into two parts between each pixel PXL and pixels PXL adjacent to the each pixel PXL so that each of the pixels PXL can be driven independently from the adjacent pixels PXL.

After the separation process for the first connection line CNL1, an insulating material layer (not show) is applied onto the first insulating material layer INSM1 and the light emitting elements LD, and an insulating pattern INSM2 is formed by patterning the insulating material layer by a mask process. The insulating pattern INSM2 may be formed of an inorganic insulating layer including an inorganic material, or an organic insulating layer including an organic material.

The insulating pattern INSM2 may cover (or overlap) the first insulating material layer INSM1 disposed on the second electrodes EL2. Furthermore, the insulating pattern INSM2 may expose each of the first connection line CNL1 disposed on the first electrodes EL1 and the first insulating material layer INSM1 disposed on the first connection line INSM1 to the outside. The insulating pattern INSM2 may expose any one of the opposite ends EP1 and EP2 of each of the light emitting elements LD to the outside.

Referring to FIGS. 1A to 1H, 2, 3A, 4, 6, and 13A to 13I, after a mask (not shown) is disposed over the insulating pattern INSM2, a first insulating material pattern INSM1' is formed, using the mask, by patterning a portion of the first insulating material layer INSM1 that is exposed to the outside.

The first insulating material pattern INSM1' may expose predetermined areas of the first electrodes EL1 and cover the other areas of the first electrodes EL1 other than the predetermined areas.

Referring to FIGS. 1A to 1H, 2, 3A, 4, 6, 12H, and 13A to 13J, the first contact electrode CNE1 is formed on the exposed predetermined areas of the first electrodes EL1 and one of the opposite ends EP1 and EP2 of the light emitting elements LD by a sputtering method or the like.

The first contact electrode CNE1 may be provided on the exposed predetermined areas of the first electrode EL1 and electrically and/or physically connected with the first electrodes EL1. Furthermore, the first contact electrode CNE1 may be electrically and/or physically connected with one of the exposed opposite ends EP1 and EP2 of each of the light emitting elements LD.

In a plan view, the first contact electrode CNE1 may extend in the second direction DR2 and overlap at least one sub-electrode PRT.

Referring to FIGS. 1A to 1H, 2, 3A, 4, 6, and 13A to 13K, after a mask (not shown) is disposed over the first contact electrode CNE1, a third insulating layer INS3 is formed by patterning the insulating pattern INSM2, using the mask.

The third insulating layer INS3 may cover (or overlap) at least a portion of the upper surface of each of the light emitting elements LD such that the other of the opposite ends EP1 and EP2 of each of the light emitting elements LD may be exposed to the outside.

Thereafter, after an insulating material layer (not illustrated) is formed on the third insulating layer INS3, a mask (not illustrated) is disposed over the insulating material layer, and then the fourth insulating layer INS4 is formed by patterning the insulating material layer by a process using the mask. The fourth insulating layer INS4 may cover the first contact electrode CNE1, thereby protecting the first contact electrode CNE1 from the outside. Not covered with the fourth insulating layer INS4, the predetermined area of the first insulating material pattern INSM1' on the second electrodes EL2, and the other of the opposite ends EP1 and EP2 of each of the light emitting elements LD may be exposed to the outside.

Referring to FIGS. 1A to 1H, 2, 3A, 4, 6, and 13A to 13L, after a mask (not shown) is disposed over the substrate SUB including the fourth insulating layer INS4, the second insulating layer INS2 is formed by patterning the exposed area of the first insulating material pattern INSM1'.

The second insulating layer INS2 may expose predetermined areas of the second electrodes EL2 and cover (or overlap) the other areas of the second electrodes EL2 except the predetermined areas.

Referring to FIGS. 1A to 1H, 2, 3A, 4, 6, 12I, and 13A to 13M, the second contact electrode CNE2 is formed on the other of the exposed opposite ends EP1 and EP2 of each of the light emitting elements LD and on the second electrodes EL2.

The second contact electrode CNE2 may be provided on the exposed predetermined areas of the second electrode EL2 and electrically and/or physically connected with the second electrodes EL2. Furthermore, the second contact electrode CNE2 may be electrically and/or physically connected with the other of the exposed opposite ends EP1 and EP2 of each of the light emitting elements LD.

In a plan view, the second contact electrode CNE2 may extend in the second direction DR2 and overlap at least one branch electrode BRC.

Referring to FIGS. 1A to 1H, 2, 3A, 4, 6, and 13A to 13N, the fifth insulating layer INS5 is formed on an overall surface of the fourth insulating layer INS4 including the second contact electrode CNE2.

The fifth insulating layer INS5 may be formed of an inorganic insulating layer including an inorganic material, or an organic insulating layer including an organic material. Although the fifth insulating layer INS5 may have a single layer structure as shown in the drawings, the disclosure is not limited thereto. In an embodiment, the fifth insulating layer INS5 may have a multi-layer structure.

Subsequently, the overcoat layer OC is formed on the fifth insulating layer INS5.

Figure 14:
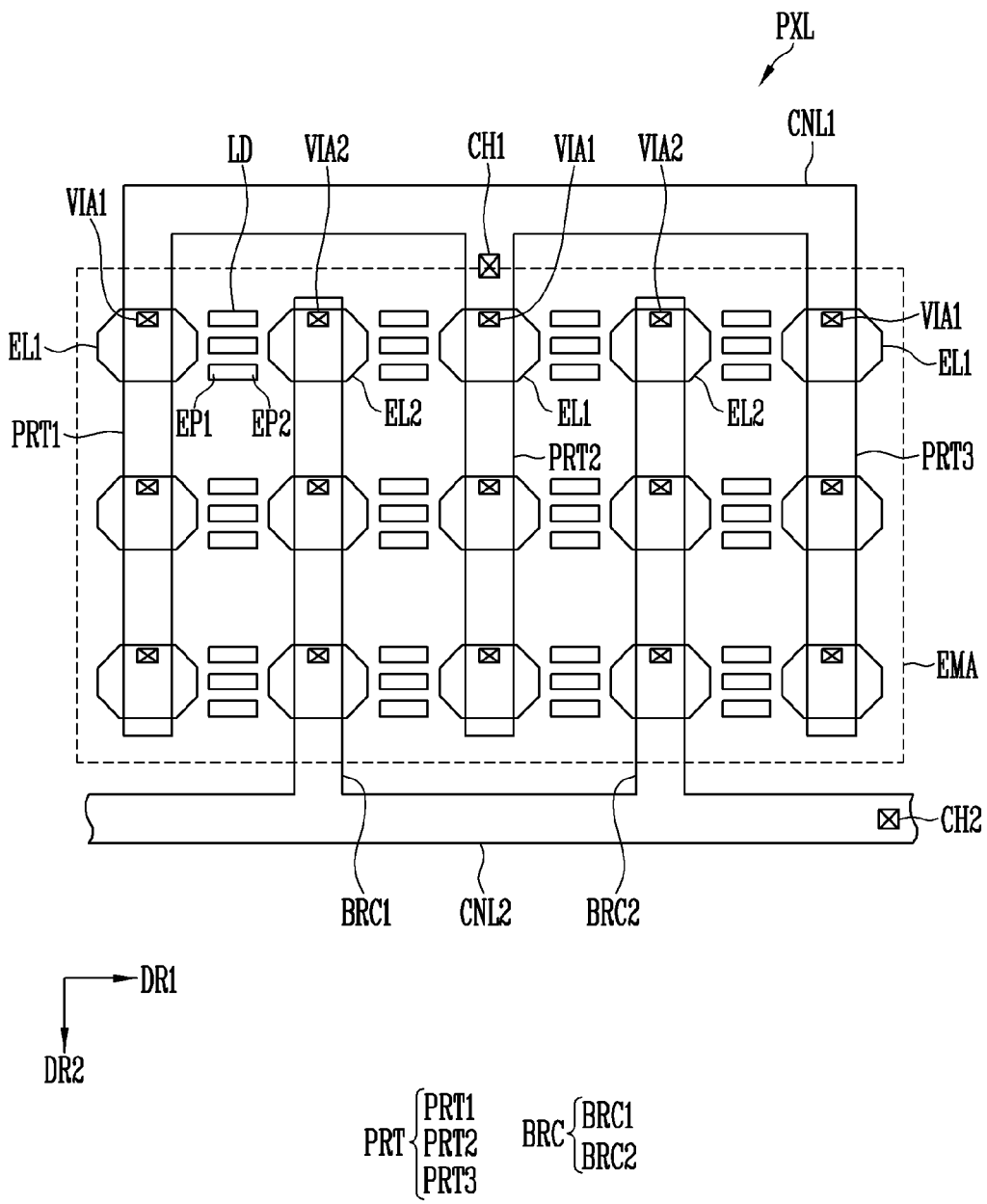
FIGS. 14 to 16 illustrate another embodiment of the pixel of FIG. 5, and are plan views schematically illustrating a pixel including only some components of the display element layer.
Figure 15:
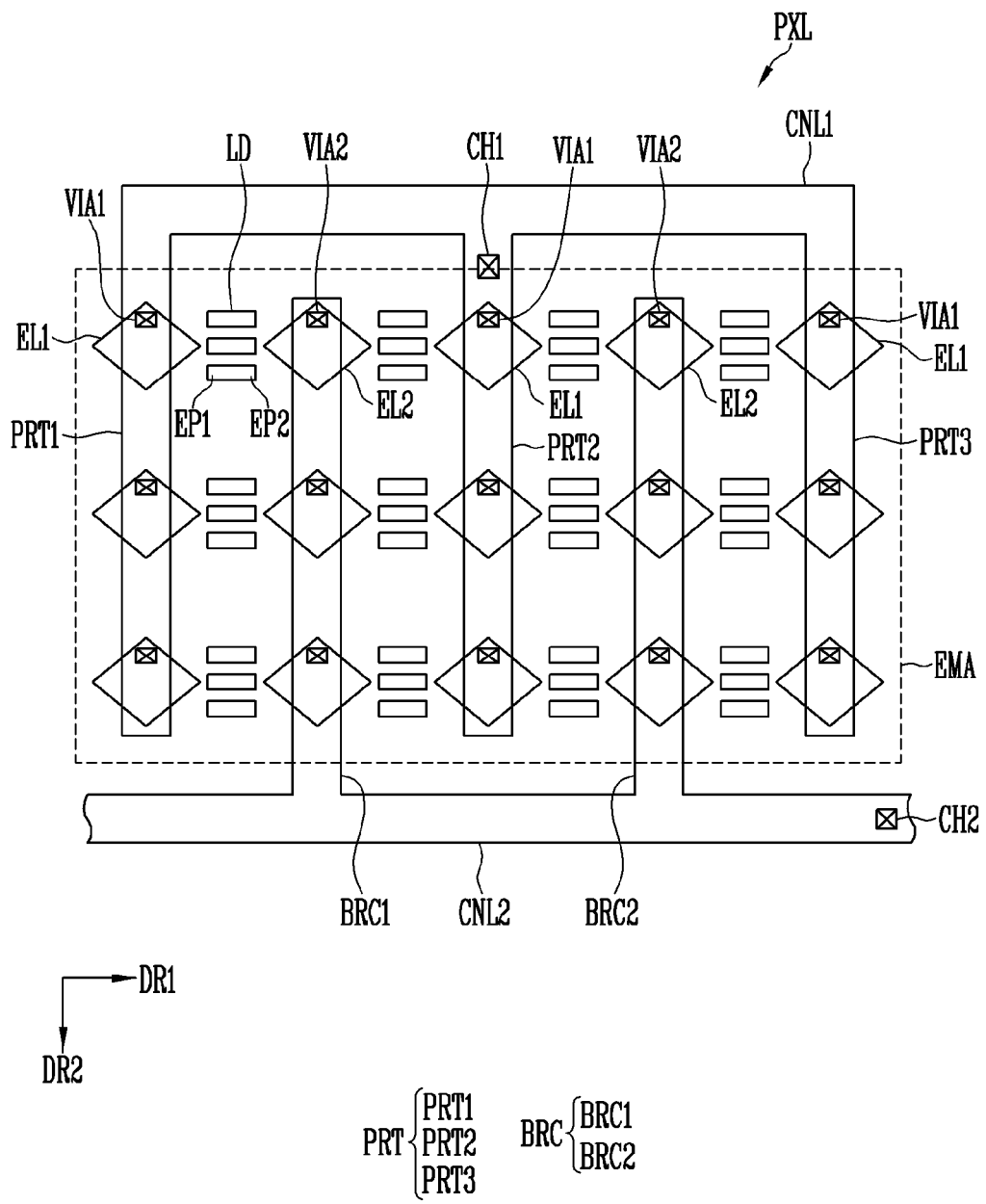
Figure 16:
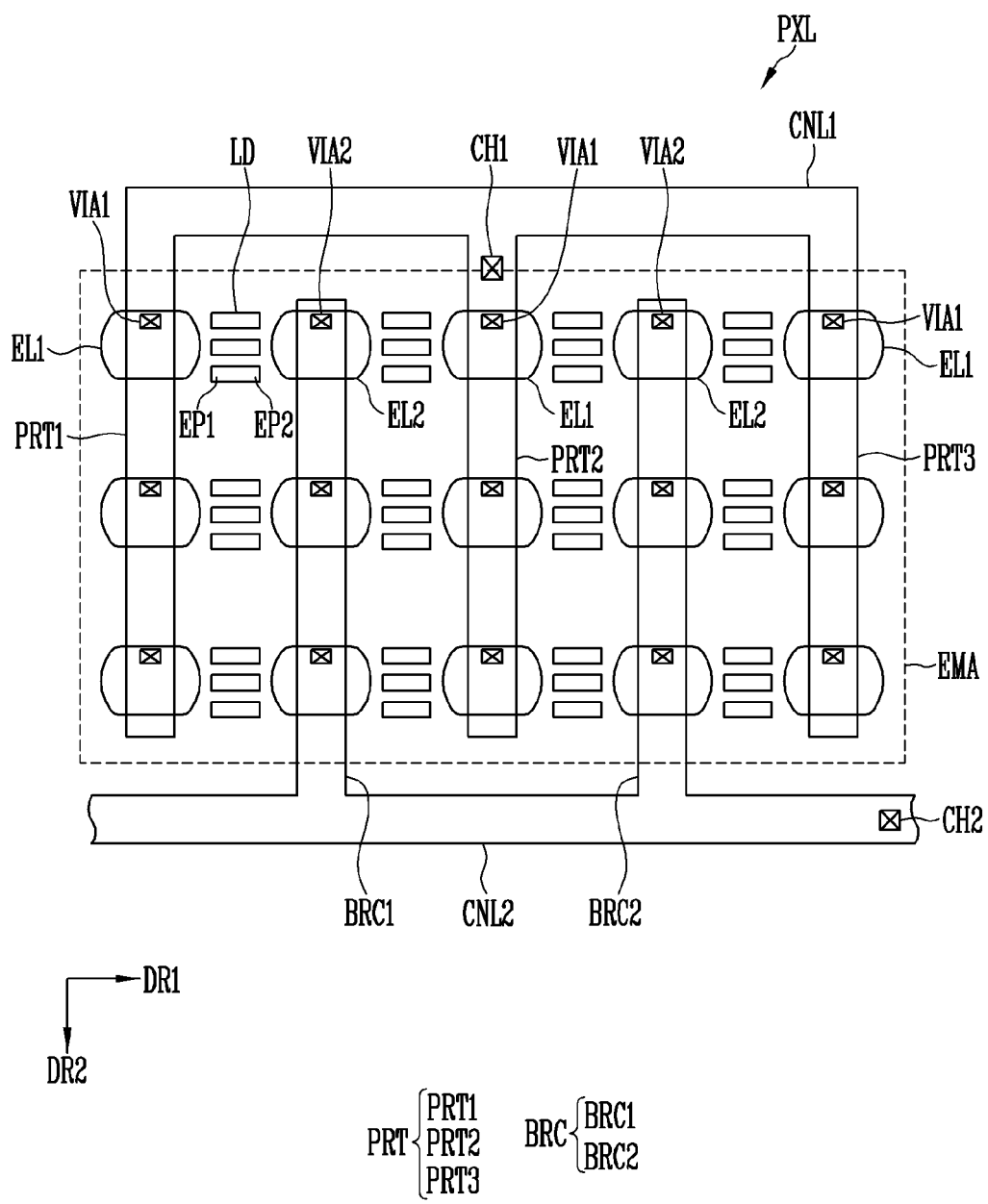

FIGS. 14 to 16 illustrate another embodiment of the pixel of FIG. 5, and are plan views schematically illustrating a pixel including only some components of the display element layer.

Although FIGS. 14 to 16 illustrate a simplified structure of a pixel, e.g., showing only a partial configuration of a display element layer of a pixel PXL, the present disclosure is not limited thereto.

In FIGS. 14 to 16, for the sake of explanation, illustration of the pixel circuit layer (including at least one transistor and signal lines electrically connected to the transistor) electrically connected to the light emitting elements is omitted.

The following description of embodiments of FIGS. 14 to 16 will be focused on differences from that of the foregoing embodiments to avoid repetitive descriptions. Components which are not separately described in the following description of the embodiments of FIGS. 14 to 16 may comply with those of the foregoing embodiments. The same reference numeral will be used to designate the same component, and a similar reference numeral will be used to designate a similar component.

Referring to FIGS. 1A to 1H, 2, and 14 to 16, each of the pixels PXL may include first and second connection lines CNL1 and CNL2, at least one sub-electrode PRT, at least one branch electrode BRC, first electrodes EL1, second electrodes EL2, and light emitting elements LD.

Although not directly shown in FIGS. 14 to 16, each of the pixels PXL may further include a bank pattern PW (refer to PW of FIG. 4) disposed under each of the first and second electrodes EL1 and EL2, a first contact electrode CNE1 (refer to CNE1 of FIG. 4) disposed on the first electrodes EL1 and one of first and second ends EP1 and EP2 of each of the light emitting elements LD, and a second contact electrode CNE2 (refer to CNE2 of FIG. 4) disposed on the second electrodes EL2 and the other of the opposite ends EP1 and EP2 of each of the light emitting elements LD.

The first connection line CNL1 may extend in the first direction DR1 and be integral with at least one sub-electrode PRT. In an embodiment, the sub-electrode PRT may include first to third sub-electrodes PRT1 to PRT3 which diverge in the second direction DR2 from the first connection line CNL1 into the emission area EMA of each pixel PXL. In a plan view, each of the first to third sub-electrodes PRT1 to PRT3 may have a bar shape extending in the second direction DR2.

The second connection line CNL2 may extend in the first direction DR1 and be integral with at least one branch electrode BRC. In an embodiment, the branch electrode BRC may include first and second branch electrodes BRC1 and BRC2 which diverge in the second direction DR2 from the second connection line CNL2 into the emission area EMA of each pixel PXL. In a plan view, each of the first and second branch electrodes BRC1 and BRC2 may have a bar shape extending in the second direction DR2.

Each of the first electrodes EL1 may be provided in the emission area EMA of each of the pixels PXL and be disposed at a position spaced apart from an adjacent first electrode EL1 in the second direction DR2. In a plan view, each of the first electrodes EL1 may have an octagonal shape, but the shape of each of the first electrodes EL1 is not limited to that of the foregoing embodiment. In an embodiment, each of the first electrodes EL1 may have a rhombic shape, as shown in FIG. 15, or a semi-elliptical shape including a curved line having a predetermined curvature, as shown in FIG. 16. Furthermore, although not directly shown in the drawings, each of the first electrodes EL1 may have a triangular shape, a circular shape, an elliptical shape, a trapezoidal shape, etc. The shape of each of the first electrodes EL1 is not limited to that of the foregoing embodiments and may be changed in various ways as long as it can reliably cover (or overlap) the corresponding sub-electrode PRT disposed thereunder.

Each of the first electrodes EL1 may be electrically and/or physically connected with the corresponding sub-electrode PRT disposed therebelow through the corresponding first via hole VIA1.

Each of the second electrodes EL2 may be provided in the emission area EMA of each of the pixels PXL and be disposed at a position spaced apart from an adjacent second electrode EL2 in the second direction DR2. Although each of the second electrodes EL2 has an octagonal shape in a plan view, it may have a rhombic shape, as shown in FIG. 15, or a semi-elliptical shape including a curved line having a predetermined curvature, as shown in FIG. 16. Likewise, although not directly shown in the drawing, each of the second electrodes EL2 may have a triangular shape, a circular shape, an elliptical shape, a trapezoidal shape, etc. The shape of each of the second electrodes EL2 is not limited to that of the foregoing embodiments, and may be changed in various ways as long as it can reliably cover (or overlap) the corresponding branch electrode BRC disposed thereunder. In an embodiment of the present disclosure, each of the second electrodes EL2 has a shape identical to that of the first electrodes EL1, but the disclosure is not limited thereto. In an embodiment, the second electrode EL2 may have a shape different from that of the first electrodes EL1.

Each of the second electrodes EL2 may be electrically and/or physically connected with the corresponding branch electrode BRC disposed therebelow through the corresponding second via hole VIA2.

In an embodiment of the disclosure, each of the first electrodes EL1 may be designed to have a width greater (or larger) than that of the corresponding sub-electrode PRT disposed thereunder in the first direction DR1. Each of the second electrodes EL2 may be designed to have a width greater (or larger) than that of the corresponding branch electrode BRC disposed thereunder in the first direction DR1.

Hence, a distance W1 (refer to W1 of FIG. 4) between at least one of the first electrodes EL1 and at least one of the second electrodes EL2 may be less (or smaller) than a distance W2 (refer to W2 of FIG. 4) between the corresponding sub-electrode PRT disposed under the at least one first electrode EL1 and the corresponding branch electrode BRC disposed under the at least one second electrode EL2. In this case, if each of the first and second connection lines CNL1 and CNL2 is supplied with a corresponding alignment voltage, an electric field having a high intensity may be formed between at least one of the first electrodes EL1 and at least one of the second electrodes EL2 because the distance W1 between the at least one first electrode EL1 and the at least one second electrode EL2 is relatively narrow (or small).

Therefore, the light emitting elements LD may be intensively aligned between the first and second electrodes EL1 and EL2 between which the electric field having a relatively high intensity is formed. In other words, the light emitting elements LD may be intensively aligned only in an area where an electric field having a relatively high intensity is formed, rather than being aligned in an area where an electric field having a relatively low intensity is formed. Consequently, in the emission area EMA of each of the pixels PXL, the light emitting elements LD may be intensively aligned only in a target area, e.g., only an area between the first and second electrodes EL1 and EL2.

Figure 17:
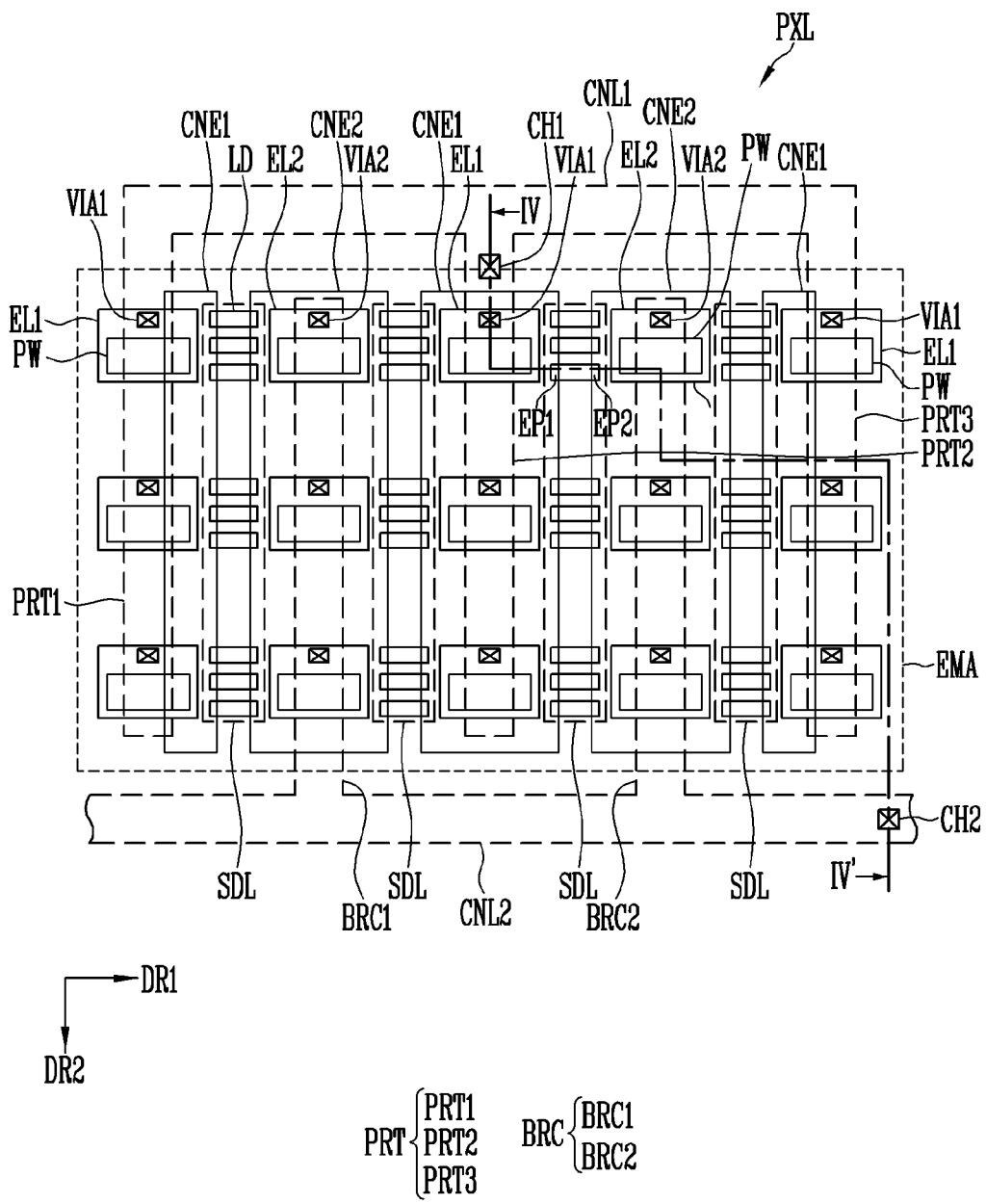
FIG. 17 illustrates a display device in accordance with an embodiment of the present disclosure, and is a plan view schematically illustrating a pixel of the pixels shown in FIG. 2.
Figure 18:
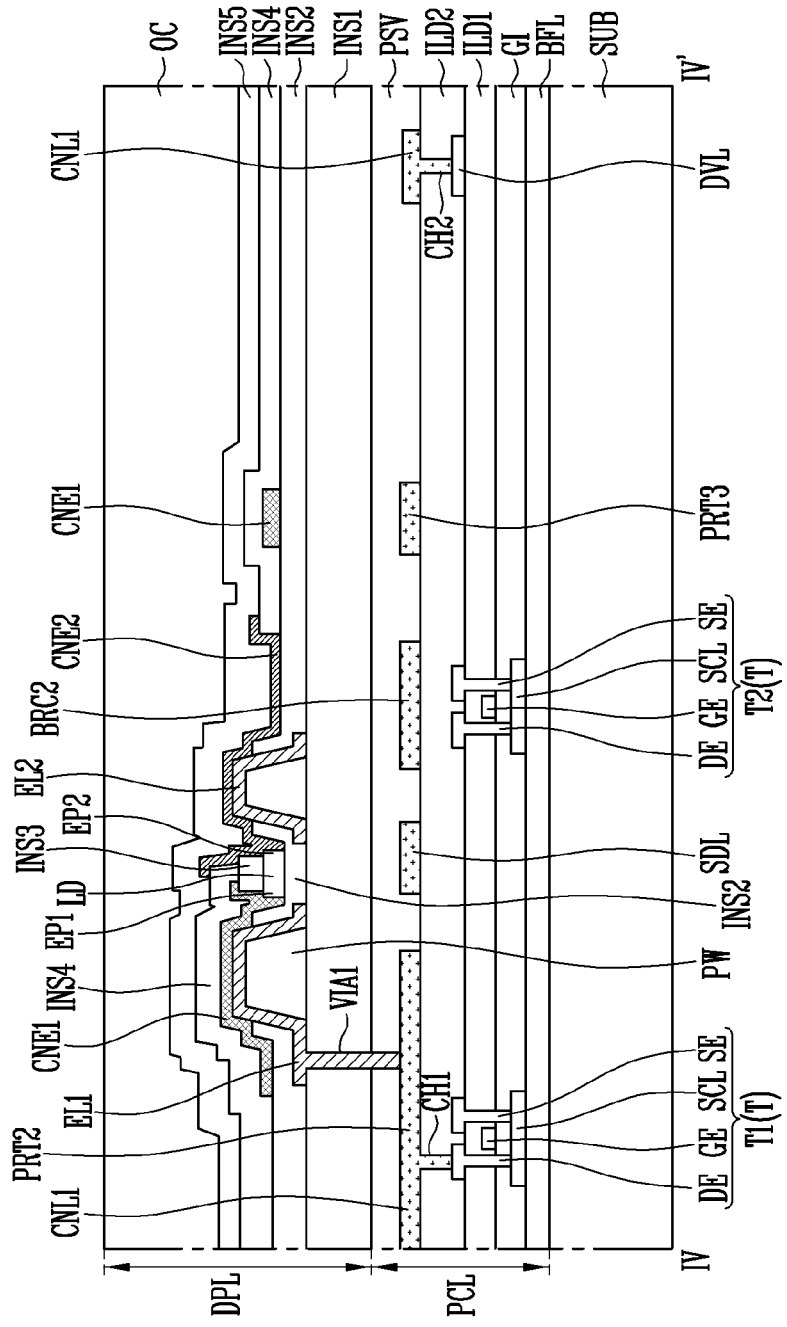
FIG. 18 is a schematic cross-sectional view taken along line IV-IV' of FIG. 17.

FIG. 17 illustrates a display device in accordance with an embodiment of the disclosure, and is a plan view schematically illustrating one of the pixels shown in FIG. 2. FIG. 18 is a schematic cross-sectional view taken along line IV-IV' of FIG. 17

A pixel illustrated in FIG. 18 be different from that of the pixel shown in FIG. 4 at least in that the first and second connection lines, the first to third sub-electrodes, the first and second branch electrodes are provided and/or formed on a layer identical with that of the some components of the pixel circuit layer.

To avoid redundant explanation, the description of the pixel of FIGS. 17 and 18 will be focused on differences from that of the foregoing embodiments. Components which are not separately described in the following description of the present embodiment may comply with those of the foregoing embodiments. The same reference numeral will be used to designate the same component, and a similar reference numeral will be used to designate a similar component.

Although FIGS. 17 and 18 simply illustrate the structure of a pixel, e.g., in which each electrode is formed of a single electrode layer and each insulating layer is formed of a single insulating layer, the disclosure is not limited thereto.

Referring to FIGS. 1A to 1H, 2, 3A, 17, and 18, each pixel PXL (hereinafter referred to as "pixel") may include a substrate SUB, a pixel circuit layer PCL disposed on the substrate SUB, and a display element layer DPL disposed on the pixel circuit layer PCL.

The pixel circuit layer PCL may include at least one transistor T, a driving voltage line DVL, at least one shielding electrode line SDL, and a passivation layer PSV. Here, the transistor T may include a first transistor T1 which is a driving transistor, and a second transistor T2 which is a switching transistor.

In an embodiment of the disclosure, the pixel circuit layer PCL may include first and second connection lines CNL1 and CNL2 provided on a layer identical to that of the shielding electrode line SDL, at least one sub-electrode PRT, and at least one branch electrode BRC.

The shielding electrode line SDL may be provided and/or formed on the second interlayer insulating layer ILD2. The shielding electrode line SDL may block an electric field induced from the first transistor T1 and the second transistor T2 disposed thereunder, thereby preventing the electric field from affecting alignment and/or operation of the light emitting elements LD provided in the display element layer DPL. In a plan view and a cross-sectional view, the shielding electrode line SDL may be disposed under the light emitting elements LD and overlap the light emitting elements LD, but the disclosure is not limited thereto. In an embodiment, the shielding electrode line SDL may be provided and/or formed in a predetermined area on the second interlayer insulating layer ILD2 as long as the shielding electrode line SDL can reliably block an electric field induced from the first transistor T1, the second transistor T2, etc.

The first connection line CNL1 may be provided and/or formed on the second interlayer insulating layer ILD2. The second connection line CNL2 may be provided and/or formed on the second interlayer insulating layer ILD2 and electrically and/or physically connected with the driving voltage line DVL through the second contact hole CH2 that passes through the second interlayer insulating layer ILD2. The first connection line CNL1 and the second connection line CNL2 may be provided and/or formed on an identical surface and electrically and/or physically separated from each other.

The sub-electrode PRT may be provided and/or formed on the second interlayer insulating layer ILD2 and be integral with the first connection line CNL1. In case that the sub-electrode PRT and the first connection line CNL1 are integral with each other, the sub-electrode PRT may be a predetermined area of the first connection line CNL1. The sub-electrode PRT may include first to third sub-electrodes PRT1 to PRT3 which diverge in the second direction DR2 from the first connection line CNL1 into the emission area EMA of the pixel PXL. The second sub-electrode PRT2 may be electrically and/or physically connected with the second terminal DE of the first transistor T1 through the first contact hole CH1 that passes through the second interlayer insulating layer ILD2.

The branch electrode BRC may be provided and/or formed on the second interlayer insulating layer ILD2 and integral with the second connection line CNL2. In the case where the branch electrode BRC and the second connection line CNL2 are integral with each other, the branch electrode BRC may be a predetermined area of the second connection line CNL2. The branch electrode BRC may include first and second branch electrodes BRC1 and BRC2 which diverge from the second connection line CNL2 into the emission area EMA of the pixel PXL in the second direction DR2.

The shielding electrode line SDL, each of the first and second branch electrodes BRC1 and BRC2, and each of the first to third sub-electrodes PRT1 to PRT3 may be disposed at positions spaced apart from each other by a predetermined distance. In a plan view, the shielding electrode line SDL, the first and second branch electrodes BRC1 and BRC2, and the first to third sub-electrodes PRT1 to PRT3 may be alternately disposed in the first direction DR1. For example, at least one shielding electrode line SDL may be disposed between one of the first to third sub-electrodes PRT1 to PRT3 and one of the first and second branch electrodes BRC1 and BRC2. In other words, one of the first to third sub-electrodes PRT1 to PRT3 and one of the first and second branch electrodes BRC1 and BRC2 may be spaced apart from each other by a predetermined distance with the shielding electrode line SDL interposed therebetween.

The passivation layer PSV may be disposed on the shielding electrode line SDL, the first and second connection lines CNL1 and CNL2, the first to third sub-electrodes PRT1 to PRT3, and the first and second branch electrodes BRC1 and BRC2. The passivation layer PSV may cover (or overlap) and protect the shielding electrode line SDL, the first and second connection lines CNL1 and CNL2, the first to third sub-electrodes PRT1 to PRT3, and the first and second branch electrodes BRC1 and BRC2.

Although in the foregoing embodiment there has been described that the first and second connection lines CNL1 and CNL2, the first to third sub-electrodes PRT1 to PRT3, and the first and second branch electrodes BRC1 and BRC2 are provided and/or formed on a layer identical to that of the shielding electrode line SDL, the disclosure is not limited thereto. In an embodiment, the first and second connection lines CNL1 and CNL2, the first to third sub-electrodes PRT1 to PRT3, and the first and second branch electrodes BRC1 and BRC2 may be provided on a layer identical to that of any of the conductive patterns included in the pixel circuit layer PCL of the pixel PXL as long as electrical insulation with adjacent conductive patterns can be secured.

The display element layer DPL of the pixel PXL may be provided and/or formed on the passivation layer PSV. The display element layer DPL may include first to fifth insulating layers INS1 to INS5, a bank pattern PW, first electrodes EL1, second electrodes EL2, light emitting elements LD, and first and second contact electrodes CNE1 and CNE2.

The first insulating layer INS1 may be provided and/or formed over the passivation layer PSV. The first insulating layer INS1 may be formed of an inorganic insulating layer including an inorganic material or an organic insulating layer including an organic material.

Each of the first electrodes EL1 may be provided and/or formed on the bank pattern PW and the first insulating layer INS1. In an embodiment of the disclosure, the first electrodes EL1 that are disposed in an identical column may be disposed on the corresponding sub-electrode PRT and overlap the corresponding sub-electrode PRT. Particularly, the first electrodes EL1 each may have a width greater (or larger) than that of the corresponding sub-electrode PRT disposed thereunder in the first direction DR1.

Each of the first electrodes EL1 may be electrically and/or physically connected with the corresponding sub-electrode PRT through the first via hole VIA1 that successively passes through the first insulating layer INS1 and the passivation layer PSV.

Each of the second electrodes EL2 may be provided and/or formed on the bank pattern PW and the first insulating layer INS1. The second electrodes EL2 may be provided and/or formed on a layer identical to that of the first electrodes EL1. In an embodiment of the disclosure, the second electrodes EL2 that are disposed in an identical column may be disposed on the corresponding branch electrode BRC and overlap the corresponding branch electrode BRC. Particularly, the second electrodes EL2 each may have a width greater (or larger) than that of the corresponding branch electrode BRC disposed thereunder in the first direction DR1.

Each of the second electrodes EL2 may be electrically and/or physically connected with the corresponding branch electrode BRC through the second via holes VIA2 that successively passes through the first insulating layer INS1 and the passivation layer PSV.

In an embodiment of the disclosure, each of the first electrodes EL1 may have a width greater (or larger) than that of the sub-electrode PRT disposed thereunder in the first direction DR1. Each of the second electrodes EL2 may have a width greater (or larger) than that of the branch electrode BRC disposed thereunder in the first direction DR1. In case that each of the first and second electrodes EL1 and EL2 has a great (or large) width in the first direction DR1, a width W1 (refer to W1 of FIG. 4) between at least one first electrode EL1 and at least one second electrode EL2 that are disposed in an identical row in the emission area EMA of the pixel PXL may be reduced. In this case, if each of the first and second connection lines CNL1 and CNL2 is supplied with a corresponding alignment voltage, an electric field having a high intensity may be formed between at least one first electrode EL1 and at least one second electrode EL2 that are disposed in an identical row in the emission area EMA of the pixel PXL.

Therefore, the light emitting elements LD may be intensively aligned between the first and second electrodes EL1 and EL2 which are disposed in the identical row, and between which the electric field having a relatively high intensity is formed. In other words, the light emitting elements LD may be intensively aligned only in an area where an electric field having a relatively high intensity is formed, rather than being aligned in an area where an electric field having a relatively low intensity is formed. Consequently, in the emission area EMA of the pixel PXL, the light emitting elements LD may be intensively aligned only in a target area, e.g., only an area between the first and second electrodes EL1 and EL2.

While various embodiments have been described above, those skilled in the art will appreciate that various modifications, additions and substitutions are possible, without departing from the scope of the disclosure.

Therefore, the embodiments disclosed in this specification are only for illustrative purposes rather than limiting the technical scope of the disclosure. The scope of the claimed invention must be defined by the accompanying claims.

What is claimed is:

1. A display device comprising:
   a substrate including a display area and a non-display area; and
   at least one pixel disposed in the display area, and comprising an emission area that emits light, wherein the at least one pixel comprises:
   at least one sub-electrode extending in a direction on the substrate;
   at least one branch electrode extending in the direction and spaced apart from the at least one sub-electrode;
   a first insulating layer disposed on the at least one sub-electrode and the at least one branch electrode;
   first electrodes disposed on the first insulating layer and electrically connected with the at least one sub-electrode;
   second electrodes disposed on the first insulating layer and electrically connected with the at least one branch electrode; and
   at least one light emitting element aligned between at least one of the first electrodes and at least one of the second electrodes,
   the at least one sub-electrode includes:
   a first area overlapping the first electrodes; and
   a second area spaced apart from the first area without overlapping the first electrodes,
   the at least one branch electrode includes:
   a third area overlapping the second electrodes; and
   a fourth area spaced apart from the third area without overlapping the second electrodes, and
   the first insulating layer on the first area and the third area has a thickness different from a thickness of the first insulating layer on the second area and the fourth area.

2. The display device according to claim 1, wherein the first insulating layer includes:
   first via holes each exposing an area of the at least one sub-electrode, and
   second via holes each exposing an area of the at least one branch electrode.

3. The display device according to claim 2, wherein at least one of the first via holes corresponds to each of the first electrodes, and at least one of the second via holes corresponds to each of the second electrodes.

4. The display device according to claim 3, wherein
   each of the first electrodes electrically contact the at least one sub-electrode through the at least one first via hole, and
   each of the second electrodes electrically contact the at least one branch electrode through the at least one second via hole.

5. The display device according to claim 1, wherein a thickness of the first insulating layer on the second area and the fourth area is greater than a thickness of the first insulating layer on the first area and the third area.

6. The display device according to claim 3, wherein each of the first electrodes and each of the second electrodes are spaced apart from each other on the first insulating layer.

7. The display device according to claim 6, wherein each of the first electrodes and each of the second electrodes are alternately disposed in the direction in the emission area in a plan view.

8. The display device according to claim 3, wherein the at least one pixel comprises:
   a first connection line integral with the at least one sub-electrode and extending in a direction intersecting with the direction; and
   a second connection line integral with the at least one branch electrode and disposed in the direction in which the first connection line extends.

9. The display device according to claim 1, wherein the at least one pixel comprises:
   a bank pattern disposed under each of the first and second electrodes;
   a first contact electrode that electrically connects at least one of the first electrodes with a first end of the at least one light emitting element; and
   a second contact electrode that electrically connects at least one of the second electrodes with a second end of the at least one light emitting element.

10. A display device comprising:
    a substrate including a display area and a non-display area; and
    at least one pixel disposed in the display area, and comprising an emission area that emits light, wherein the at least one pixel comprises:
    at least one sub-electrode extending in a direction on the substrate;
    at least one branch electrode extending in the direction and spaced apart from the at least one sub-electrode;
    a first insulating layer disposed on the at least one sub-electrode and the at least one branch electrode;
    first electrodes disposed on the first insulating layer and electrically connected with the at least one sub-electrode;
    second electrodes disposed on the first insulating layer and electrically connected with the at least one branch electrode; and
    at least one light emitting element aligned between at least one of the first electrodes and at least one of the second electrodes,
    the at least one pixel comprises:
    a bank pattern disposed under each of the first and second electrodes;
    a first contact electrode that electrically connects at least one of the first electrodes with a first end of the at least one light emitting element; and
    a second contact electrode that electrically connects at least one of the second electrodes with a second end of the at least one light emitting element, and the at least one pixel comprises:
- at least one transistor electrically connected with the at least one light emitting element;
- at least one shielding electrode line disposed on the transistor;
- a driving voltage line electrically connected to the second electrodes and supplying a driving power voltage; and
- a passivation layer overlapping the at least one transistor, the at least one shielding electrode line, and the driving voltage line.

11. The display device according to claim 10, wherein the at least one sub-electrode and the at least one branch electrode are disposed between the at least one transistor and the passivation layer.

12. The display device according to claim 11, wherein the at least one sub-electrode and the at least one branch electrode, and the at least one shielding electrode line are disposed on a same layer.

13. The display device according to claim 10,
wherein the at least one pixel comprises:
- a second insulating layer disposed between the at least one light emitting element and the first insulating layer; and
- a third insulating layer disposed on an upper surface of the at least one light emitting element, and the first contact electrode and the second contact electrode are spaced apart from each other on the third insulating layer and are electrically disconnected from each other.

* * * * *